(12) United States Patent
Hoshino et al.

(10) Patent No.: US 6,605,842 B2
(45) Date of Patent: Aug. 12, 2003

(54) SEMICONDUCTOR DEVICE AND A METHOD OF MANUFACTURING THE SAME

(75) Inventors: Yutaka Hoshino, Akishima (JP); Shuji Ikeda, Koganei (JP); Isao Yoshida, Hinode (JP); Shiro Kamohara, Hachiouji (JP); Megumi Kawakami, Kokubunji (JP); Tomoyuki Miyake, Higashimurayama (JP); Masatoshi Morikawa, Hannou (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/187,288

(22) Filed: Jul. 2, 2002

(65) Prior Publication Data

US 2002/0167088 A1 Nov. 14, 2002

Related U.S. Application Data

(62) Division of application No. 09/666,772, filed on Sep. 20, 2000, now Pat. No. 6,528,848.

(30) Foreign Application Priority Data

Sep. 21, 1999 (JP) ............................................. 11-266668

(51) Int. Cl.[7] ............................................. H01L 31/119
(52) U.S. Cl. ........................ 257/339; 257/376; 257/751
(58) Field of Search ................................. 257/758, 751, 257/339, 376

(56) References Cited

U.S. PATENT DOCUMENTS

| 5,463,241 A | 10/1995 | Kubo ........................... 257/376 |
| 5,666,007 A | 9/1997 | Chung .......................... 257/751 |
| 6,191,455 B1 | 2/2001 | Shida ........................... 257/362 |
| 6,191,460 B1 | 2/2001 | Choi et al. .................... 257/393 |
| 6,218,904 B1 | 4/2001 | Panther ........................ 330/296 |

OTHER PUBLICATIONS

Hitachi Hyoron vol. 78, No. 11 (Nov. 1996), pp. 21–26.
ISSCC 98, Digest of Technical Papers, Feb. 5, 1998, pp. 50–55.
IEDM 97 Technical Digest, 1997, pp. 51–54.
Nikkei Electronics 1998, 11, 2, No. 729, pp. 238–245.

Primary Examiner—Jasmine J B Clark
(74) Attorney, Agent, or Firm—Mattingly, Stanger & Malur, P.C.

(57) ABSTRACT

In a high frequency amplifying MOSFET having a drain offset region, the size is reduced and the on-resistance is decreased by providing conductor plugs 13 (P1) for leading out electrodes on a source region 10, a drain region 9 and leach-through layers 3 (4), to which a first layer wirings 11a, 11d (M1) are connected and, further, backing second layer wirings 12a to 12d are connected on the conductor plugs 13 (P1) to the first layer wirings 11s, 11d (M1).

9 Claims, 62 Drawing Sheets

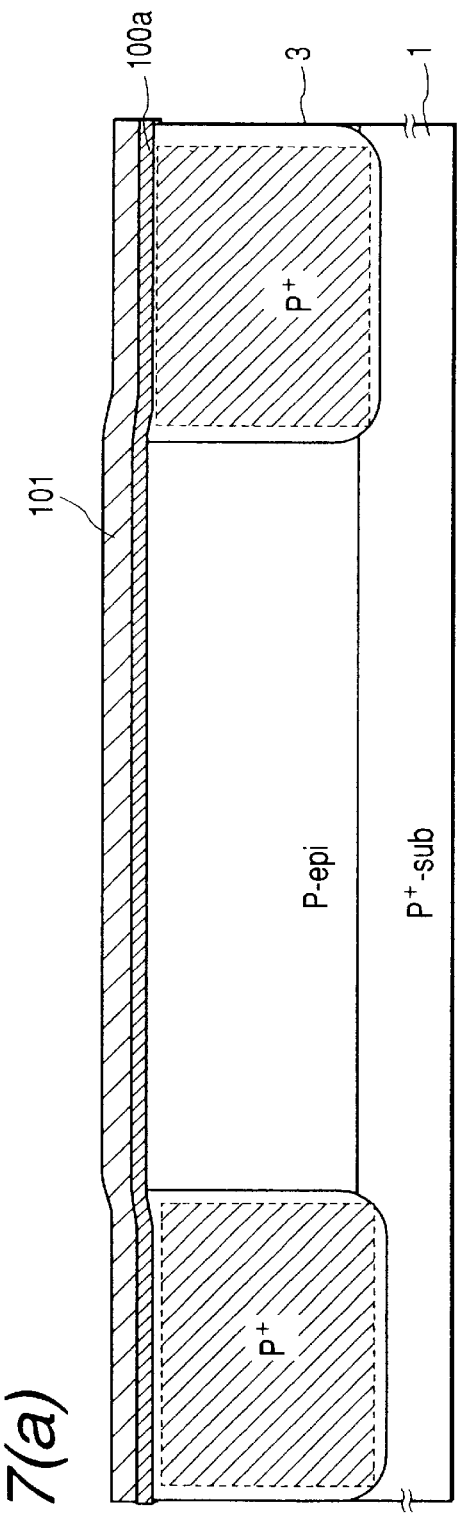
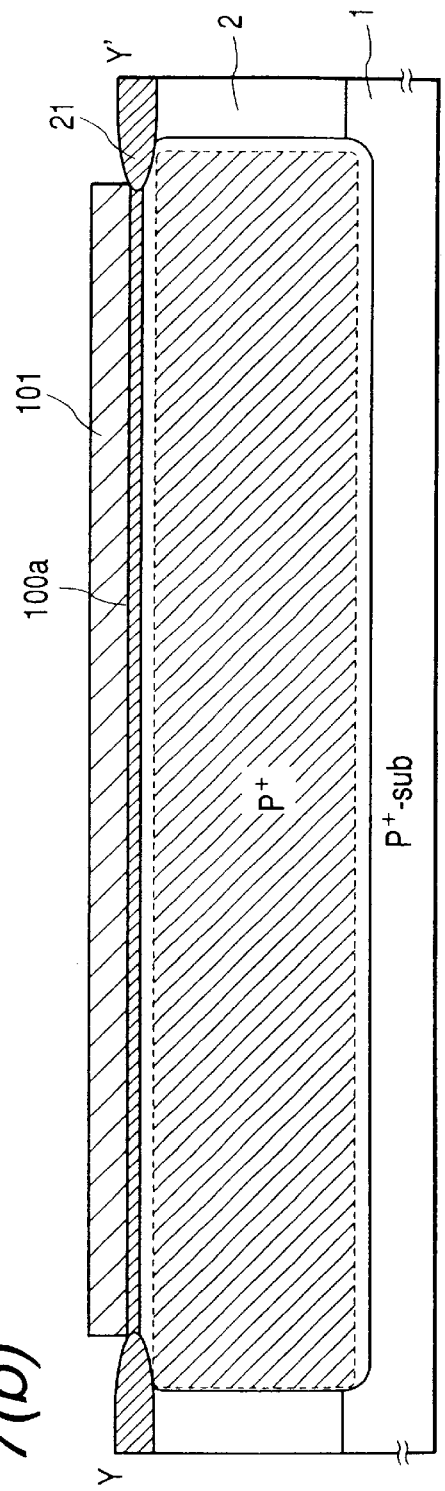
FIG. 7(a)
FIG. 7(b)

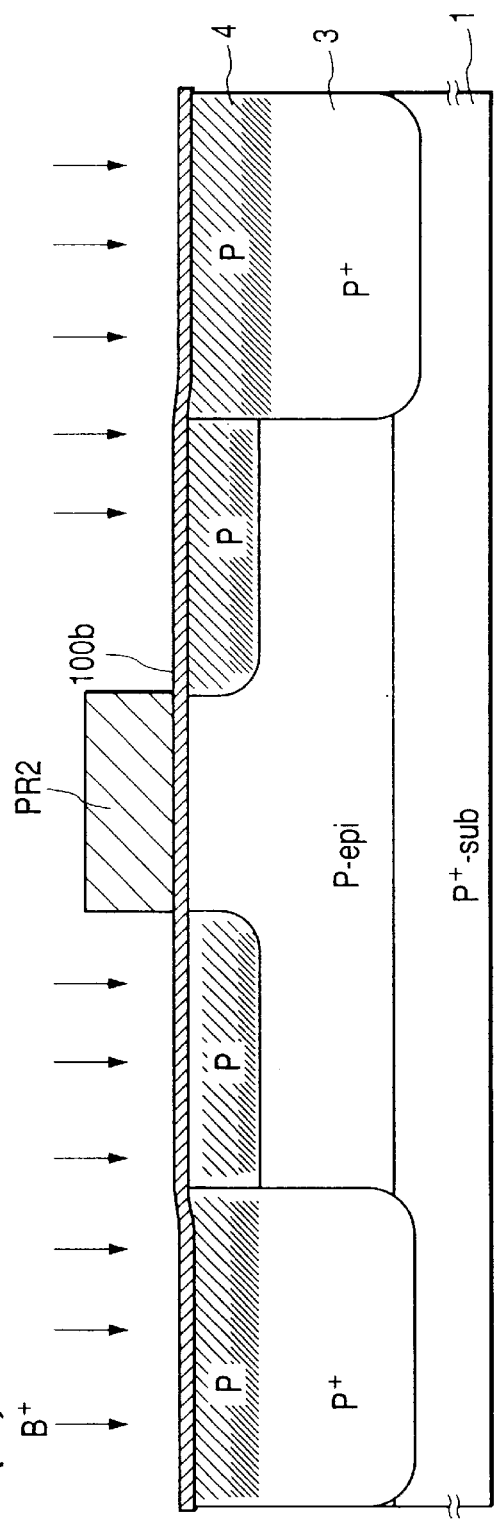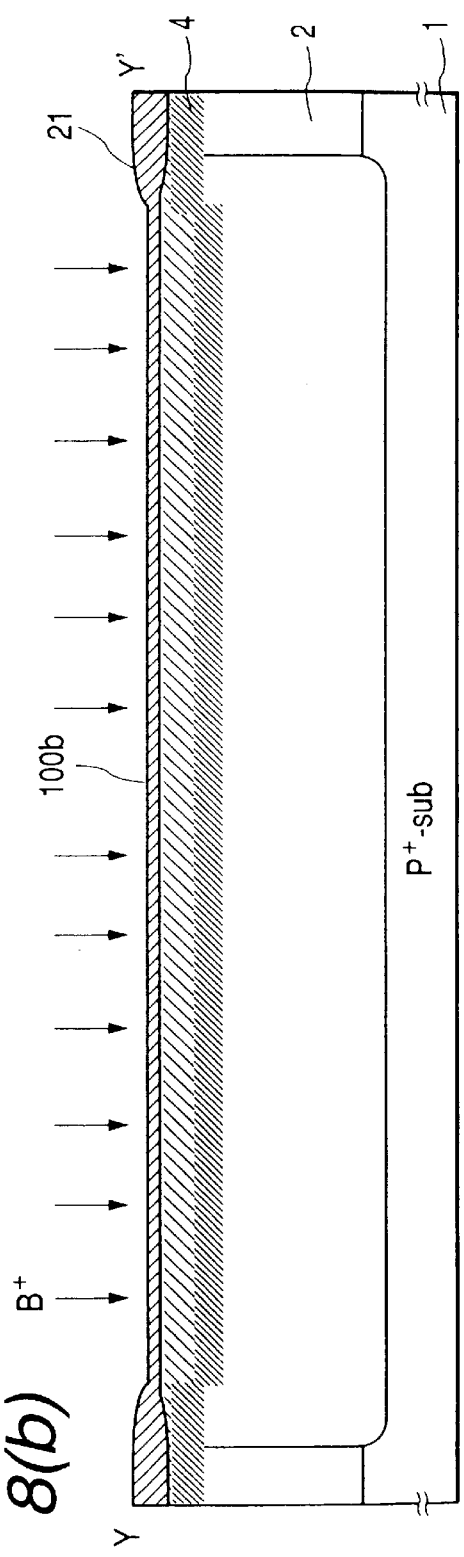
FIG. 8(a)
FIG. 8(b)

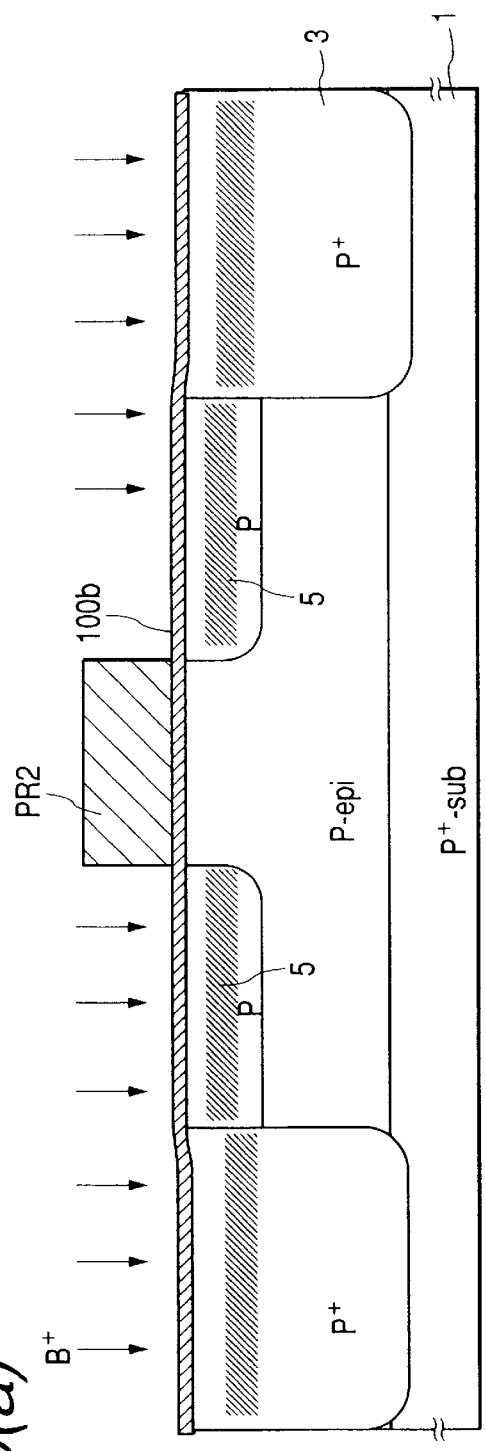
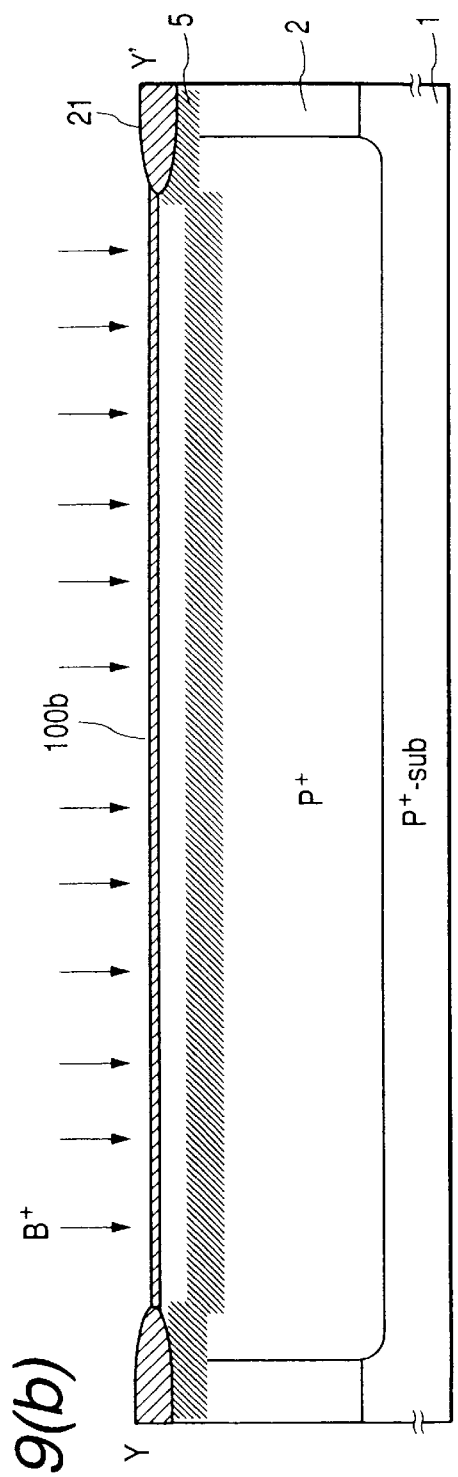
FIG. 9(a)
FIG. 9(b)

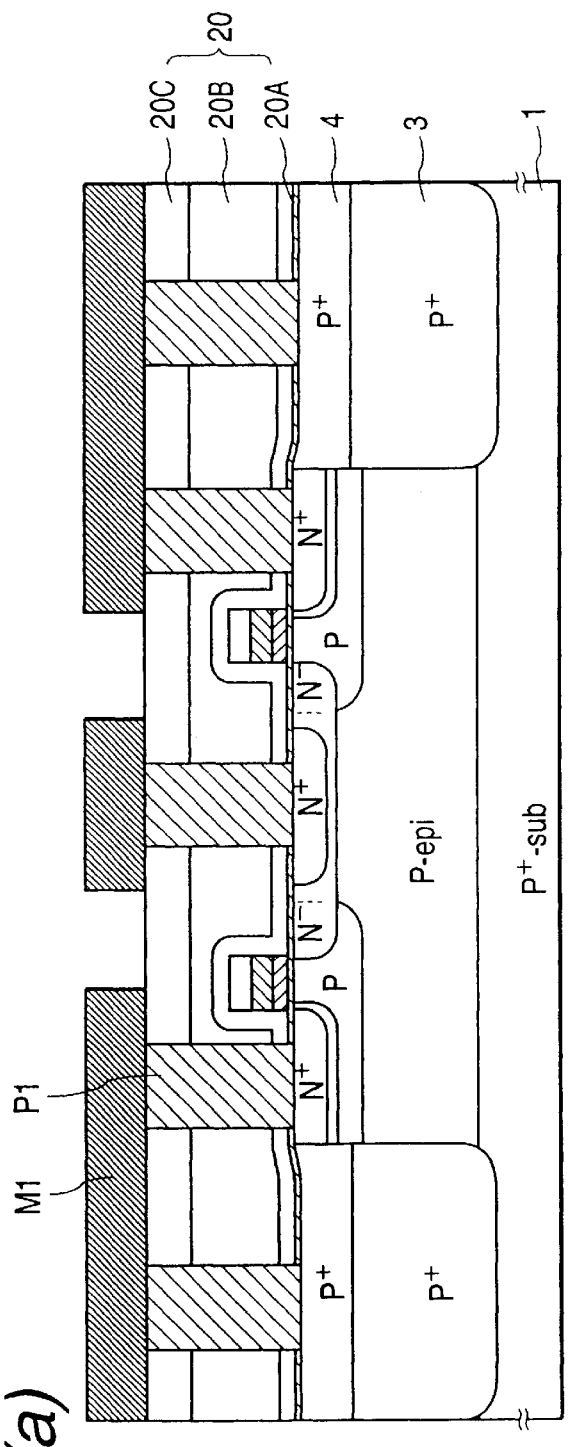
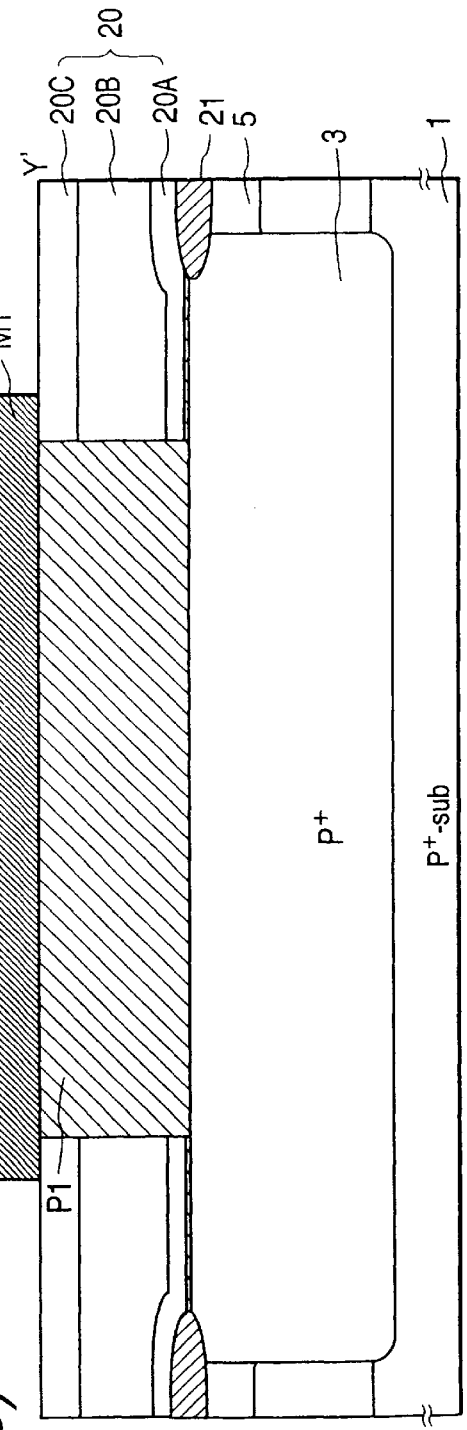
FIG. 23(a)
FIG. 23(b)

ON-RESISTANCE

DRAIN BREAKDOWN VOLTAGE

INPUT-STAGE DEVICE

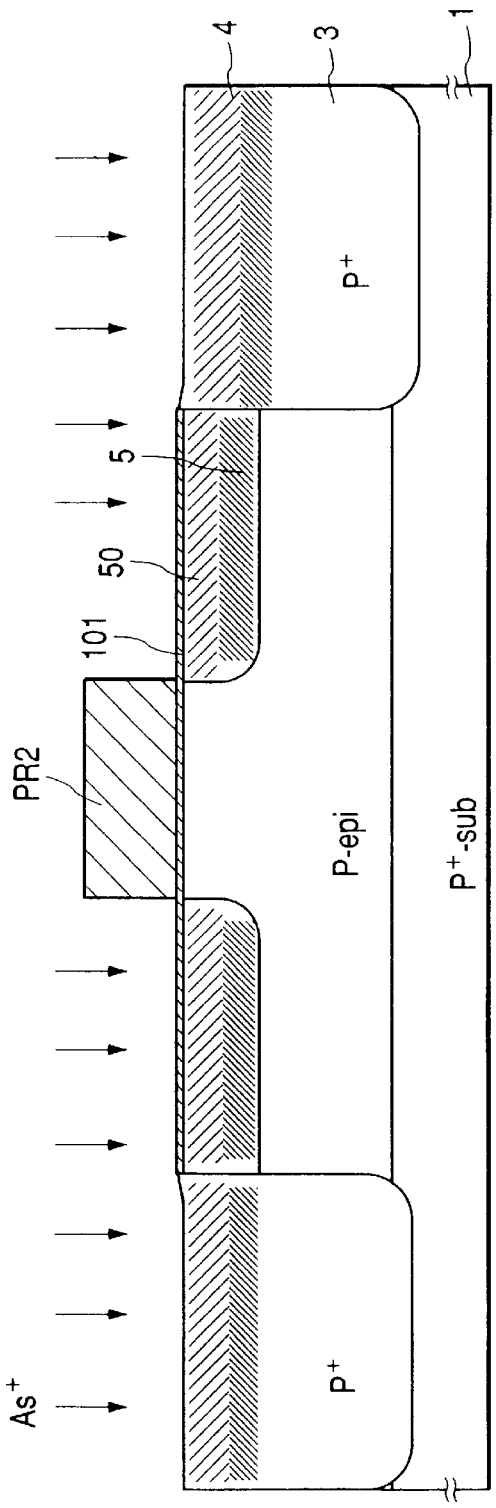
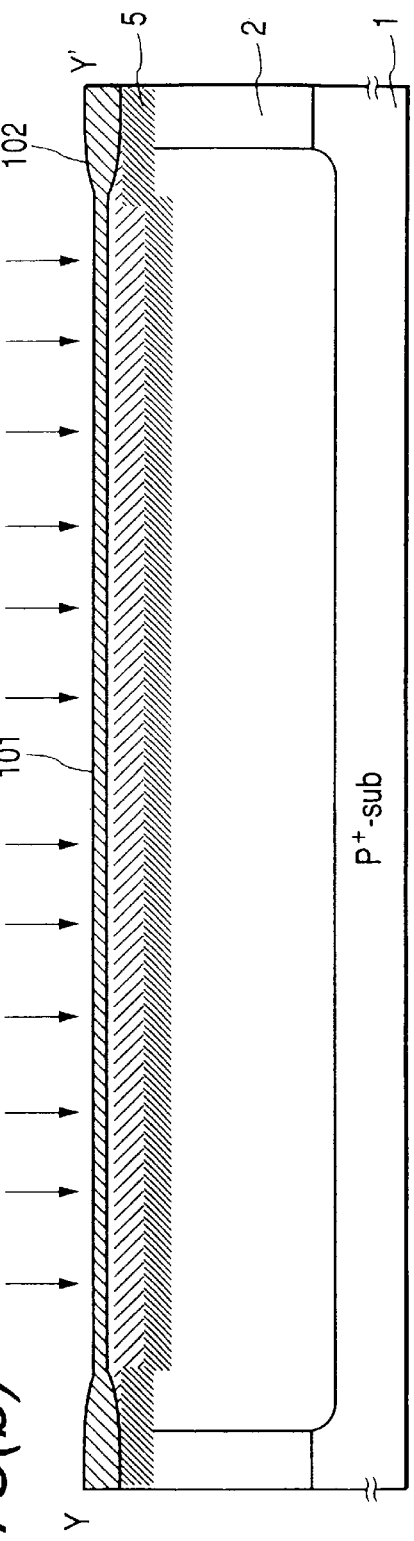
FIG. 78(a)
FIG. 78(b)

SEMICONDUCTOR DEVICE AND A METHOD OF MANUFACTURING THE SAME

This is a divisional application of U.S. Ser. No. 09/666,772, filed Sep. 20, 2000. Now U.S. Pat. No. 6,528,848 B1.

BACKGROUND OF THE INVENTION

1. Field of the Invention

This invention concerns a semiconductor device used for mobile communication apparatus such as cellulars operation in a microwave band of 500 MHz to 2.5 GHz and, more in particular, it relates to a technique which is effective to high frequency powers amplifier of power-amplifying high frequency signals and outputting them.

2. Description of Related Art

In recent years, mobile communication apparatus typically represented by communication systems such as GSM (Global System for Mobile Communication), PCS (Personal Communication system), PDC (Personal Digital Cellular) system and CDMA (Code Division Multiple Access) system (so-called hand set telephone) have been popularized world wide.

Generally, a mobile communication apparatus comprises an antenna for emitting and receiving electromagnetic waves, a high frequency power amplifier for amplifying high frequency signals under power modulation and supplying them to the antenna, a receiving section for processing high frequency signals received on the antenna, a control section for controlling them and a battery for supplying a power source voltage to them.

Such mobile communication apparatus and semiconductor devices used for the mobile communication apparatus have been disclosed, for example, in the known literatures described below.

(1) The constitution of the mobile communication apparatus is disclosed, for example, in "HITACHI HYORON" vol. 78, No. 11 (1996-11), pages 21 to 26 (Literature 1).

(2) Constitution of a typical high frequency power amplifier on the GSM system is described, for example, in ISSCC 98, DIGEST OF TECHNICAL PAPERS (Feb. 5, 1998), pages 50 to 55 (Literature 2).

According to the literatures, a threshold voltage of FET is controlled to an appropriate level for stable circuit design and decrease of leak current in an off state. In the constitution of the amplifier, two chips are arranged in parallel for final stage devices in a 3-stage amplifier circuit and synthesizing and an impedance-matching circuit is disposed to each of them for the synthesis of outputs of attain higher output than in the case of using one chip. The constitution of this amplifier is referred to as DD-DIMA technique (Divided Device and Collectively Impedance Matched Amplifier) in the literature.

(3) Amplifying devices applied to the high frequency power amplifiers are described, for example, in IEDM 97 Technical Digest (1997), pages 51 to 54 (Literature 3).

This literature discloses that an amplifier device is constituted with a power insulated gate type field effect transistor (hereinafter simply referred to as power MOSFET) using Si (silicon) semiconductors to attain high performance.

Specifically, the performance is improved by defining the gate length of a MOSFET to 0.4 $\mu$m. Further, the drain breakdown voltage is set to 20 V or higher by disposing an offset layer of an about 0.7 $\mu$m length on the side of the drain of the power MOSFET. Further, it is important to lower the gate resistance for high frequency operation and the gate resistance is decreased by a structure of short circuiting a metal silicide/silicon laminated gate electrode with an aluminum wiring (Al-shorted silicon gate structure).

(4) There has been a trend of adopting compound semiconductor (GaAs) wafers for making the device efficiency higher. Such a technical trend is described, for example, in NIKKEI ELECTRONICS 1998, 11, 2 (No. 729), pages 238 to 245 (Literature 4). However, as described also in this literature, the unit wafer cost in the GaAs technique is more expensive compared with Si.

For generalized use of the mobile communication apparatus, it has been demanded for further reduction of the size and weight, and decrease in the power consumption of the apparatus. For this purpose, it is necessary to attain further reduction in the size and weight and decrease in the power consumption for each of components constituting the mobile communication apparatus.

One of the components is a high frequency power amplifier for supplying high frequency signals to the antenna. Generally, the high frequency power amplifier most consumes electric power and it is effective of saving the consumption power of the mobile apparatus to decrease the consumption power of the high frequency power amplifier (improvement of efficiency).

In the GSM system amplifier using silicon (Si) semiconductors, it was attained an output voltage of about 3.5 W and a overall efficiency ($\eta$ all) of about 50% at a working frequency of 900 MHz and a power source voltage of 3.5 V. The overall efficiency is an efficiency in a high frequency power amplifier constituted with a three stage power amplifier of power MOSFET (high frequency module).

The performance of the power MOSFET using Si as the output stage amplifier device is about 55% power of a power-added efficiency ($\eta$ add) at 2 W output based on the DD-CIMA technique, and it was necessary to attain a power added efficiency of 65% or more in power MOSFET in order to improve the overall efficiency of the amplifier to 55% or more.

The power added efficiency ($\eta$ add) in the microwave power MOSFET is defined, for example, in "Optical Microwave Semiconductor Applied Technology" Feb. 29, 1996, first edition, first print (Published from Science Forum Co.), pages 59 to 66 (Literature 5).

Also in the PCS system amplifier, an output voltage of 2 W and an overall efficiency of 45% at a working frequency of 1900 MHz have been attained. The performance of the power MOSFET as the output stage amplifier device is about 50% at 1 W output. For improving the overall efficiency of the amplifier to 50% or more, it was necessary to attain the power-added efficiency of 55% or higher in the power MOSFET.

For improving the power-added efficiency of the amplifier device (power MOSFET), it is considered to decrease the on-resistance, gate resistance and parasitic capacitance and improvement of the mutual conductance.

SUMMARY OF THE INVENTION

It is an object of this invention to provide a technique capable of attaining a high power-added efficiency for a semiconductor device applied to a high frequency amplifier.

A specific object of this invention is to provide a technique capable of decreasing the on-resistance of a semiconductor device.

Another specific object of this invention is to provide a technique for improving the cut-off frequency.

A further object of this invention is to provide a semiconductor device capable of improving the power-added efficiency in high frequency and high power operation, as well as ensuring reliability and mass productivity together.

A still further object of this invention to provide a technique capable of reducing the size and the weight of a high frequency power amplifier.

Typical features of the invention disclosed in this patent application are to be explained briefly as below.

One of typical constitution of semiconductor devices according to this invention resides in a semiconductor device comprising:

a semiconductor substrate of a first conduction type, a semiconductor layer of a first conduction type formed on the surface of the semiconductor substrate, a first region and a second region of a second conduction type opposite to the first conduction type situated to a portion of a main surface of the semiconductor layer, being spaced apart from each other on both sides of a region to be formed with a channel, the second region comprising a low impurity concentration region in contact with the region to be formed with the channel and a high impurity concentration region in contact with the low impurity concentration region, a gate electrode formed by way of a gate insulation film above the channel region, a leach-through layer of a first conduction type formed to other portion of the main surface of the semiconductor layer so as to be in contact with the first region and the semiconductor substrate, a first insulation film covering the gate electrode, the first region, the second region and the leach-through layer, a first conductor plug, a second conductor plug and a third conductor plug connected, respectively, with the first region, the high impurity concentration region of the second region and the leach-through layer by way of openings disposed in the first insulation film, a first conductor layer connected with the first conductor plug and the third conductor plug and a second conductor layer connected with the second conductor plug, and a third conductor layer connected with a lower surface of the semiconductor substrate.

According to the technical means described above, since conductor plugs are used for leading out electrodes for the first region (source), the high impurity concentration region of the second region (drain) and the leach-through layer (source punch-through layer), the first and the second conductor layers (first layer wiring M1) constitute an electrode pattern having a flat surface. Therefore, this can increase the degree of freedom for the arrangement of a backing wiring layer (second layer wiring M2) and M1˙M2 contact for realizing the wiring of lowered resistance to the first and second conductor layers.

Accordingly, the wiring resistance to the first region, the high impurity concentration region of the second region and the leach-through layer can be decreased. As a result, since the on-resistance can be decreased, this can contribute to the improvement for the power-added efficiency in the semiconductor device.

Another typical constitution for the semiconductor device of this invention is an insulated gate field effect semiconductor device having a P type semiconductor region and a drain offset region in contact with the P type semiconductor region, in which a gate electrode in contact with a gate insulation film is constituted with a P type semiconductor, and an N type layer is disposed on the surface of the P type semiconductor region.

By the constitution described above, since the gate electrode is constituted with a P type semiconductor, namely, constituted as a P type gate, a threshold voltage Vth is increased by 1 V in view of the difference of the work function. Therefore, a state of normally off, that is, an enhanced state can be maintained in a state of not giving a gate voltage irrespective of the disposition of the N type layer on the surface of the P type semiconductor region. Presence of the N type layer provides an effect of extending the extension of a depletion layer for the drain junction to improve the drain breakdown voltage. Then, when a P type gate device (P type gate MOSFET) having an identical aimed value for the drain breakdown voltage like that in the N type gate (P type gate power MOSFET) is designed, the impurity concentration in the drain offset region can be increased. This is because there is no more necessary to extend the depletion layer on the side of the drain offset region. Possibility of increasing the impurity concentration in the offset region means that the resistance in the drain offset region can be lowered compared with the N type gate device.

Further, presence of the N type layer can moderate the electric field on the surface of the channel region. Accordingly, the carrier mobility of the channel region can be improved. Improvement of the carrier mobility can be considered as a result of decreasing the resistive component in the relevant portion.

Further, improvement of the carrier mobility based on the constitution described above enables to shorten the gate length Lg and supply more electric current. Usually, as the gate length is shorter, carrier velocity is saturated remarkably making it difficult to supply a great amount of current.

As the result, when the on-resistance is compared between the P type gate device and the N type gate device under an identical breakdown voltage, it is possible to effectively decrease the resistance in the P type gate device than in the N type gate device. That is, P type gate power MOSFET can improve the power-added efficiency.

BRIEF DESCRIPTION OF THE DRAWINGS

Other objects and advantages of the invention will become apparent during the following discussion of the accompanying drawings, wherein:

FIG. 7 is a cross sectional view for a main portion during manufacturing steps for the semiconductor device succeeding to FIG. 6;

FIG. 8 is a cross sectional view for a main portion during manufacturing steps for the semiconductor device succeeding to FIG. 7;

FIG. 9 is a cross sectional view for a main portion during manufacturing steps for the semiconductor device succeeding to FIG. 8;

FIG. 23 is a cross sectional view for a main portion during manufacturing steps for the semiconductor device succeeding to FIG. 22;

FIG. 69 FIG. 67 is a cross sectional view for a main portion of a semiconductor device as Embodiment 10 according to this invention;

FIG. 78 is a cross sectional view for a main portion during manufacturing steps of the semiconductor device as Embodiment 15 according to this invention;

DETAILED DESCRIPTION OF PREFERRED EMBODIMENTS

Figure 1:
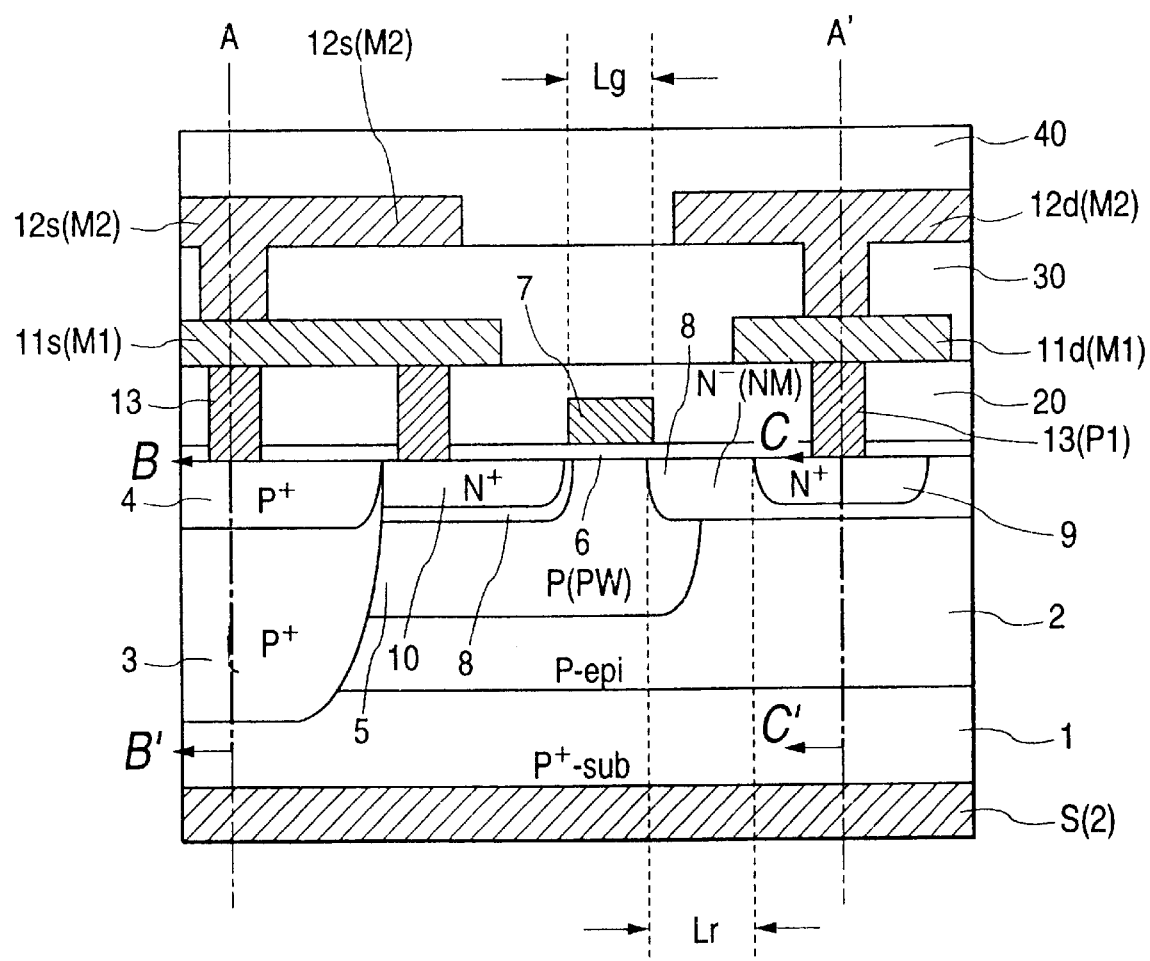
FIG. 1 is a cross sectional view of a semiconductor device (N gate˙N channel type Si power MOSFET) as Embodiment 1 according to this invention.

This invention is to be explained in details by way of preferred embodiments with reference to the drawings. In the drawings for explaining the preferred embodiments, those having identical functions carry the same reference numerals for which duplicate explanations are to be omitted.

Preferred embodiments of the present invention will be described in detail based on the followings, wherein

Embodiment 1

Embodiment 1 of this invention is to be explained with reference to FIG. 1 through FIG. 5.

Figure 2:
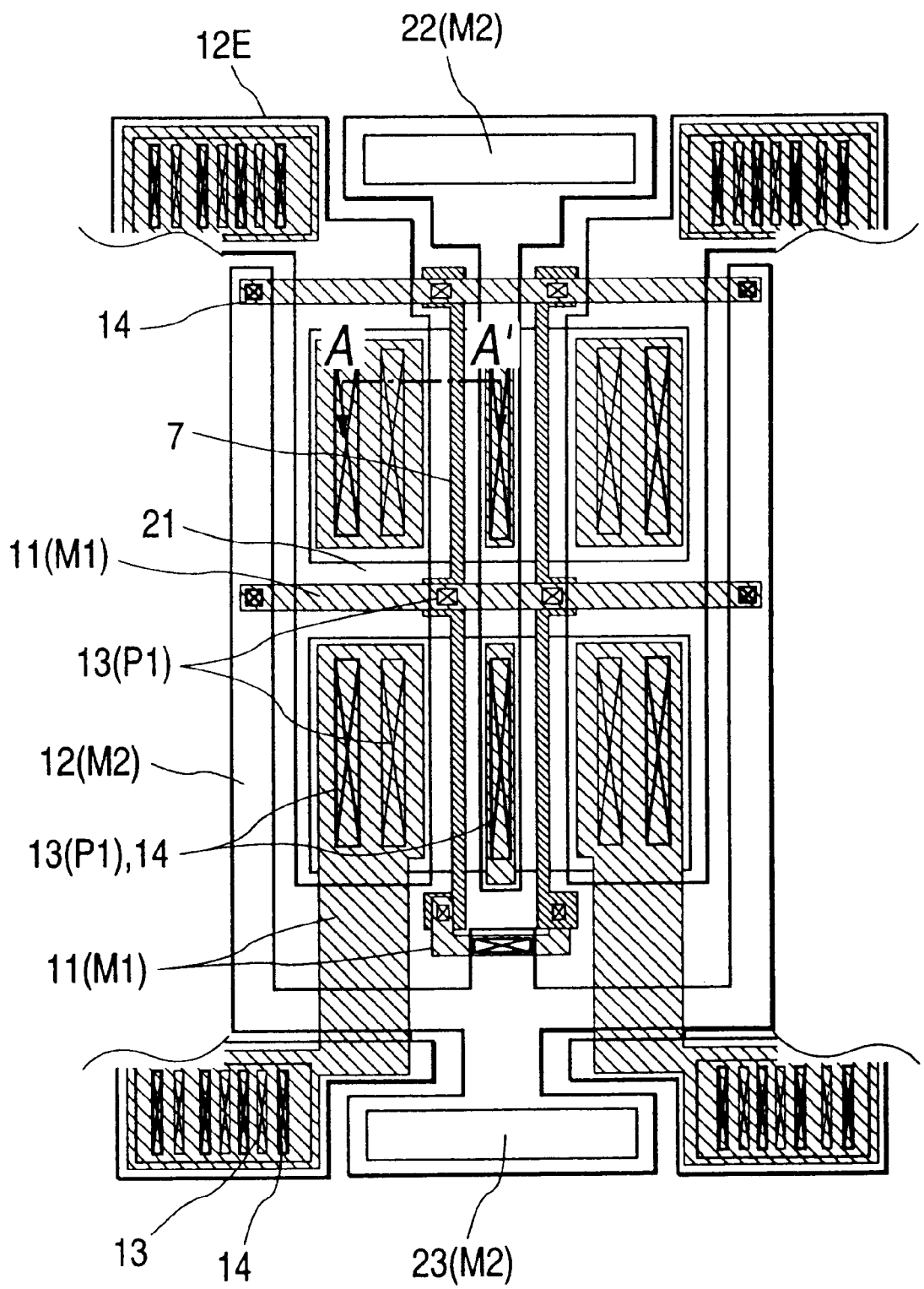
FIG. 2 is a plan view of a semiconductor device as Embodiment 1 according to this invention.
Figure 3:
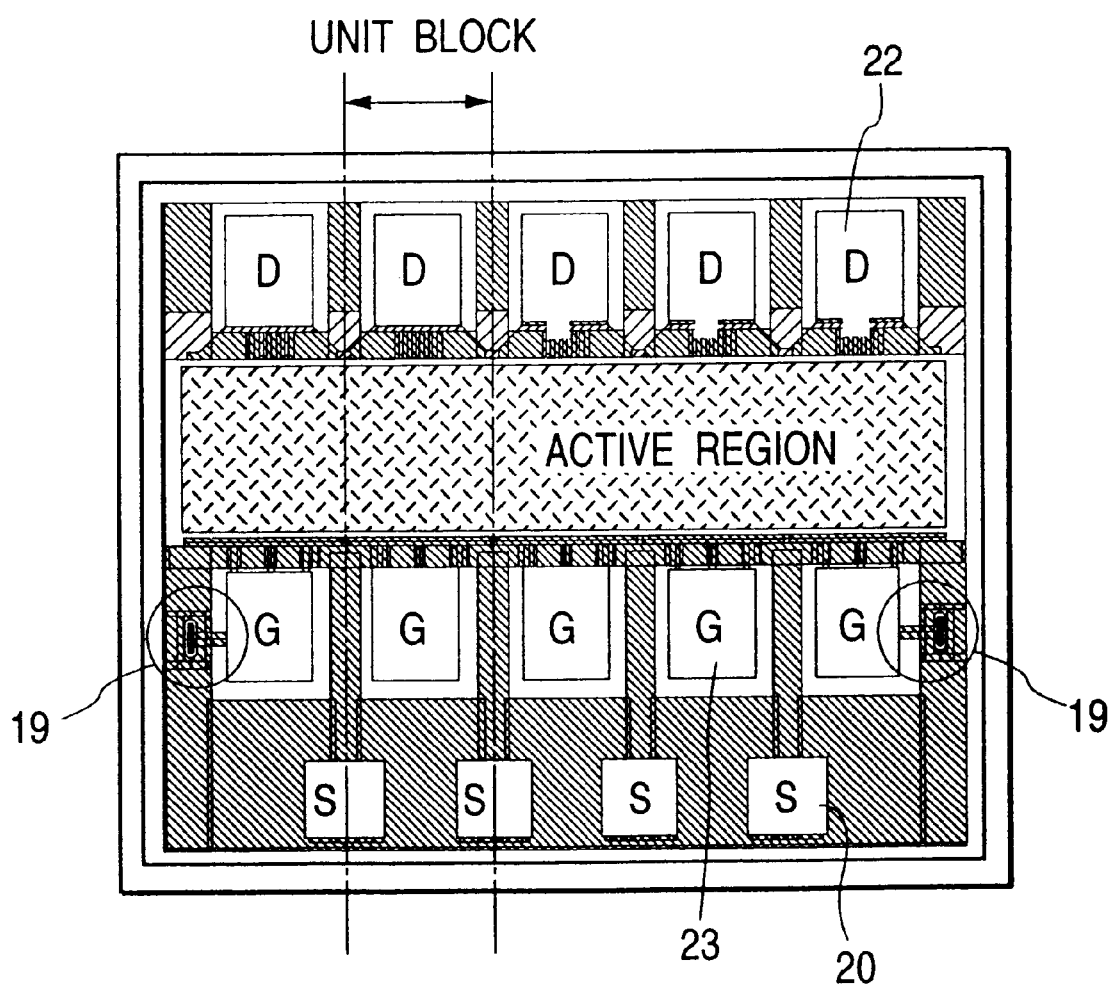
FIG. 3 is a plan view illustrating a layout of a semiconductor device (semiconductor chip) as Embodiment 1 according to this invention.
Figure 4:
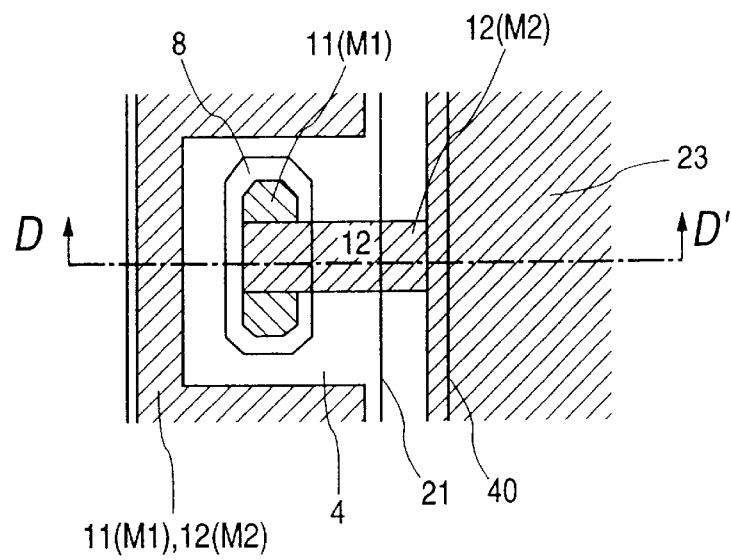
FIG. 4 is an enlarged fragmentary plan view for a portion of a protection device 19 in the semiconductor device (semiconductor chip) shown in FIG. 3.
Figure 5:
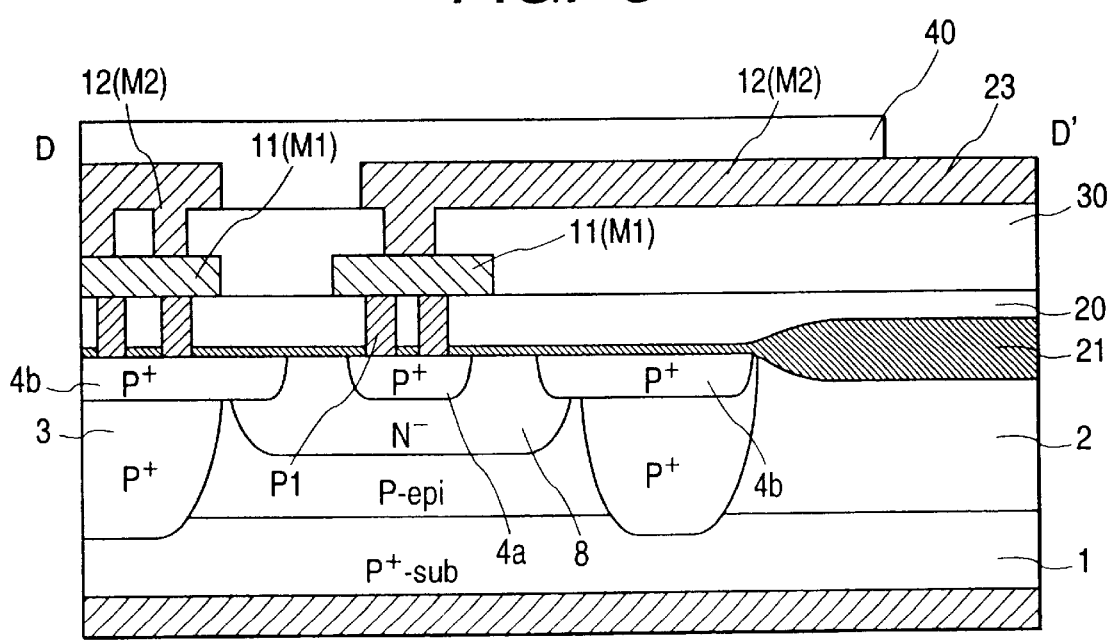
FIG. 5 is a cross sectional view taken along line D–D' for the protection device shown in FIG. 4.

FIG. 1 is a cross sectional view of a semiconductor device (N gate˙N channel type Si power MOSFET) as Embodiment 1 according to this invention; FIG. 2 is a plan view of a semiconductor device as Embodiment 1 according to this invention; FIG. 3 is a plan view illustrating a layout of a semiconductor device (semiconductor chip) as Embodiment 1 according to this invention; FIG. 4 is an enlarged fragmentary plan view for a portion of a protection device 19 in the semiconductor device (semiconductor chip) shown in FIG. 3; and FIG. 5 is a cross sectional view taken along line D–D' for the protection device shown in FIG. 4.

Cross Sectional Structure of a Basic Cell

A semiconductor device (basic cell of MOSFET) as Embodiment 1 according to this invention shown in FIG. 1 has the following constitution.

A P type high resistance Si epitaxy layer (first conduction type semiconductor layer) 2 is formed on the upper surface of a P type low resistance Si substrate (first conduction type semiconductor layer) 1. The specific resistivity of the substrate is restricted to 0.02 Ωcm or less with an aim of reducing the on-resistance. It has been also disclosed in the existent technique that the specific resistivity of the silicon substrate applied to power MOSFET is reduced to 0.02 Ωcm as in Japanese Published Unexamined Patent Application Hei 6-97447. The specific resistivity of the silicon substrate applied to Embodiment 1 is 0.01 Ωcm.

Recently, an epitaxial wafer is applied also in CMOSIC in which the specific resistivity of the substrate is about 10 Ωcm which is smaller by about three digits compared with the specific resistivity of the substrate in IC. The epitaxy layer has a specific resistivity of 20 Ωcm and a thickness of 3 $\mu$m. In the epitaxy layer in the patent literature described above, the thickness is 5 $\mu$m and the thickness is further decreased by 2 $\mu$m with an aim of reducing the on-resistance.

A P type well region 5 (PW) is formed selectively as a region formed with a channel to a portion of the main surface of the epitaxy layer 2. The P type well region is intended as a punch-through stopper for suppressing the extension of a depletion layer extending from a drain to a source. Then, a gate electrode 7 is formed by way of a gate insulation film (gate oxide film) 6 on the surface of the P type well region 5 (PW).

An N type source region (first region) 10 having a high impurity concentration and an N type drain offset region (third region) 8 (NM) having a low impurity concentration are formed in the epitaxy layer 2 at a position spaced apart from each other while being in contact with the P type well region 5 (punch-through stopper layer PW). The N type source region 10 and the N type drain offset region 8 (NM) are self aligned to the gate electrode 7 and a portion thereof overlaps with the gate electrode 7.

The N (high resistance) region 8 situated below the N type source region 10 is not particularly necessary. This N type (high resistance) region 8 is formed by self alignment to the gate electrode 7 when impurities are introduced for forming the N type drain offset region 8 (NM).

An N type drain region (second region) 9 having a high impurity concentration for leading out an electrode is formed in contact with the drain offset region 8.

A P type source punch-through layer (leach-through layer) 3 having a high impurity concentration (low resistance) is disposed in the epitaxy layer 2 in contact with the N type source region 10 and extends from the main surface to the substrate 1. A P type low resistance region 4 for contact is formed on the surface of the leach-through layer 3. The N type source region 10 is electrically connected by way of a metal plug, a first layer wiring, a metal plug and the leach-through layer 3 to a source rearface electrode S1.

In FIG. 1, a portion between A–A' constitutes a basic cell and the pitch is about 6 $\mu$m. The gate length Lg of the gate electrode 7 is 0.3 $\mu$m and the length of the drain offset region 8 disposed for the purpose of ensuring drain breakdown voltage by electric field moderation, that is, the drain offset length (Lr) is 0.7 $\mu$m. The gate oxide thickness is 11 nm, which is determined in view of the improvement intensity of the on-resistance and the allowable electric field for the oxide film. This is to be explained specifically later.

A first insulation film (interlayer insulation film) 20 is formed so as to cover the gate electrode 7, the N type source region 10, the N type drain offset region 8 (NM), the N type drain (low resistance) region 9 and the P type source punch-through layer 3. A plurality of openings are formed in the first insulation film 20 and each of the openings has therein a conductor plug P1 for leading out the electrode to be in contact with the N type source region 10, the N type drain region 9 and the P type source punch-through layer 3, respectively. The conductor plug P1 is made of tungsten and buried in the opening. The surface of the plug is substantially in flush with the surface of the first insulation film 20.

On the surface of the first insulation film 20 are formed by patterning a first conductor layer 11s for electrically connecting the conductor plug connected with the N type source region 10 and the conductor plug in contact with the p-source punch-through layer 3, and a second conductor layer 11d connected with the conductor plug P1 in contact with the N type drain region 9, respectively, as a first layer wiring (M1).

A second insulation film (interlayer insulation film) 30 is formed so as to cover the first and the second conductor layers 11s and 11d. Then, openings are formed in the second insulation film being situated on the conductor plug in contact with the P type source punch-through region 3 and the conductor plug P1 in contact with the N type drain region 9, respectively. Wirings 12s, 12d (second layer wirings M2) as the backing wirings for reducing the resistance of the wirings are connected by way of the openings to the first and the second conductor layers 11s and 11d, respectively.

The source rearface electrode S(2) is connected to a first reference potential, for example, a ground potential, whereas the drain electrode 12d is connected to a second reference potential higher than the first reference potential, for example, a power source (Vdd=3.6 V) potential.

Layout for Unit Block

Relation between the first layer wirings and the second layer wirings in this Embodiment 1 is to be explained in details with reference to FIG. 2.

In FIG. 2, 11 represents a conductor layer for the first layer (first layer wiring M1) and 12 represents a conductor layer for the second layer (second layer wiring M1). 13 represents contact portions of conductor plugs (metal plugs) relative to the semiconductor regions such as the N type source region 10, the N type drain region 9 and the P type source punch-through layer 3 as described above, and 14 represents contact portions of the second layer wirings M2 relative to the first layer wirings M1. 21 shows a boundary line for a device isolation region (field oxide film). That is, the portion surrounded with the line 21 is a device forming region. 22 represents a bonding pad for the drain electrode (drain pad) and 23 represents a bonding pad for the gate electrode (gate pad). The drain and gate pads 22 and 23 show one block and several blocks are arranged in parallel in an actual chip in accordance with a required gate width. This will be explained later with reference to FIG. 3.

FIG. 2 shows a case of two gate electrodes 7 in which the drain region is put between the gate electrodes 7 and source regions are formed on both sides. A portion between A–A' constitutes a basic cell shown in FIG. 1 and several tens of them are arranged repeatedly into one block in an actual chip. The drain is extended to the pad 22 by the second layer wiring without traversing the gate electrode 7 but in parallel therewith. Further, also the source is backed by the second layer wiring without traversing the gate electrode 7 but in parallel therewith. The gate is extended on every predetermined length from the gate electrode 7 by the first layer wiring and is connected from the periphery in common to the pad part 23 through the second layer wiring. In Embodiment 1, the predetermined length for leading out the gate electrode is about 40 $\mu$m. Further, since the wiring is led out perpendicular to the gate electrode, a parasitic capacitance between the second layer wiring for the drain and the first layer wiring for the gate is reduced. That is, the stripe-like gate electrode 7 is extended at a predetermined distance of about 40 $\mu$m through the first layer wiring 11 in the direction perpendicular to the drain wiring and the gate electrode. They are connected in common on both ends of the block to the gate pad 23 through the second layer wiring 12. This can reduce the parasitic capacitance between the drain wiring and the gate wiring compared with the case of parallel extension.

Further, an extension 12E of the second metal conductor layer for the source is disposed in the vicinity of the drain pad 22, other penetration layer having the same constitution as the penetration layer described above is disposed in the epitaxy layer being positioned below the extension 12E, and the extension 12E is electrically connected to the penetration layer.

It is to be noted that the conductor plug is adopted as the electrode leading conductor in Embodiment 1, in which the opening for contact with the second layer wiring to the first layer wiring M1 (contact portion) is situated above the electrode leading opening.

That is, as shown in FIG. 2, the contact 13 between the first layer wiring and the low resistance layer of the drain region and the contact 14 for the first layer and the second layer wirings are formed on one identical axis. The difference between this structure and the existent technique is to be explained below with reference to FIG. 45 and FIG. 46.

Figure 45:
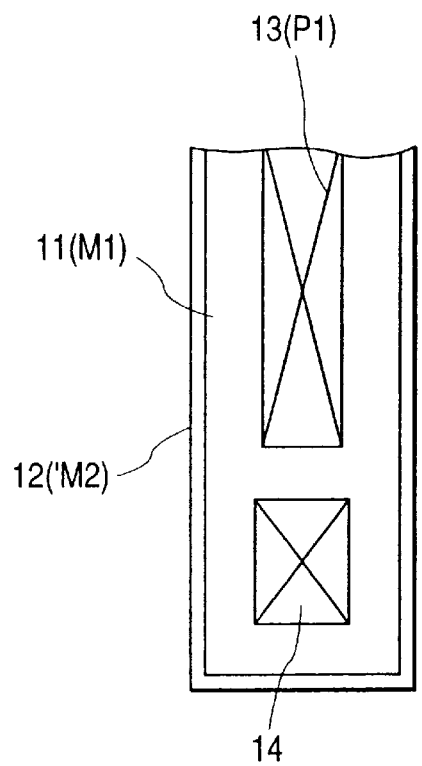
FIG. 45 is a plan view illustrating a contact portion for drain wirings in the existent technique.
Figure 46:
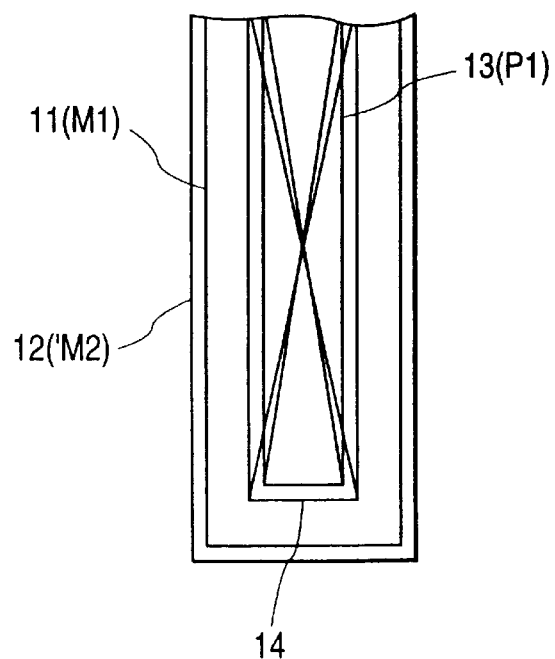
FIG. 46 is a plan view illustrating a contact portion for drain wirings in the semiconductor device as Embodiment 1 according to this invention.

FIG. 45 is a plan view showing a contact portion for drain wiring in the existent technique. On the other hand, FIG. 46 is a plan view showing a contact portion for the drain wiring in the semiconductor device of Embodiment 1. The existent technique referred to herein adopts a usual two layered wiring technique attempted by the present inventors, et al.

In the existent technique shown in FIG. 45, the first layer wiring 11 (M1) was directly connected to the drain region as the electrode leading electrode (wiring) by way of the contact portion (opening) 13 disposed to the first interlayer insulation film. Then, connection of the second layer wiring 12 (M2) for backing the first layer wiring 11 (M1) is conducted through the contact portion 14 disposed to the second interlayer insulation film so as not to overlap the contact portion 13. If the contact portion 14 is laid over the contact portion 13 in the layout, an indent is formed to the first layer wiring 11 in the contact portion 13. Therefore, etching residue is present in the contact portion 14 when the contact portion 14 is formed by photolithography. Thus, contact between the first layer wiring 11 and the second layer wiring 12 can not be formed reliably to result in increase in the contact resistance. Therefore, there is a problem that the effect of the backing wiring can not be obtained fully. Accordingly, it was necessary to displace the contact portion 14 and the contact portion 13 from each other in the layout.

On the other hand, in Embodiment 1, since the wiring is applied after burying the contact portion for leading out the electrode with the conductor plug (metal plug), the step is eliminated. Accordingly, as shown in FIG. 46, the contact portions 13 and 14 can be situated on one identical axis to provide advantages such as improvement for the degree of freedom in the layout, improvement in the current capacity of the contact and reduction of the resistance between the contact and the wiring. That is, the wiring resistance can be reduced in each of the N type source (low resistance) region 10, the N type drain (low resistance) region 9 and the P type source punch-through region 3 respectively. As a result, since the on-resistance can be reduced, high power-added efficiency can be attached to the semiconductor device.

It has been well-known to adopt the metal plug technique, for example, in CMOS transistors. Such technique is disclosed, for example, in Japanese Published Unexamined Patent Application Hei 6-350042. Although not described in the patent literature, the metal plug technique usually aims at the countermeasure for the step disconnection upon forming the upper layer wiring pattern. Particularly, the metal plug technique is applied to the electrode leading considering the case that the first layer wiring or the second layer wiring traverses the gate electrode (wiring).

However, according to Embodiment 1, the metal plug is applied in a state where the gate electrode and the second layer wiring (M2) for the drain do not cross to each other. That is, Embodiment 1 is based on the concept quite different from the application of the known metal plug technique.

Figure 83:
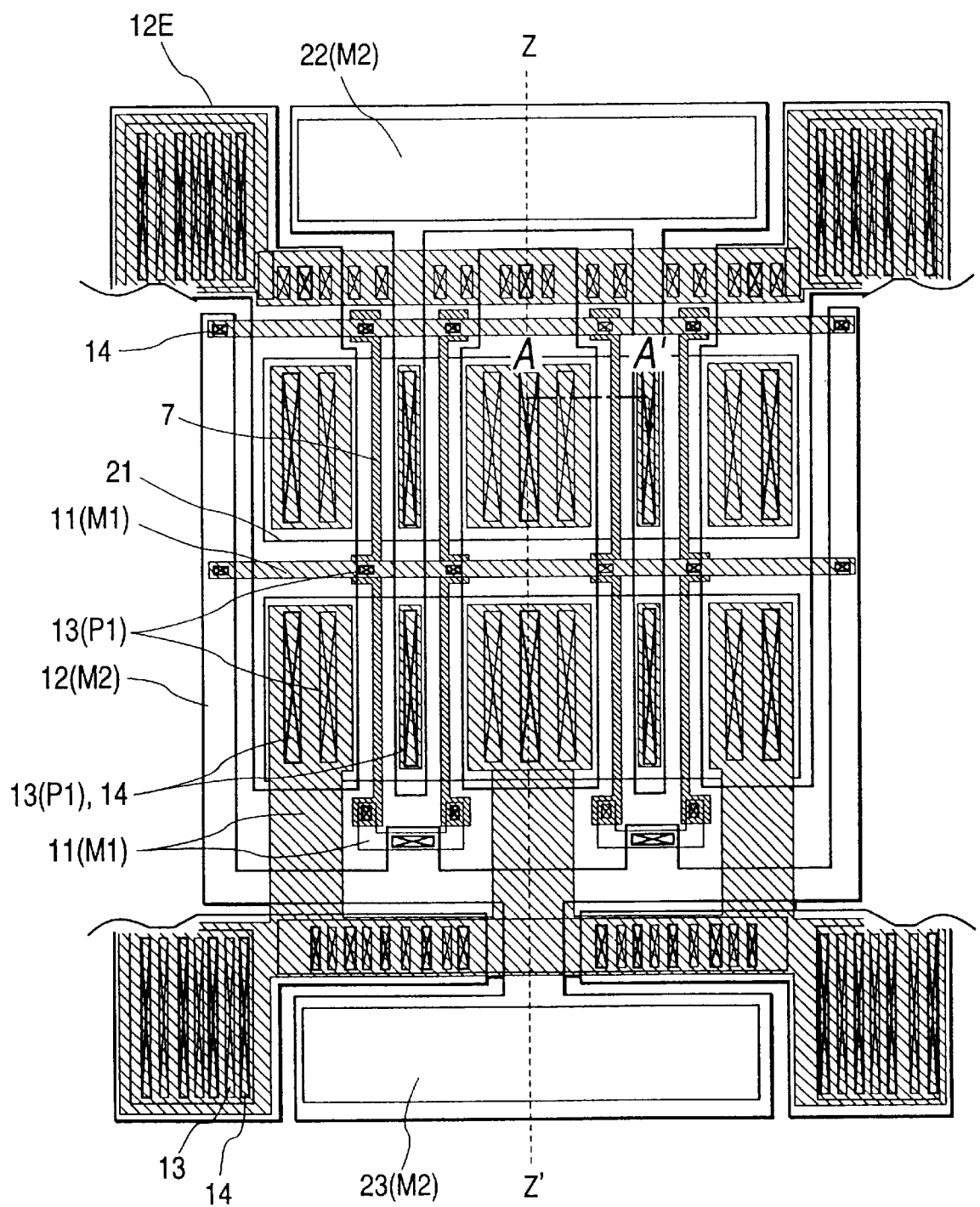
FIG. 83 is plan view of a semiconductor device in which the number of gates is increased in Embodiment 1 according to this invention.

FIG. 2 shows the case of using two gate electrodes 7. In a case of four gate electrodes 7, it adopts a layout structure of disposing them in 180° symmetry with respect to axis Z–Z' as the center as shown in FIG. 83. The gate electrodes 7 are disposed by an even number so as to sandwich respective drain electrodes (drain region), while taking the balance of the drain current into consideration.

Chip Layout

FIG. 3 shows the layout for the chip in this Embodiment 1. The layout for the unit block shown in FIG. 3 has the constitution as previously explained with reference to FIG. 2.

Power MOSFET arranged in the chip shown in FIG. 3 comprises a plurality of unit blocks connected in parallel.

That is, in the insulated gate semiconductor device of this embodiment having a plurality of channel regions, a drain region and a source region disposed on both sides of each of the channel regions and a conductor layer for the gate electrode disposed to the surface of each of the channel regions by way of a gate insulation film to a main surface of a semiconductor chip having a semiconductor layer, and including insulated type field effect transistors as a unit block, wherein a metal plug is connected with the main surface of each of the drain regions and each of the source regions, a first metal conductor layer is connected with each of metal plugs, an interlayer insulation film is covered on the first metal conductor layer, a second metal conductor layer for the drain is connected in common with each of the first metal conductor layers for the drain of the first metal conductor layers through drain connecting openings disposed to the interlayer insulation film being situated on the metal plug connected with the drain region, a second metal conductor layer for the source is connected in common with each of the first metal conductor layers for the source of the first metal conductor layers through source connecting openings disposed to the interlayer insulation film, a second metal conductor layer for the gate is connected in common with each of the first metal conductor layers for the gate of the first metal conductor layers through gate connecting openings disposed to the interlayer insulation film, the second metal conductor layer for the drain having a drain bonding pad 22 and the second metal conductor layer for the gate has a gate bonding pad 23, and wherein the insulated gate type field effect transistors of the unit block are disposed in plurality to the main surface of the semiconductor chip.

As shown in FIG. 3, a plurality of drain pads 22 are disposed along one side of a chip, and gate pads 23 and source pads 20 are disposed along other side of the chip. Among them, the source pad (source pad for probing) 20 is not used actually but mainly used only for checking the device operation. That is, the source pad 20 is disposed for facilitating the check of the operation of the power MOSFET in the state of a wafer not divided into each of the chips. Upon operation check, the characteristics of each of the chips (MOSFET) can be inspected by bringing a inspection probe (probe) into contact with each of the pads 20, 22 and 23 disposed on the upper surface of the substrate.

Protection diodes 19 for preventing electrostatic destruction of the gate insulation film are disposed to the gate pads arranged on both ends of the chip. The gate protection diode is to be explained below.

Gate Protection Diode

FIG. 4 and FIG. 5 show the constitution of a gate protection diode. FIG. 4 is an enlarged plan view for a portion of the gate protection diode 19 shown in FIG. 3. FIG. 5 is a cross sectional view taken along line D–D' in FIG. 4.

In FIG. 4 (FIG. 5), 21 represents a thick field oxide film. A gate pad 23 disposed on the field oxide film 21 is integrally formed by patterning with a second layer wiring 12 (M2). Then, the gate pad 23 is connected with a P type low resistance region 4 by way of the first layer wiring 11 (M1). A diode of a PNP structure (back-to-back diode) is constituted with a P type low resistance region 4b formed into a circular shape so as to surround the P type low resistance region 4, an N type high resistance region 8 and a P type low resistance region 4a. The breakdown voltage of the PNP structure is designed to about ±5~9 V to clamp and absorb a surge voltage on the gate pad. The P type low resistance regions 4a and 4b are formed by an identical process with that for the P type low resistance region 4 for the contact shown in FIG. 1.

A metal plug P1 is adopted also in this gate protection diode. Two stripe-shaped metal plugs P1 are connected with the P type region 8 (4) and function such that current flows uniformly.

Process

The method of manufacturing the silicon power MOSFET as Embodiment 1 will be explained below with reference to FIG. 6 to FIG. 29.

In each of FIG. 6 to FIG. 9, FIG. 14, FIG. 20, FIG. 23 and FIG. 29, the cross sectional view shown in (a) illustrates a cross section taken along line X–X' in FIG. 2 and the cross sectional view shown in (b) illustrates a cross section along line Y–Y' in FIG. 2.

(1) Ion Implantation Step for Forming (P Type Punch-Through Layer)

Figure 6A:
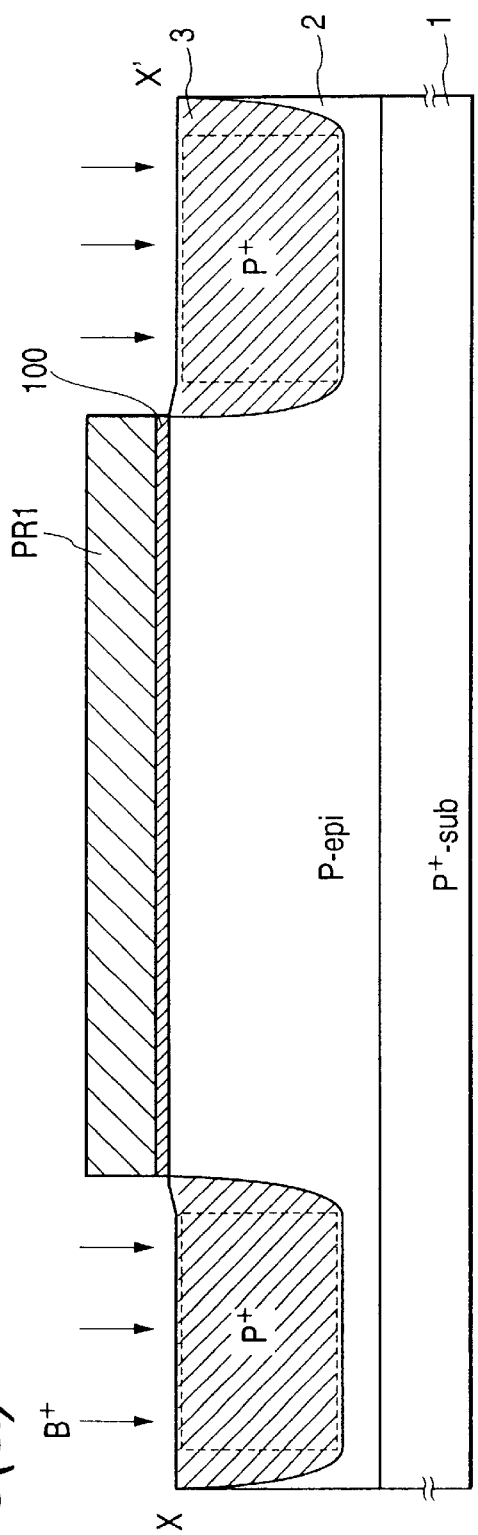
FIG. 6 is a cross sectional view for a main portion during manufacturing steps of a semiconductor device as Embodiment 1 according to this invention.

As shown in FIGS. 6(a) and (b), a semiconductor wafer in which a P type semiconductor layer 2 is formed to the main surface of a semiconductor substrate 1 comprising Si of a first conduction type (specifically P type) is provided. The P type semiconductor layer 2 was formed by a known epitaxial growing method. The P type semiconductor layer is hereinafter referred to as the P type epitaxy layer.

As described above, the specific resistivity of the semiconductor substrate 1 is 0.01 Ωcm. On the other hand, the specific resistivity of the P type epitaxy layer 2 is 20 Ωm, which is higher than the specific resistivity of the substrate. The thickness for the epitaxy layer 2 is set within a range from 2.5 to 3.5 μm while taking the reduction of the on-resistance and the drain breakdown voltage into consideration. In this embodiment, the thickness of the epitaxy layer 2 was set to 3 μm.

Successively, a silicon oxide ($SiO_2$) film 100 of 10 nm thickness is formed on the surface of the epitaxy layer 2. Then, for forming an ion implantation mask for forming a P type punch-through layer, a photoresist pattern (mask) PR1 is formed on the $SiO_2$ film 100 by using photolithography.

Successively, the silicon oxide film 100 and the surface of the epitaxy layer 2 are removed by etching using the mask PR1. The surface of the epitaxy layer 2 is etched to a thickness of about 50 nm. Then, a step difference is formed to the surface of the epitaxy layer 2. This step difference can be used as a target for mask alignment.

Subsequently, for forming a P type punch-through layer 3, impurities showing the first conduction type (P type) are introduced by an ion implantation into the epitaxy layer 2 not formed with the mask PR1. That is, boron ($B^+$) as P type impurity is, for example, ion implanted selectively to a deep portion of the epitaxy layer 2 under the condition with an acceleration energy of 80 KeV and at a dose of $1.5 \times 10^{16}/cm^2$.

(2) Field Oxide Film Forming Step

Figure 6B:
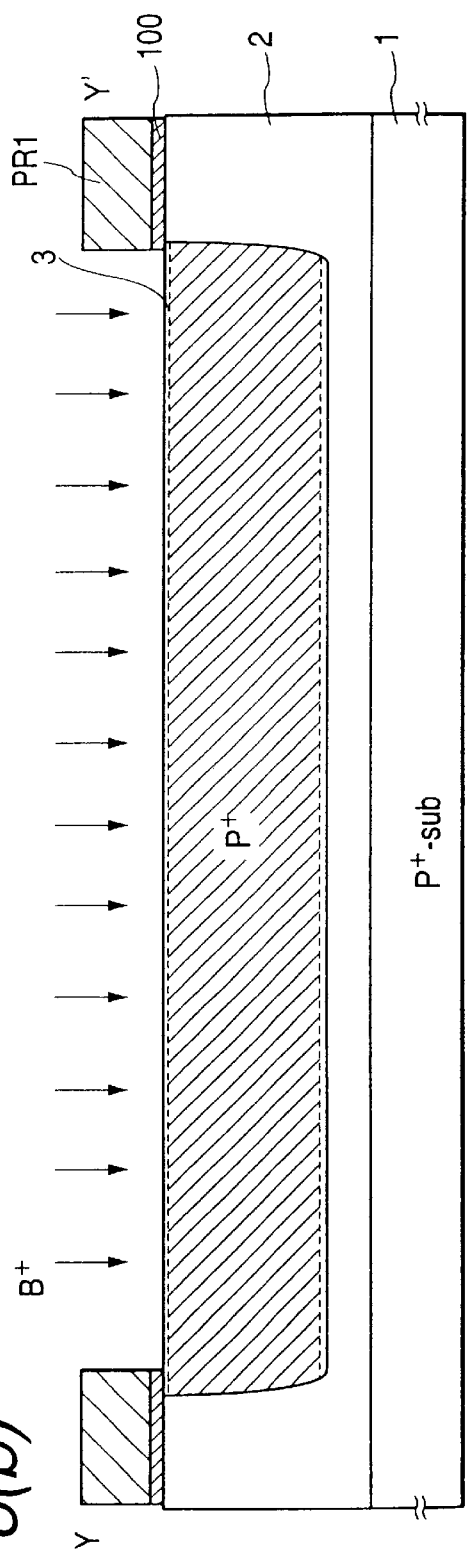

The mask PR1 and the silicon oxide film 100 shown in FIG. 6 are removed. Then, a field oxide film 21 is formed selectively by LOCOS (Local Oxidation of Silicon) technique for defining unit blocks of MOSFET.

At first, as shown in FIGS. 7(a) and (b), a silicon oxide film 100a is formed by thermal oxidation as a pad oxide film to the surface of the epitaxy layer. This pad oxide film prevents direct contact of an insulation film comprising a silicon nitride film (oxidation resistant insulation film) as an oxidation resistant mask to be formed successively with silicon surface. If the silicon nitride film directly covers the silicon surface, thermal strain remains on the surface to cause crystal defects. That is, the pad oxide film is formed as a buffer film for preventing crystal effects.

Successively, a silicon nitride film 101 as an oxidation resistant mask is formed. Then, the silicon nitride film 101 is patterned by using photolithography.

Then, using the remained silicon nitride film 101 as a mask, the surface of the epitaxy layer not formed with the silicon nitride film 101 is thermally oxidized to selectively form a field oxide film (LOCOS oxide film) 21 to 350 nm thickness.

It is important that the thermal oxidation (heat treatment) in this step is conducted under the treating condition at 1050° C. to 1100° C. for about 30 min and accompanied by extending diffusion of ion implanted P type impurities. Accordingly, a P type punch-through layer ($P^+$) 3 extending to the semiconductor substrate 1 is formed in the epitaxy layer 2 in this step. That is, heat treatment for forming the P type punch-through layer 3 and for forming the field oxide film 21 are applied not independently and separately but the heat treatment for forming them is conducted at once. That is, the heat treatment (annealing) step for forming the P type punch-through layer 3 can be saved.

Further, since this heat treatment step is saved, auto-doping of the boron impurity in the semiconductor substrate 1 into the epitaxy layer can be suppressed. This suppression of the auto-doping of the impurity can lower the concentration of the impurities from the P well (PW) 5 to be described later, to provide an effect of reducing the on-resistance.

The silicon nitride film 101 and the pad oxide film 100a are removed to eliminate defects present on the surface of the epitaxy layer 2. Successively, a silicon oxide film (100b) is formed by thermal oxidation on the surface of the epitaxy layer 2.

Then, the field oxide film 21 is annealed at a heat treatment temperature of about 1050° C. which is higher than the temperature for forming the silicon oxide film (100b). This annealing is applied with an aim of reducing crystal defects remaining on the surface of an active region in which MOSFET is formed and ensuring the breakdown voltage of the gate oxide film by decreasing the thickness of the gate oxide film, which is an important method for obtaining the power MOSFET of this Embodiment 1.

(3) First Impurity Introduction Step for Forming P type Well Region

As shown in FIGS. 8(a) and (b), a photoresist pattern (mask) PR2 is formed so as to cover a drain forming region.

Successively, impurities showing the first conduction type are introduced selectively to the surface of the epitaxy layer 2 that is not formed with the mask PR2. For example, boron as the P type impurity is selectively introduced into the epitaxy layer 2 by ion implantation with an energy of passing through the field oxide film 21. That is, boron is introduced such that the distribution of the impurity concentration after the annealing treatment substantially forms a peak on the surface of the epitaxy layer 2 in contact with the field oxide film 21. This forms a P type high impurity concentration region as a channel stopper on the surface of the epitaxy layer 2. The ion implantation is conducted under the conditions are with an acceleration energy of 200 KeV and at a dose of $2.0 \times 10^{13}/cm^2$.

(4) Second Impurity Introduction Step for Forming P type Well Region

Succeeding to the first impurity introduction step, impurities showing the first conduction type are selectively introduced into the epitaxy layer 2 in a state of leaving the mask PR2 as shown in FIGS. 9(a), (b). For example, boron like that in the first impurity introduction step described above, impurities show the first conduction type are introduced selectively into the epitaxy layer 2 by ion implantation. The ion implantation is conducted under the conditions with an acceleration energy of 50 KeV and at a dose of $1.0 \times 10^{13}/cm^2$.

By conducting ion implantation twice stepwise as in the first and second impurity introduction steps, the impurity concentration distribution in the well along the direction of the depth can be made uniform, enabling to save the heat treatment (high temperature annealing) for extending dispersion. The order for the first and the second impurity introduction steps may be reversed.

(5) Ion Implantation Step for Controlling Threshold Voltage

Although not illustrated in the drawings, after removing the mask PR2 shown in FIG. 9, impurities are introduced for controlling the threshold voltage (Vth). For example, $BF_2$ ions are ion implanted to the surface of the epitaxy layer 2 under the conditions with an acceleration energy of 50 KeV and at a dose of $1.0 \times 10^{12}/cm^2$. Successively, after cleaning the surface of the epitaxy layer 2, the impurities implanted in the steps (3) and (4) are subjected to extending diffusion by the annealing treatment (950° C. for 60 sec) to form a P type well region (punch-through stopper layer) 5 as the channel forming region of MOSFET.

(6) Gate Insulation Film Forming Step

The silicon oxide film 100b undergoing damages by ion implantation (FIG. 9) was removed to expose the surface. Then, a gate oxide film 6 at a thickness of 10 nm or more and 12 nm or less is formed to the exposed surface of the P type well region 5 by thermal oxidation (refer to FIG. 10). According to Embodiment 1, the thickness of the gate oxide film 6 is set at 11±0.5 nm.

For the gate oxide film 6, a silicon oxide film containing nitrogen, s so-called oxynitride film may be applied instead of the thermally oxidized film. In this case, traps for hot electrons on the boundary of the gate insulation film are reduced to thereby enabling to take a countermeasure for hot carriers. That is, the oxynitride film can terminate the traps on the film boundary by bonding nitrogen (N).

Further, for the gate oxide film 6, a laminate gate insulation film comprising an $SiO_2$ film (4 nm thickness) by thermal oxidation and an $SiO_2$ film (7 nm thickness) of a thickness greater than the $SiO_2$ film laminated thereon may be applied. For the $SiO_2$ film by a CVD process, an HLD (High Temperature Low Pressure Decomposition) film is actually used. The HLD film is made of TEOS (tetraethyl orthosilicate) material as an organic source, which is excellent in the uniform film thickness and effective for preventing diffusion of impurities into the film. Use of such a gate insulation film is useful, particularly, for the embodiment of a P gate[108] N channel type Si power MOSFET to be described later. In the case of the P type gate electrode, denseness of the gate oxide film is impaired by the leakage of boron (impurity) contained in the electrode. Therefore, leakage of boron can be inhibited by the application of the laminated gate insulation film to prevent degradation of voltage breakdown of the gate insulation film.

(7) Conductor Layer Forming Step for Gate Electrode

Figure 10:
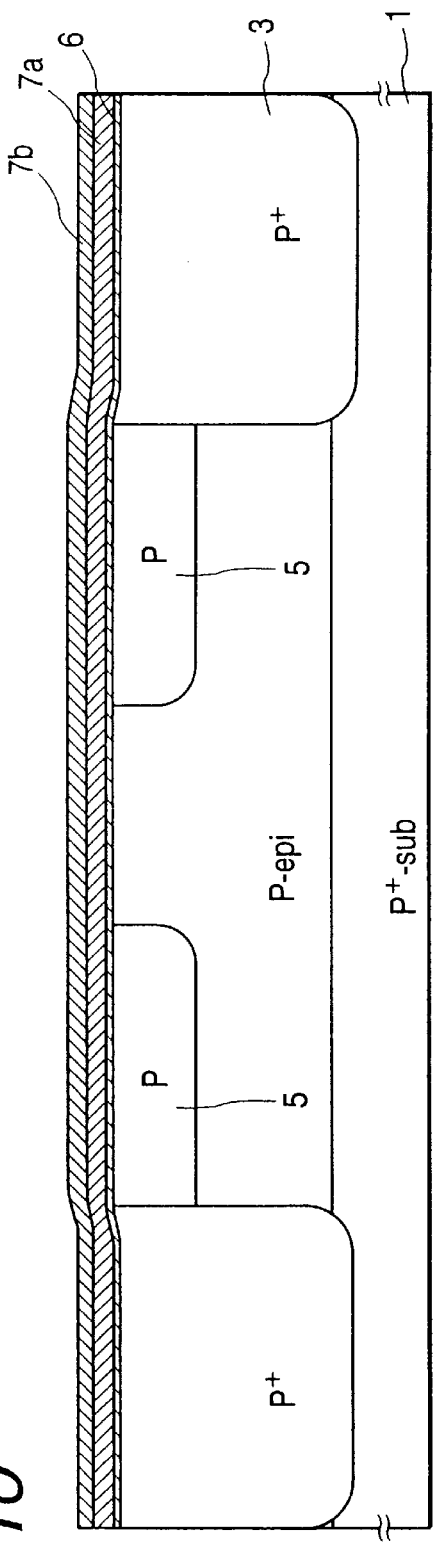
FIG. 10 is a cross sectional view for a main portion during manufacturing steps for the semiconductor device succeeding to FIG. 9.

Successively, as shown in FIG. 10, the surface of the gate oxide film 6 is covered with a polycrystal silicon layer containing phosphorus impurities at about 100 nm thickness (doped poly-silicon) 7a by a CVD process.

Successively, for obtaining a low resistance gate electrode, a metal silicide layer 7b, for example, a tungsten silicide (WSi) layer of about 150 nm thickness of a thickness greater than that of the polycrystal silicon layer 7a is laminated to the surface of the polycrystal silicon layer 7a. A silicon oxide film 20 of 150 nm thickness is formed by thermal decomposition of an organic silane as a protection film (cap layer) on the surface of the WSi layer 7b. Disposition of such a cap layer has been well-known in the technical field of CMOSLSI, but it has not been considered so far in the technical field of RF power MOS.

(8) Mask Pattern Forming Step for Gate Electrode

Figure 11:
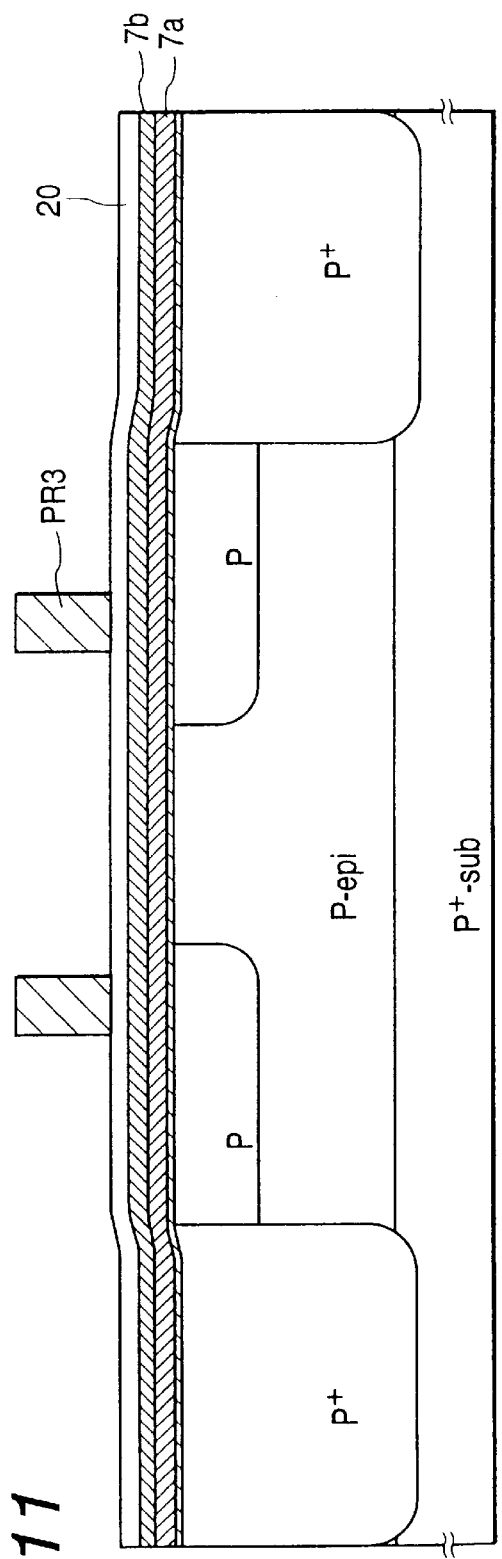
FIG. 11 is a cross sectional view for a main portion during manufacturing steps for the semiconductor device succeeding to FIG. 10.

As shown in FIG. 11, a photoresist pattern (mask) PR3 for forming a gate electrode is formed. The pattern width of the mask PR3 defines the gate length and is formed so as to be 0.35 μm or less.

(9) Gate Electrode Pattern Forming Step

Figure 12:
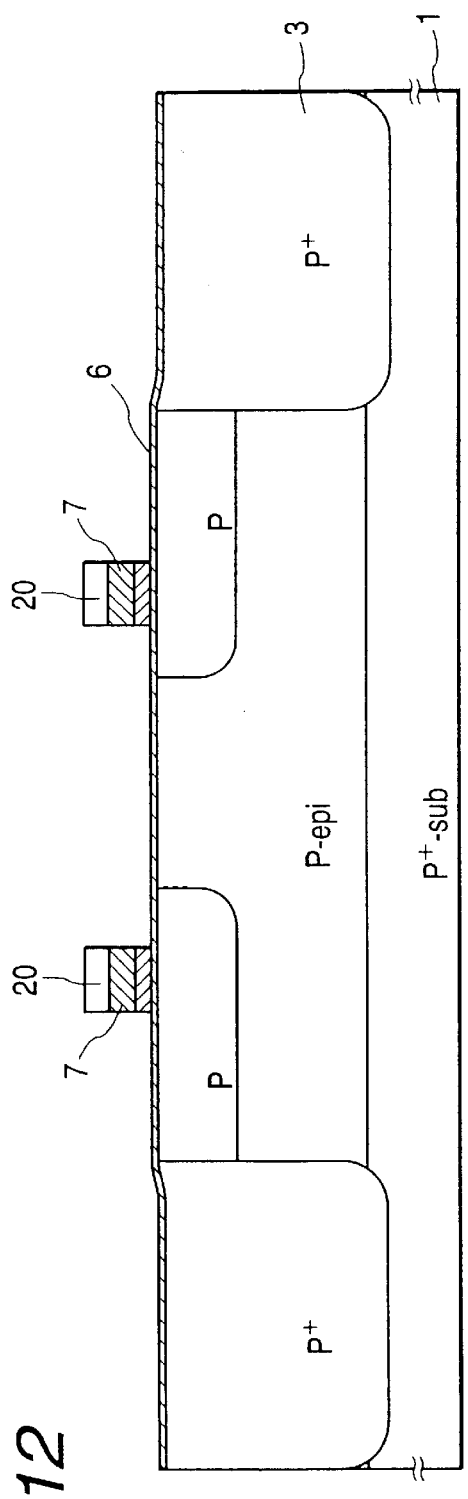
FIG. 12 is a cross sectional view for a main portion during manufacturing steps for the semiconductor device succeeding to FIG. 11.

FIG. 12 shows a state after forming the gate electrode pattern. A cap layer 20, a tungsten silicide layer 7b and a polycrystal silicon layer 7a are successively etched to form a gate electrode 7 comprising the polycrystal silicon layer 7a and the WSi layer 7b by patterning.

(10) Drain Offset Region Forming Step

Figure 13:
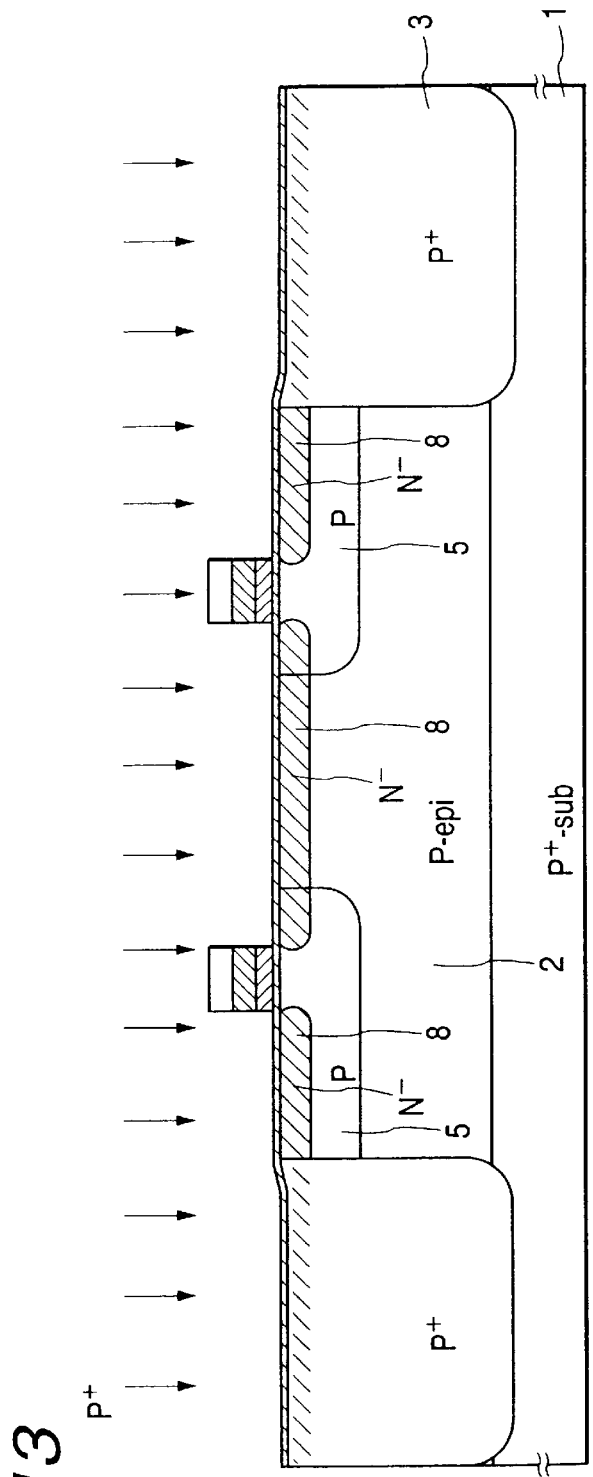
FIG. 13 is a cross sectional view for a main portion during manufacturing steps for the semiconductor device succeeding to FIG. 12.

As shown in FIG. 13, a low impurity concentration semiconductor region 8 is formed by self alignment to the gate electrode 7 by ion implantation in the P type well region 5. The low impurity concentration semiconductor region (drain offset region) 8 is applied with an aim of improving the drain breakdown voltage. Phosphorus as the N type impurity is used in the ion implantation for forming the drain offset region 8 and implantation is conducted under the condition, for example, with an acceleration energy of 50 KeV and at a dose of $1.0 \times 10^{13}/cm^2$.

Figure 35:
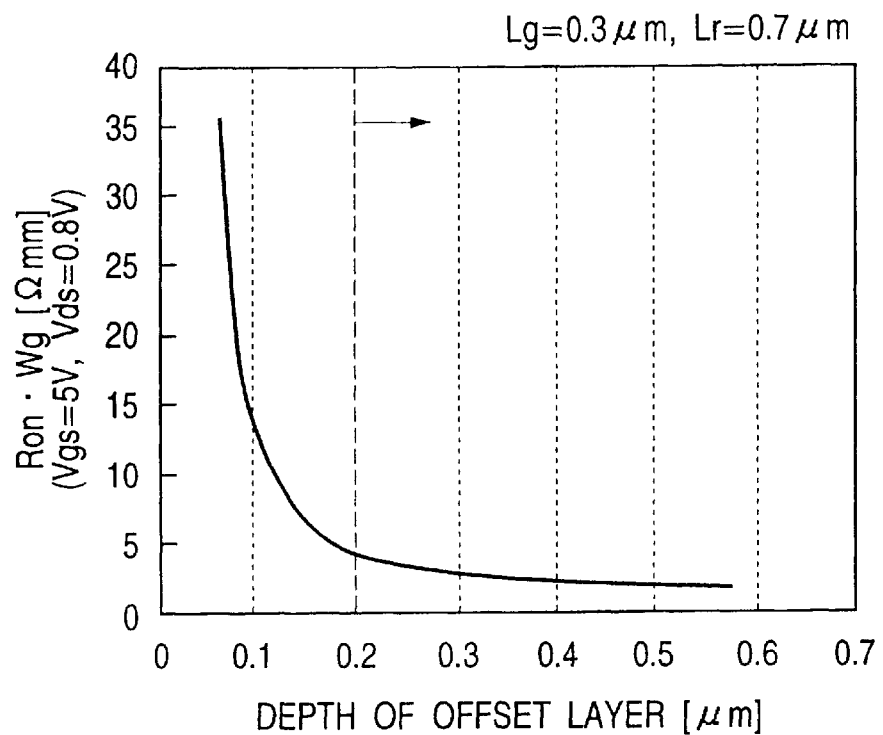
FIG. 35 is a characteristic diagram illustrating a relation between the offset layer depth and the on-resistance in the semiconductor device as Embodiment 1 according to this invention.

According to the experiment, the relation between the drain offset region (offset layer) and the on-resistance is as shown in FIG. 35. Accordingly, the depth of the offset layer is set to 0.2 μm or more.

(11) Source·Drain region Forming Step

Figure 14A:
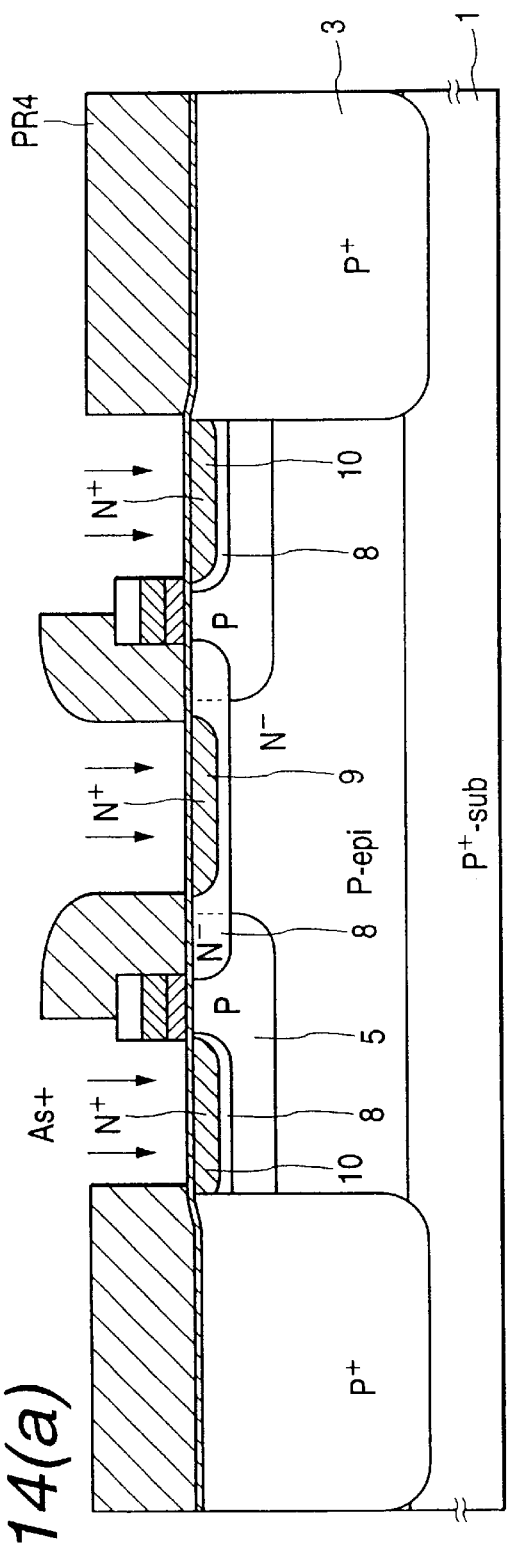
FIG. 14 is a cross sectional view for a main portion during manufacturing steps for the semiconductor device succeeding to FIG. 13.
Figure 14B:
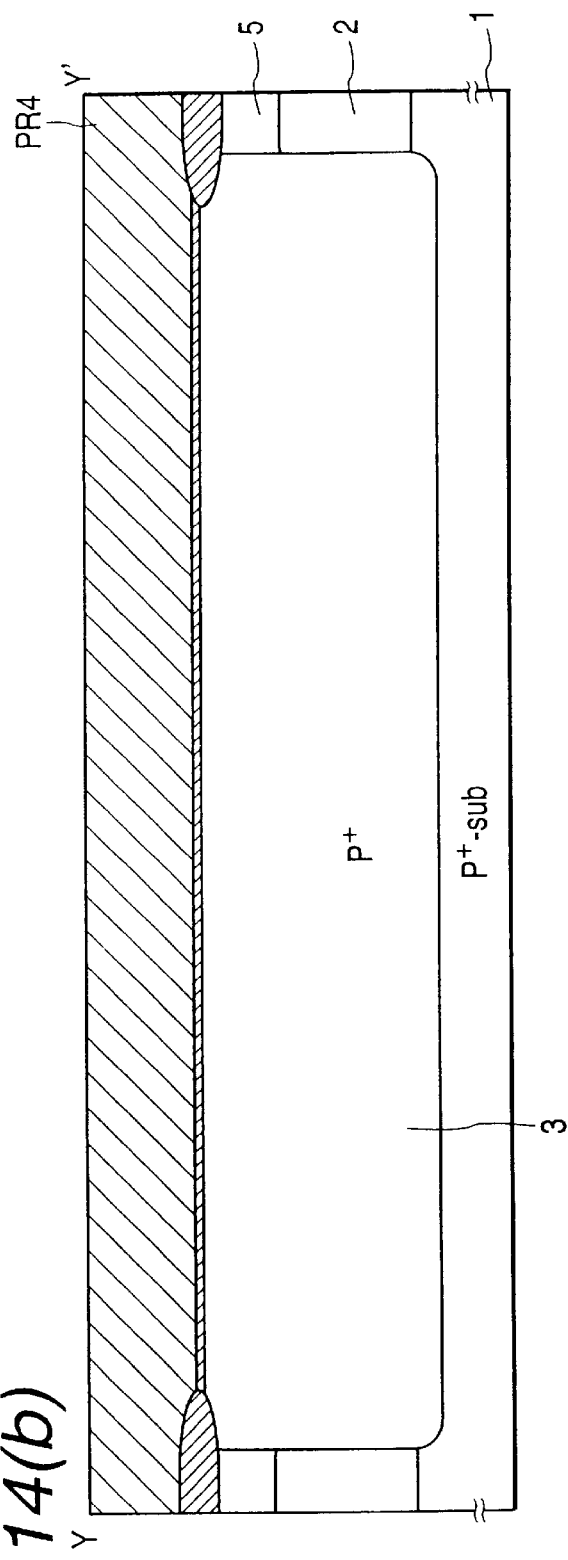
Figure 15:
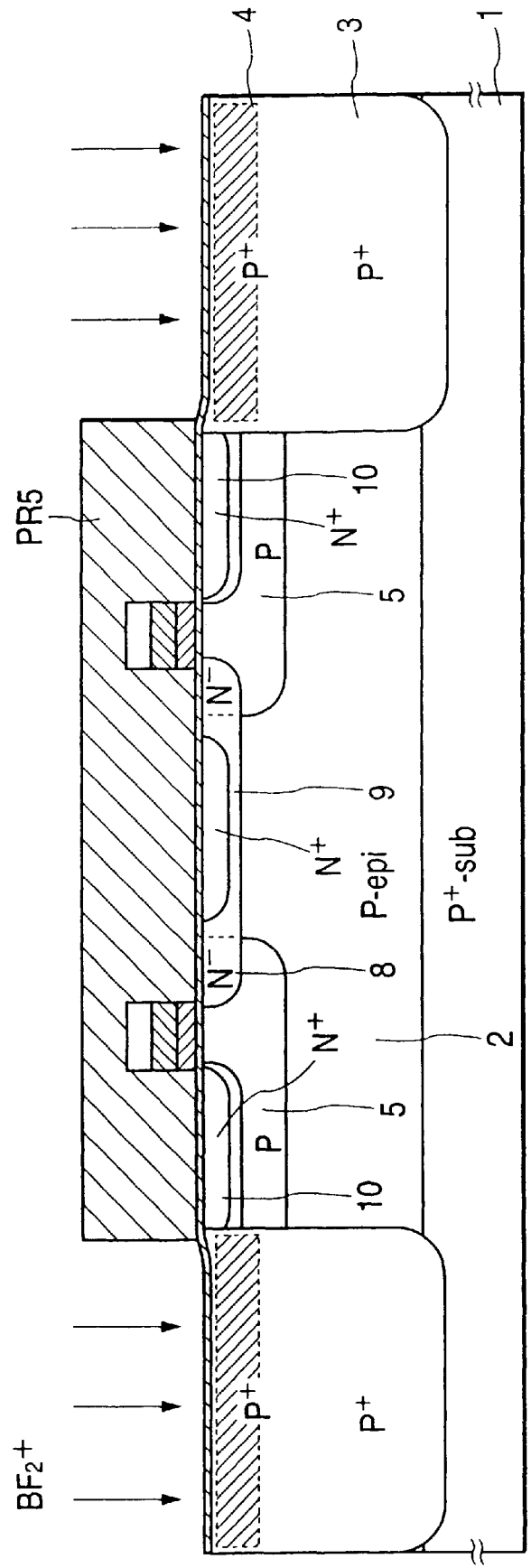
FIG. 15 is a cross sectional view for a main portion during manufacturing steps for the semiconductor device succeeding to FIG. 14.

As shown in FIGS. 14(a) and (b), a photoresist pattern (mask) PR4 is formed so as to cover a portion of the drain offset region 8 and the P type punch-through layer 3. Successively, impurities are introduced for forming the source·drain region by using the mask PR4. Arsenic as the N type impurity is selectively introduced into the low impurity semiconductor region 8 by ion implantation under the conditions with an acceleration energy of 60 KeV and at a dose of $8.0 \times 10^{15}/cm^2$ through the silicon oxide film (gate oxide film) 6 into the low impurity semiconductor region 8.

(12) Contact Region Forming Step

For reducing the resistance on the surface of the P type punch-through layer 3, boron fluoride ($BF_2$) as the P type impurity is introduced to the surface of the P type punch-through layer 3 using a mask PR5 under the conditions with an acceleration energy of 40 KeV and at a dose of $2.0 \times 10^{15}/cm^2$ by using a mask PR5. Then, annealing is applied. This forms a P type contact region 4 on the surface of the P type punch-through layer 3.

(13) First Insulation Film (Interlayer Insulation Film) Forming Step

Figure 16:
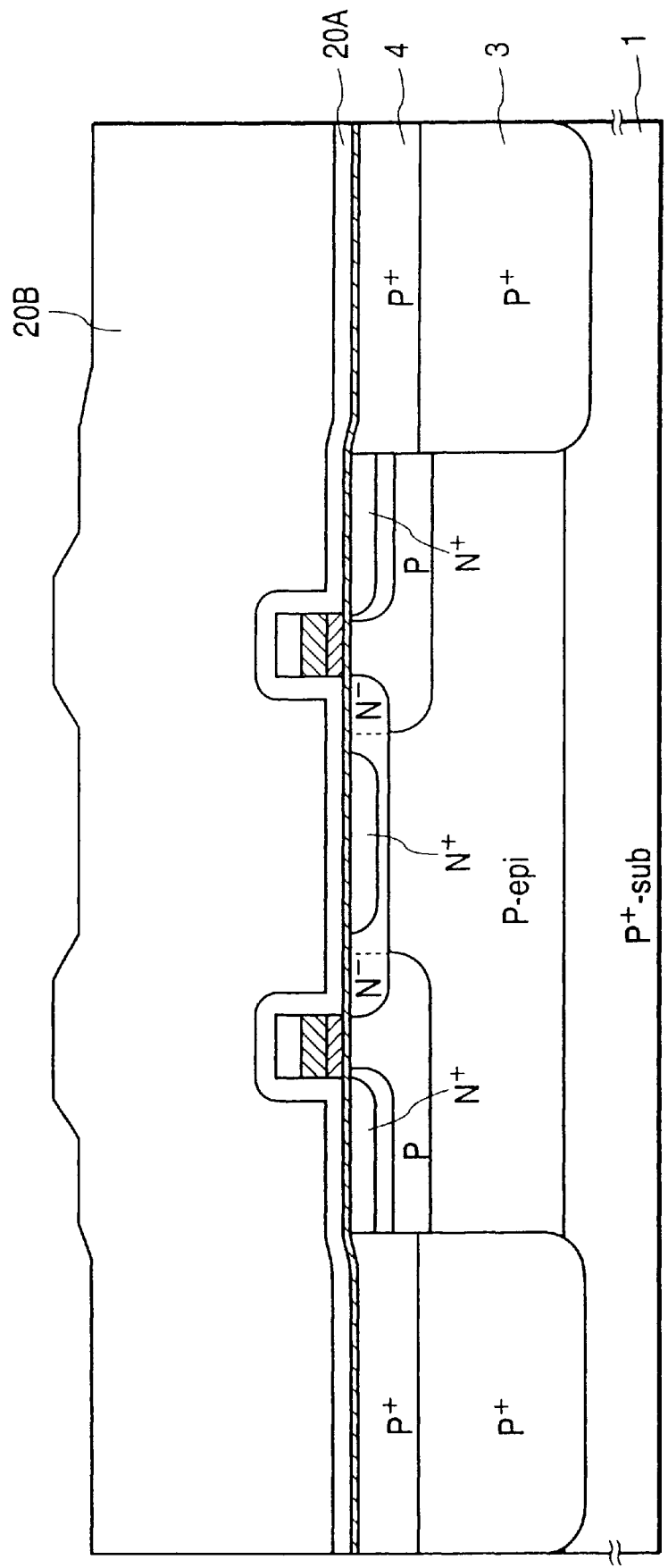
FIG. 16 is a cross sectional view for a main portion during manufacturing steps for the semiconductor device succeeding to FIG. 15.

A first insulation film 20 as an interlayer insulation film is formed over the entire surface of the semiconductor substrate 1. At first, as shown in FIG. 16, a CVD $SiO_2$ film 20A (100 nm thickness) and a plasma TEOS film 20B (800 nm thickness) of excellent flatness are successively formed on the semiconductor substrate 1. Since the surface of the plasma TEOS film 20B has a step difference above the gate electrode, it is polished by about 100 nm to be flattened using CMP (Chemical-Mechanical Polishing).

The CMP technology was adopted so far for IC (LSI) but it was not adopted for high frequency power MOSFET.

In Embodiment 1, by the adoption of the CMP technology, the metal plug to be described later can be attained to obtain a power MOSFET reduced with the on-resistance.

Figure 17:
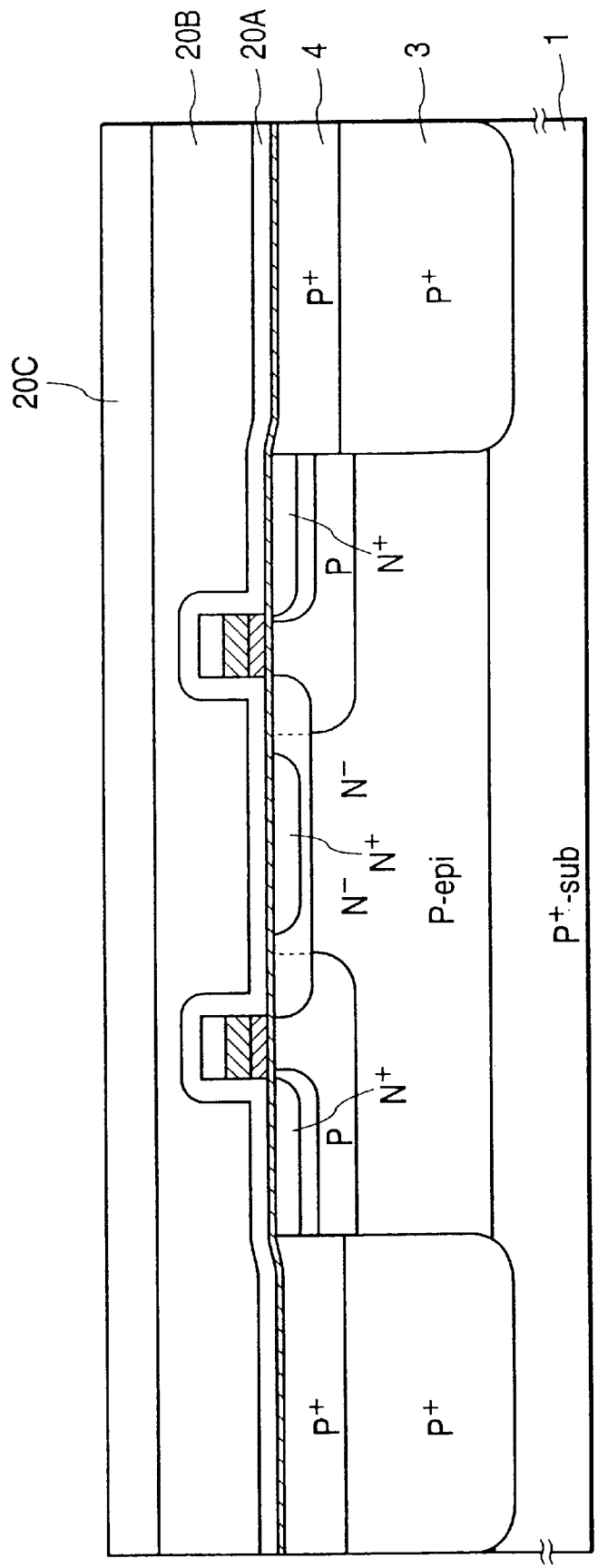
FIG. 17 is a cross sectional view for a main portion during manufacturing steps for the semiconductor device succeeding to FIG. 16.

Then, as shown in FIG. 17, a PSG film 20C (300 nm thickness) is formed on the plasma TEOS film 20B. The total thickness for the first insulation film is 1200 nm, which is formed to a thickness greater than the second insulation film (interlayer insulation film) to be described later. This intends to reduce the parasitic capacitance of wirings.

The CVD $SiO_2$ film 20A can be replaced with silicon nitride (SiN). Use of the silicon nitride can block invasion of $OH^-$ ions to the gate oxide film and is effective as a countermeasure for hot carriers.

(14) Forming Step for Electrode Leading Opening

Figure 18:
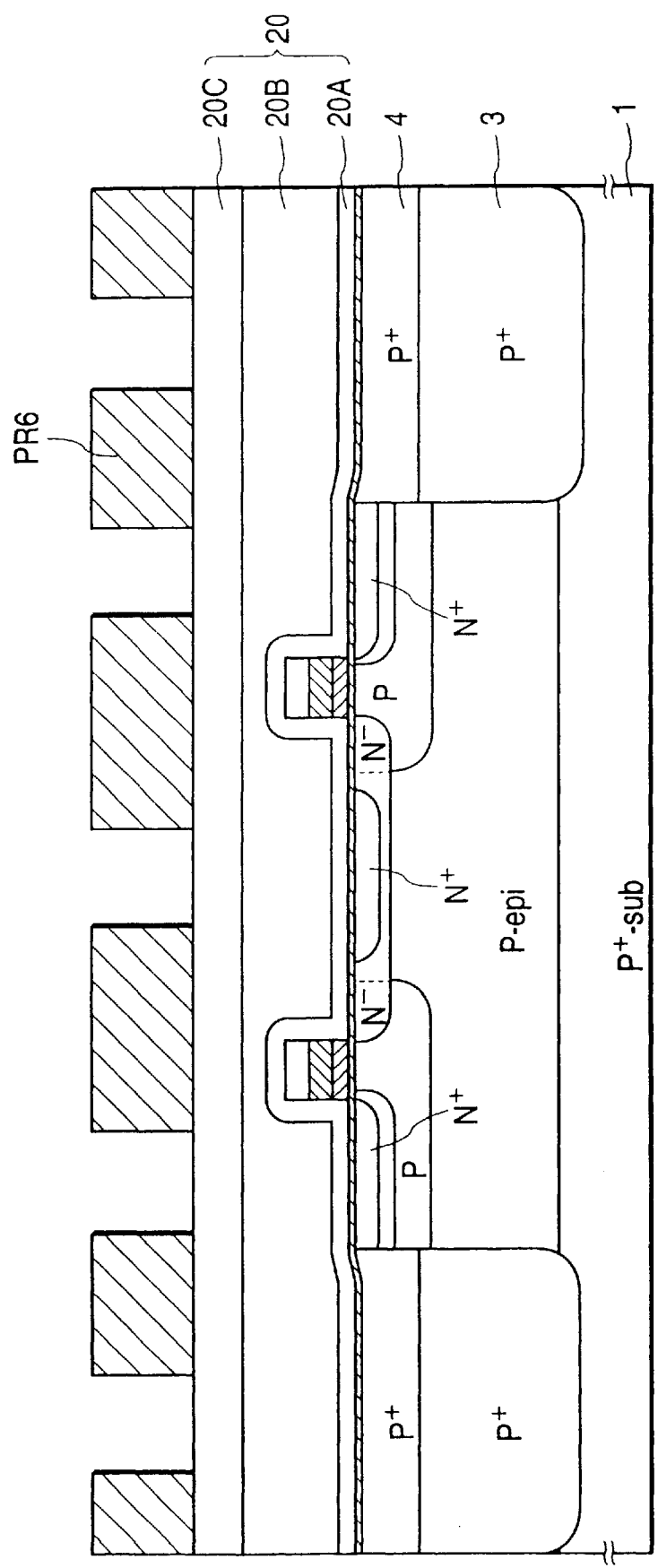
FIG. 18 is a cross sectional view for a main portion during manufacturing steps for the semiconductor device succeeding to FIG. 17.
Figure 19:
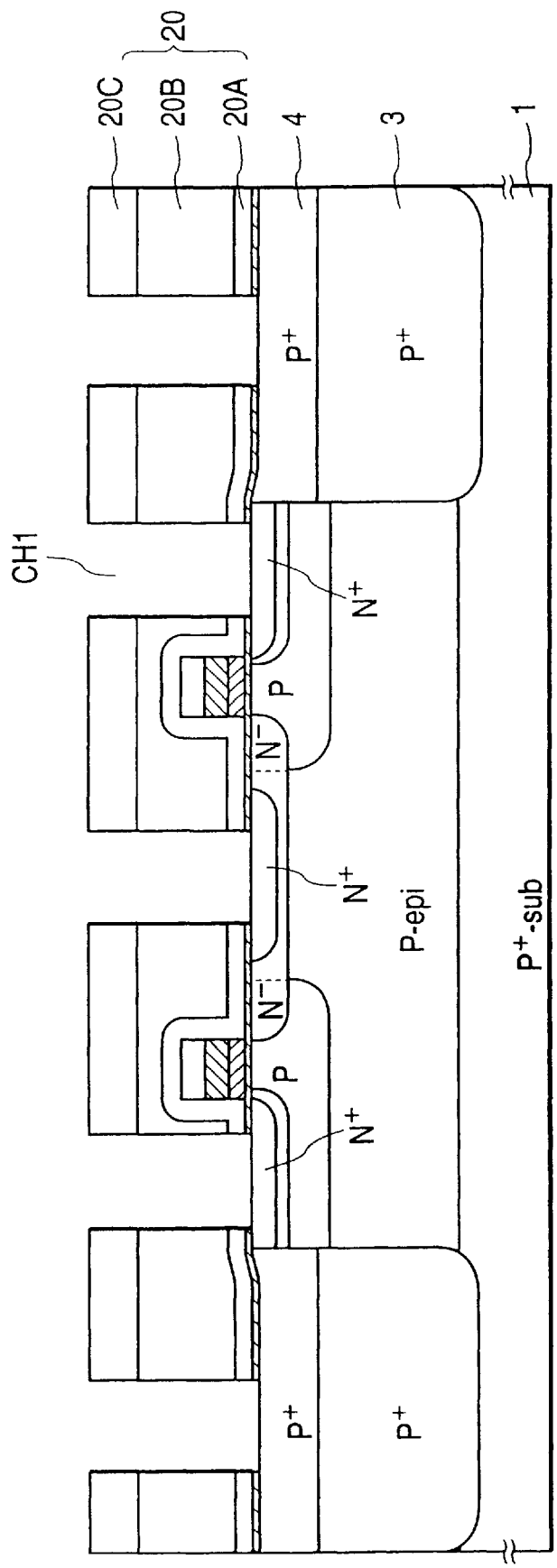
FIG. 19 is a cross sectional view for a main portion during manufacturing steps for the semiconductor device succeeding to FIG. 18.

As shown in FIG. 18, a photoresist pattern (mask) PR6 is formed on the PSG film 20C. Successively, as shown in FIG. 19, the first insulation film (20) is removed selectively by using the mask PR6 to form electrode leading electrode openings CH1.

(15) Metal Plug Forming Step

Figure 20A:
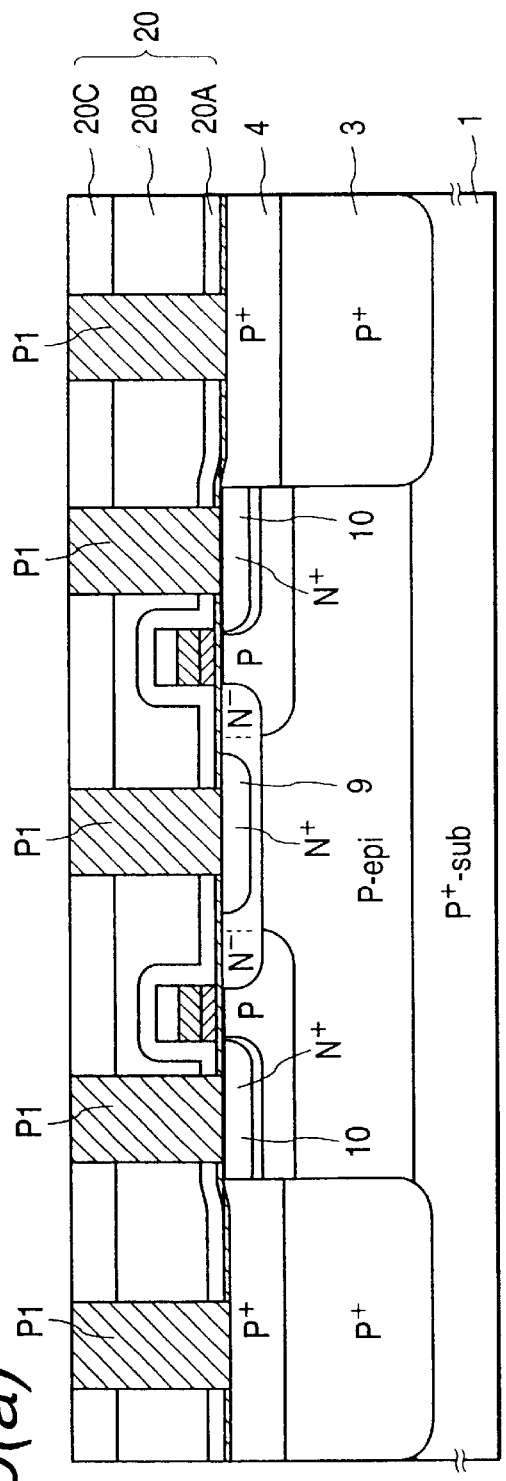
FIG. 20 is a cross sectional view for a main portion during manufacturing steps for the semiconductor device succeeding to FIG. 19.
Figure 20B:
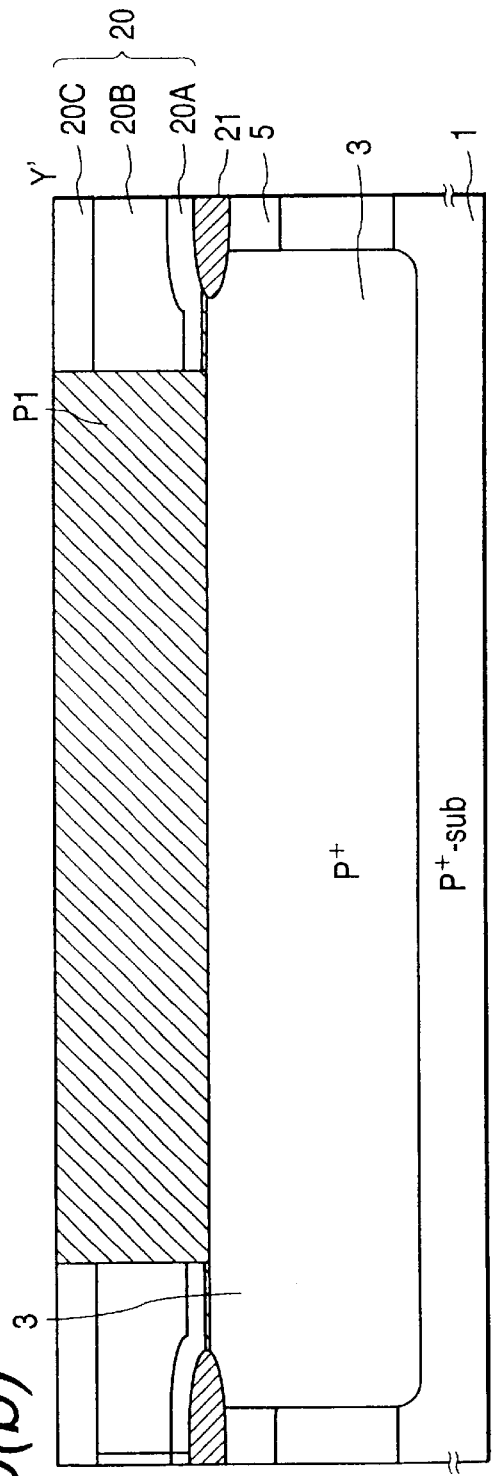

As shown in FIGS. 20(a) and (b), metal plugs P1 comprising W (tungsten) are formed in the electrode leading openings CH1, respectively.

At first, a TiN (titanium nitride) layer is formed as a barrier layer by a sputtering method to the surface of the first insulation film (20) formed with the electrode leading openings CH1 such that W (tungsten) does not diffuse into the semiconductor regions (8, 9). Successively, a high melting metal layer made, for example, of W (tungsten) is formed by a CVD process. Then, the high melting metal layer and the barrier layer are etched back. As a result, the metal plugs (P1) substantially in flush with the first insulation film 20 are buried in the electrode leading openings CH1. That is, the metal plugs P1 are connected to the source region (first region) 10, the drain region (second region) 9 and the leach through layer (3), respectively.

(16) Forming Step for First Conductor Layer (First Layer Wiring)

Figure 21:
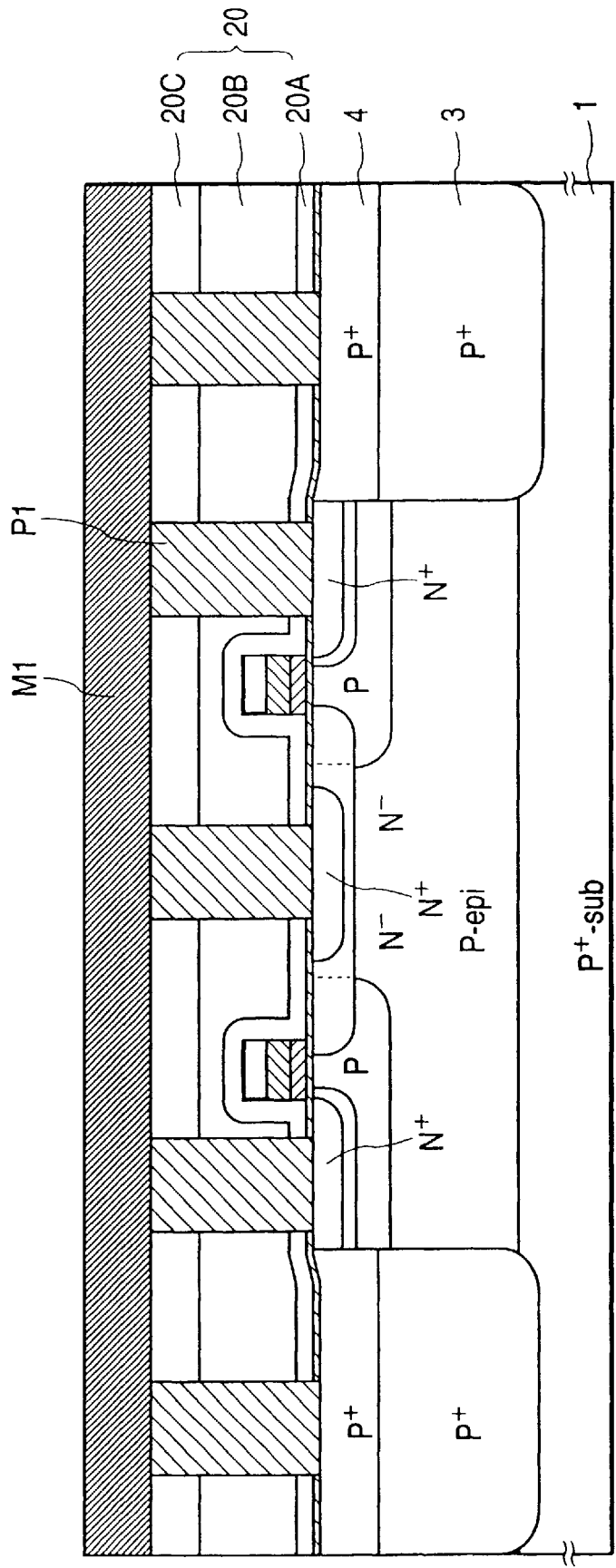
FIG. 21 is a cross sectional view for a main portion during manufacturing steps for the semiconductor device succeeding to FIG. 20.
Figure 22:
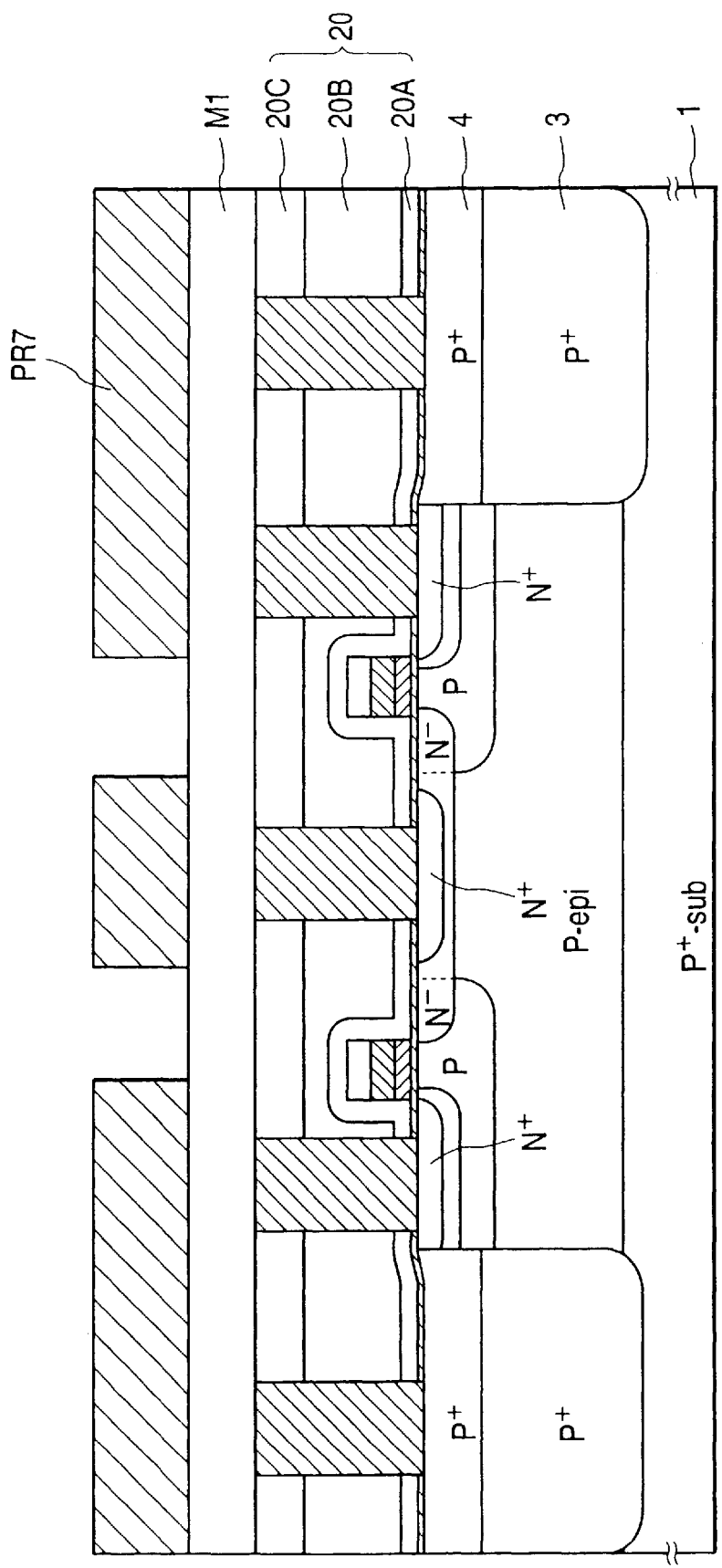
FIG. 22 is a cross sectional view for a main portion during manufacturing steps for the semiconductor device succeeding to FIG. 21.

As shown in FIG. 21, a first conductor layer (first layer wiring) M1 is formed on the first insulation film 20 by sputtering. The first conductor layer comprises an aluminum alloy having a low resistance and migration resistance. More specifically, an AlCu alloy is adopted for the material. The film thickness is about 400 nm. Successively, as shown in FIG. 22, a photoresist pattern (mask) PR7 is formed on the first conductor layer M1. Then, as shown in FIGS. 23(a), (b), the first conductor layer M1 is patterned by using the mask PR7.

(17) Forming Step for Second Insulation Film (Interlayer Insulation Film)

Figure 24:
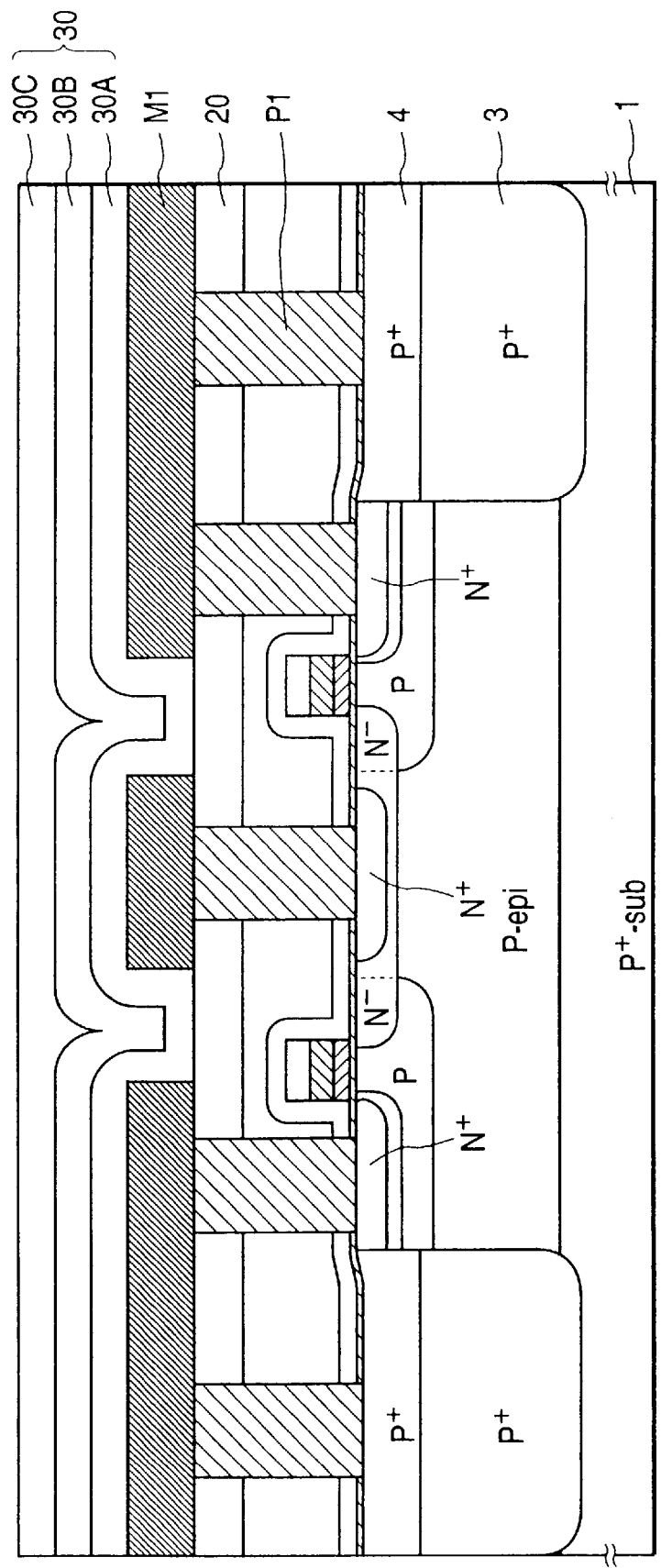
FIG. 24 is a cross sectional view for a main portion during manufacturing steps for the semiconductor device succeeding to FIG. 23.

A second insulation film 30 is formed as an interlayer insulation film over the entire surface of the semiconductor substrate 1. As shown in FIG. 24, a plasma TEOS film 30A (300 nm thickness), an SOG film 30B (300 nm thickness) and a plasma TEOS film 30C (300 nm thickness) are formed successively on the semiconductor substrate 1. The SOG film 30B is formed for moderating the step difference in the plasma TEOS film 30A.

(18) Forming Step for Wiring Connection Opening

Figure 25:
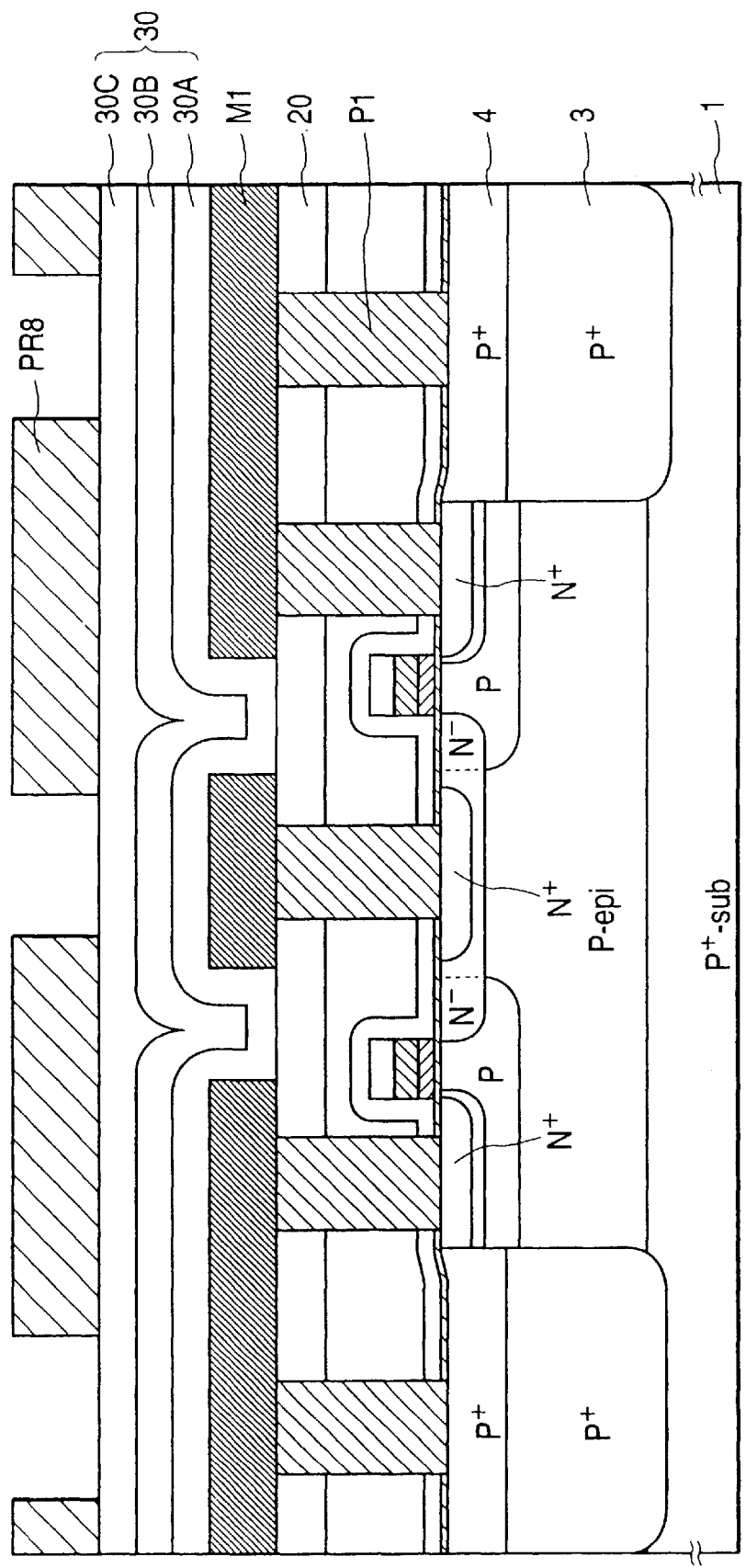
FIG. 25 is a cross sectional view for a main portion during manufacturing steps for the semiconductor device succeeding to FIG. 24.
Figure 26:
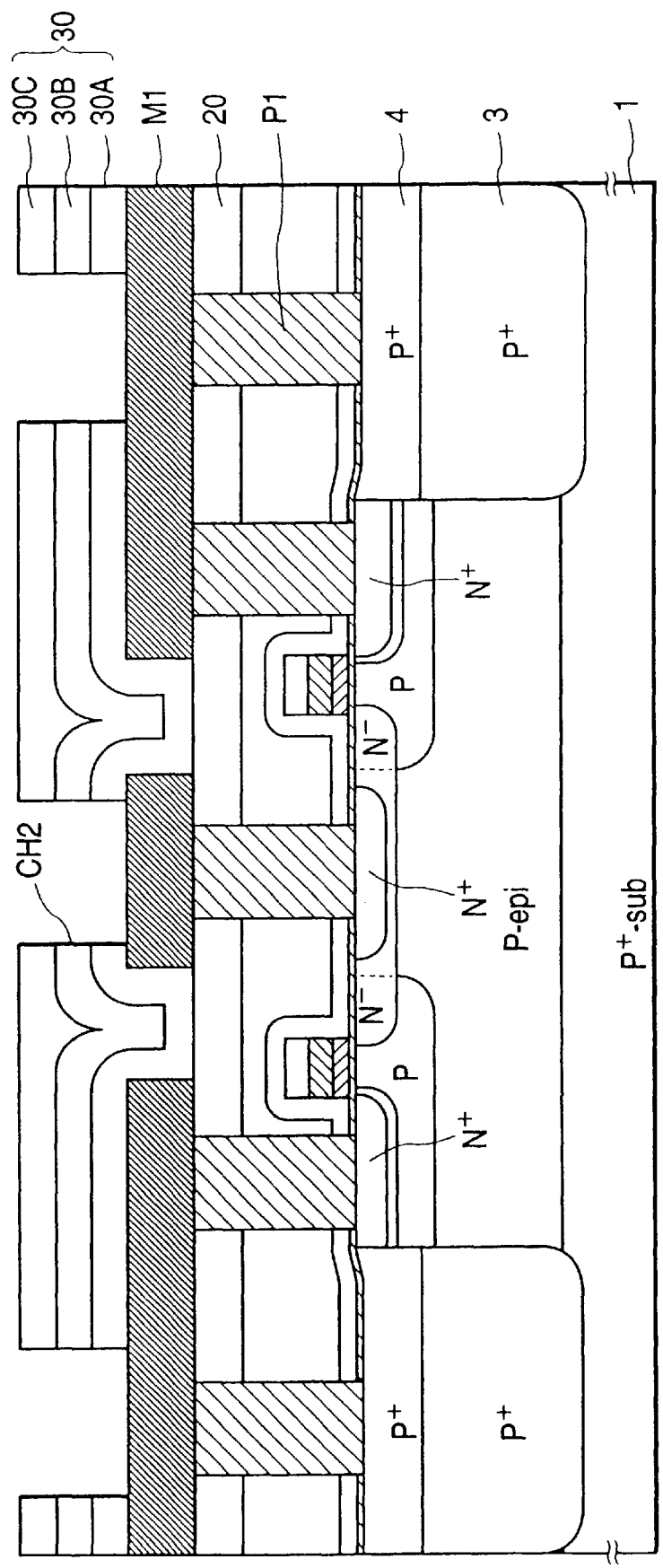
FIG. 26 is a cross sectional view for a main portion during manufacturing steps for the semiconductor device succeeding to FIG. 25.

As shown in FIG. 25, a photoresist pattern (mask) PR8 is formed on the second insulation film 30. Successively, as shown in FIG. 26, the second insulation film 30 (30A, 30B, 30C) is selectively removed by using the mask, to form wiring connection openings CH2. FIG. 26 shows a cross sectional structure of the semiconductor device after removing the mask PR8.

(19) Forming Step for Second Conductor Layer (Second Layer Wiring)

Figure 27:
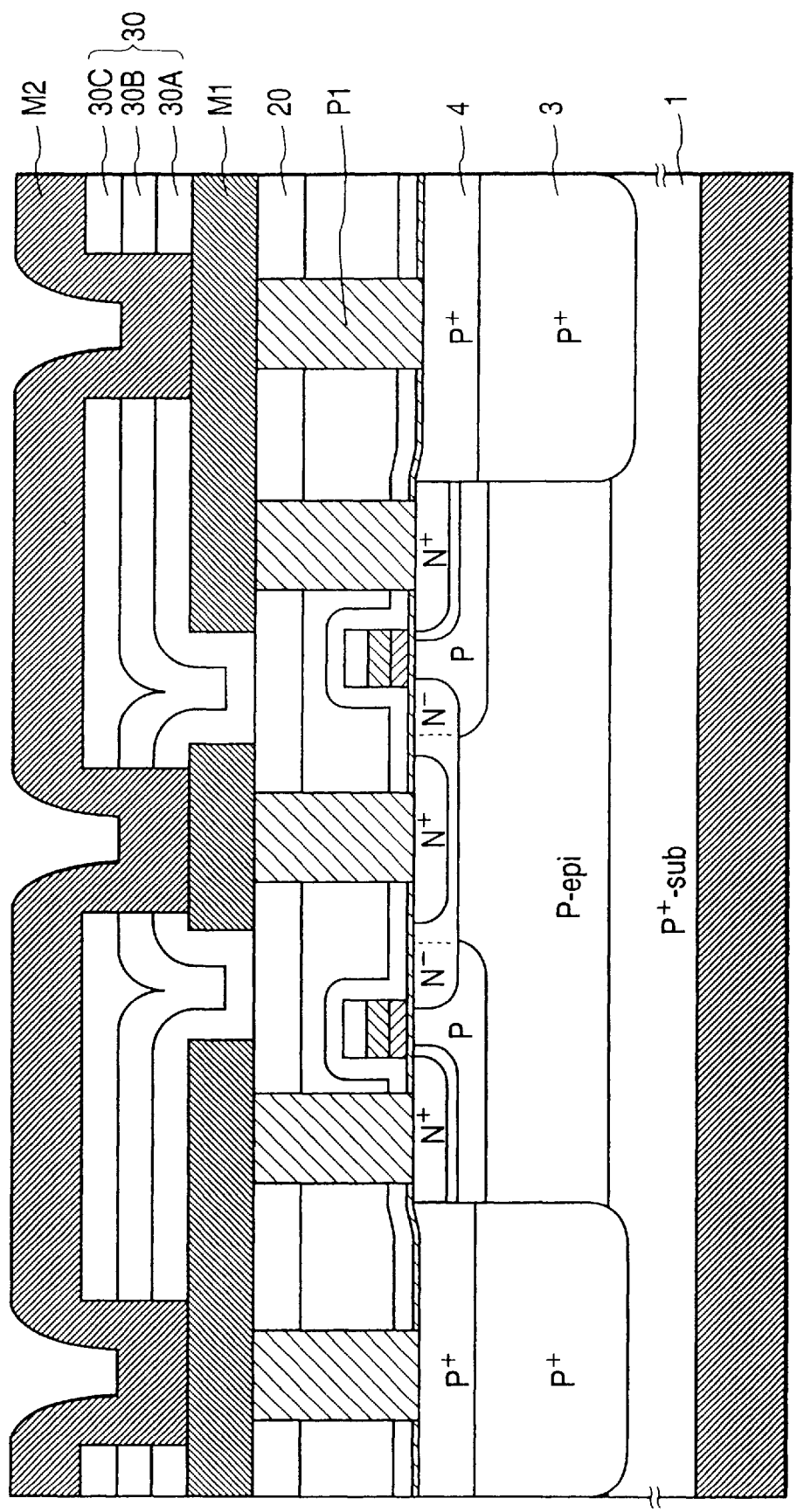
FIG. 27 is a cross sectional view for a main portion during manufacturing steps for the semiconductor device succeeding to FIG. 26.

As shown in FIG. 27, a second conductor layer (second layer wiring) M2 is formed on the first insulation film 30 by the same method as for the first conductor layer M1. Further, the same material as that for the first conductor layer is selected as the material for the second conductor layer (second layer wiring) M2. However, the film thickness is about four times compared with the thickness of the first conductor layer M1, which is used with an aim of reducing the resistance as the backing wirings.

Figure 28:
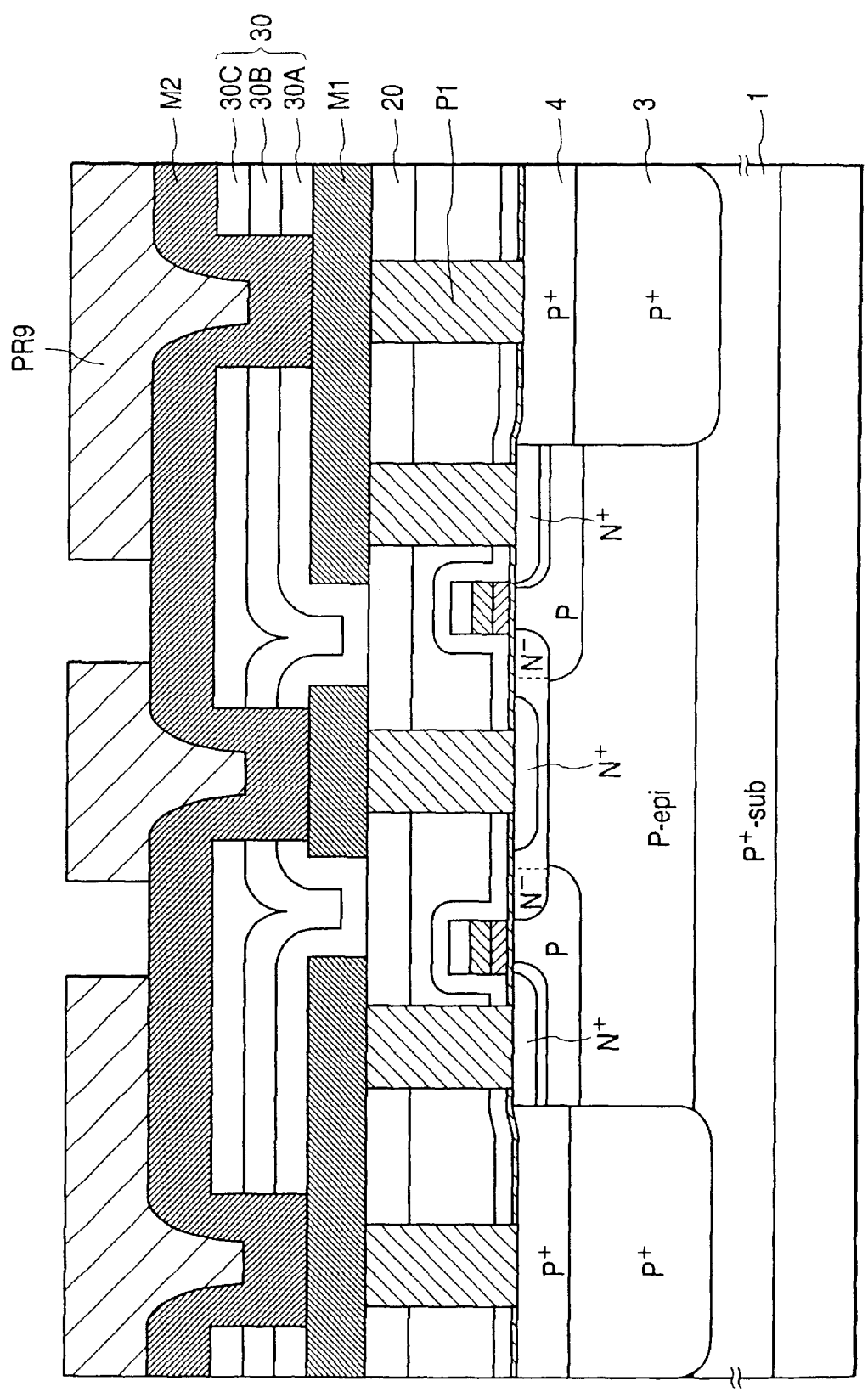
FIG. 28 is a cross sectional view for a main portion during manufacturing steps for the semiconductor device succeeding to FIG. 27.

Successively, as shown in FIG. 28, a photoresist pattern (mask) PR9 is formed on the first conductor layer M1.

Figure 29A:
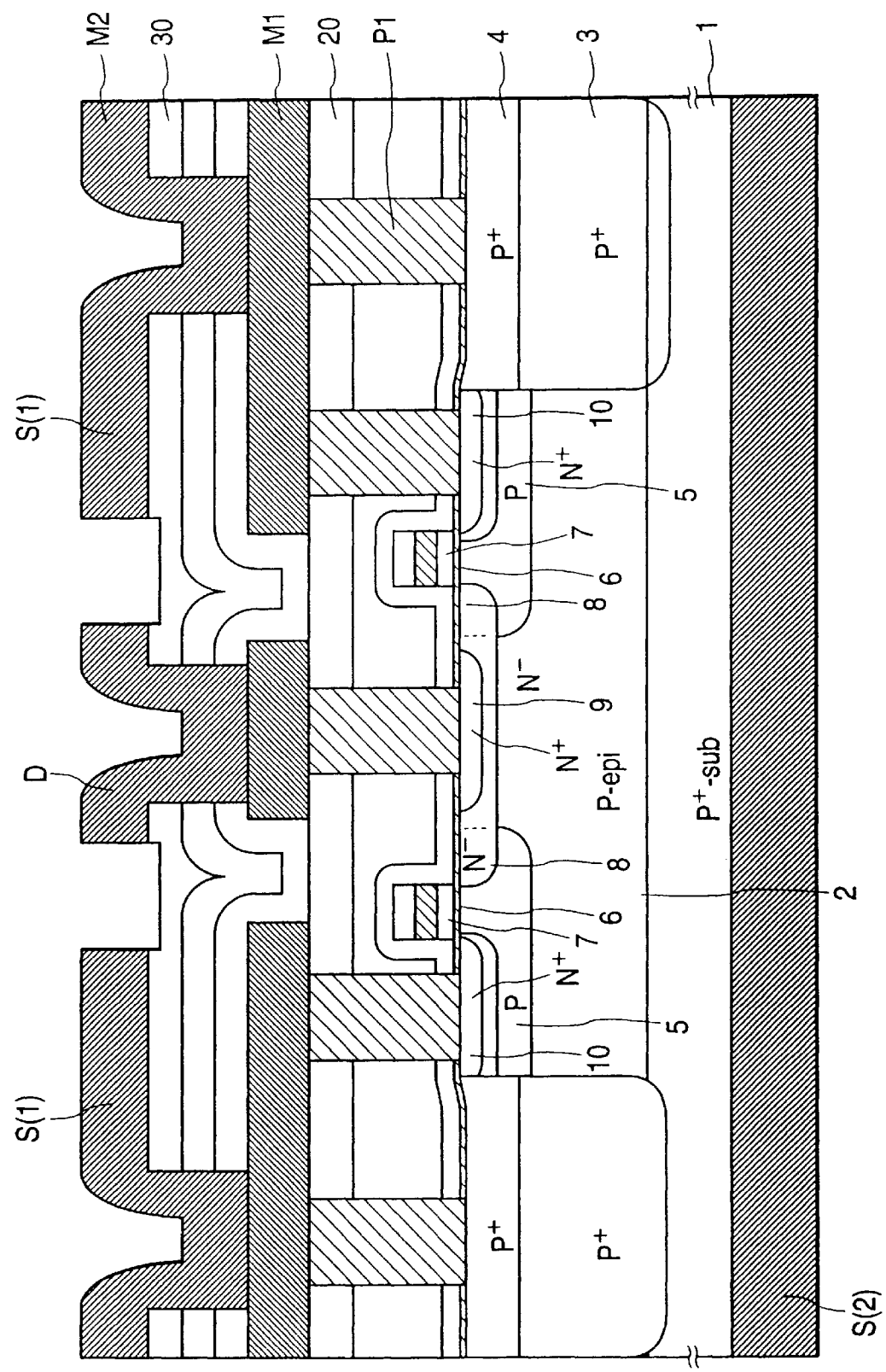
FIG. 29 is a cross sectional view for a main portion during manufacturing steps for the semiconductor device succeeding to FIG. 28.
Figure 29B:
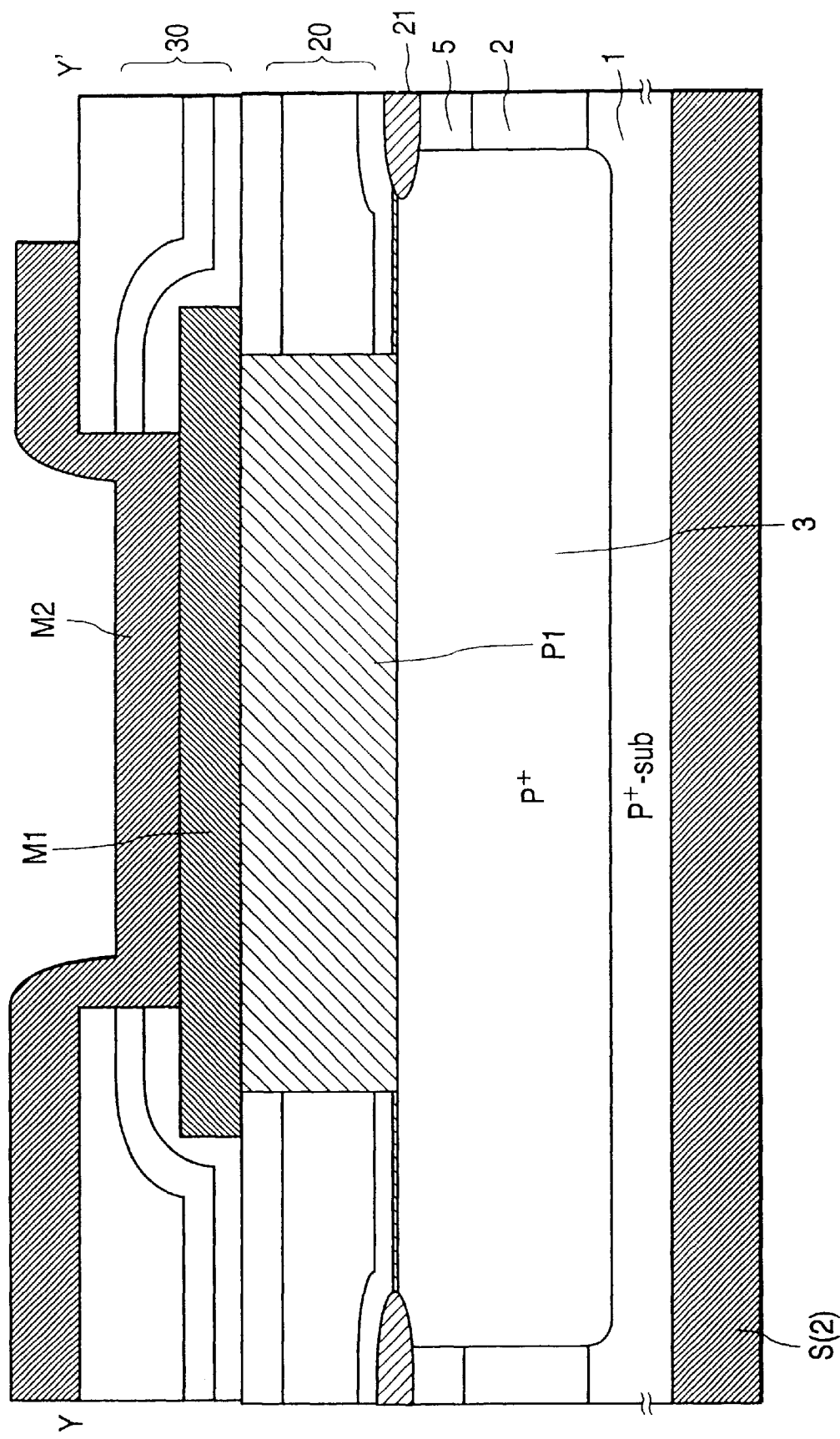

Then, as shown in FIG. 29, the second conductor layer M2 is patterned by using the mask PR9 to form a drain electrode (drain wiring) D, and a source electrode (source wiring) S(1). The source electrode (source wiring) S(1) electrically connects the source wirings (M1) at the first layer between each of the cells and between each of the blocks. FIG. 29 shows a cross sectional structure of the semiconductor device after removing the mask PR9.

(20) Forming Step for Source Rearface Electrode

Although not illustrated in FIG. 29, a surface protection film is formed on the drain electrode (drain wiring) D and the source electrode (source wiring) S(1) after the step (19) and the surface protection film is selectively removed so as to expose the pad portions. Successively, the rearface (lower surface) of the semiconductor substrate 1 is ground to reduce the thickness. This grinding is applied as a pretreatment for fabricating a semiconductor wafer into a semiconductor chip. Then, an Ni layer (about 0.1 μm thickness), a Ti layer (about 0.15 μm thickness), an Ni layer (about 0.2 μm thickness) and an Ag layer (1.3 μm thickness) of good solderability are formed successively to the rearface thereof to form a source rearface electrode. The lower Ti layer is formed for the adhesion between the Ni layer as the barrier layer and the Si substrate, while the upper Ti layer is formed for good adhesion with the Ag layer.

For the Ag layers peeling of the Ag layer by oxidation has to be considered upon attaching (soldering) to a module substrate. An Au layer may be used instead of the Ag layer. In this case, since the Au layer does not peel during soldering, low resistance contact with the module substrate can be attained.

According to this process, the following advantageous effects can be obtained.

(a) The thermal oxidation (heat treatment) applied in the step (2) above is accompanied by extending diffusion of ion implanted P type impurities.

Accordingly, the P type punch-through layer (P$^+$) 3 reaching the semiconductor substrate 1 is formed in the epitaxy layer 2 in this step. That is, heat treatment for forming the P type punch-through layer 3 and for forming the field oxide film 102 are applied not independently and separately but the heat treatment for forming them is conducted all at once. Therefore, heat treatment (annealing) step for forming the P type punch-through layer 3 can be saved.

(b) With the reason (a) described above, auto-doping of the impurities from the substrate to the epitaxy layer can be suppressed. Therefore, the impurity concentration in the P well (PW) can be easily controlled and kept lower. Therefore, even when the gate length is shortened for reducing the on-resistance, the breakdown voltage can be ensured effectively.

Accordingly, simplification for the heat treatment step can contribute to the reduction of the on-resistance.

(c) With the reasons (a) and (b) above, large thickness for the epitaxy layer 2 is no more necessary and the thickness can be made to 2.5 μm or more and 3.5 μm or less while taking the aimed breakdown voltage into consideration. Thus, the depth for forming the P type punch-through layer (P$^+$) 3 is made also shallower, which contributes to the reduction of the on-resistance.

(d) Since the P well (PW) is formed after the step of forming the field oxide film, the P well does not undergo the effect of the heat treatment upon forming the field oxide film. That is, the P well is not exposed to a high temperature of 1000° C. or higher. Accordingly, the impurity concentration of the P well (PW) can be controlled easily and kept low. Therefore, even when the gate length is shortened for reducing the on-resistance, the breakdown voltage can be ensured sufficiently. Accordingly, the order of the P well forming steps as described above contributes to the reduction of the on-resistance.

(e) As described for the step (4) above, the P well forming step is conducted by ion implantation of two stages. Accordingly, a high temperature annealing for extending diffusion is not required. That is, the annealing in the step (5) above can be used in common. Therefore, the steps can be simplified. Further, with the same reason as that of (d) above, it contributes to the reduction of the on-resistance.

(f) As has been described for the step (2) above, by applying annealing after forming the field oxide film and before forming the well region in the step (3) above, it is possible to decrease crystal defects remained on the surface of the active region in which the MOSFET is formed and ensure the breakdown voltage of the gate oxide film by reducing the thickness of the gate oxide film.

(g) As has been described for the step (10) above, the drain offset region (length) is defined by the mask PR4 and an LDD structure using the side wall is not adopted. That is, a high resistance region such as the drain offset region is not formed on the side of the source region. This can improve the drain breakdown voltage and reduce the on-resistance.

MOSFET Forming Condition

MOSFET forming conditions in Embodiment 1 are to be explained below.

A resistive component of a MOSFET chip in this embodiment is explained with reference to FIG. 30.

Figure 30:
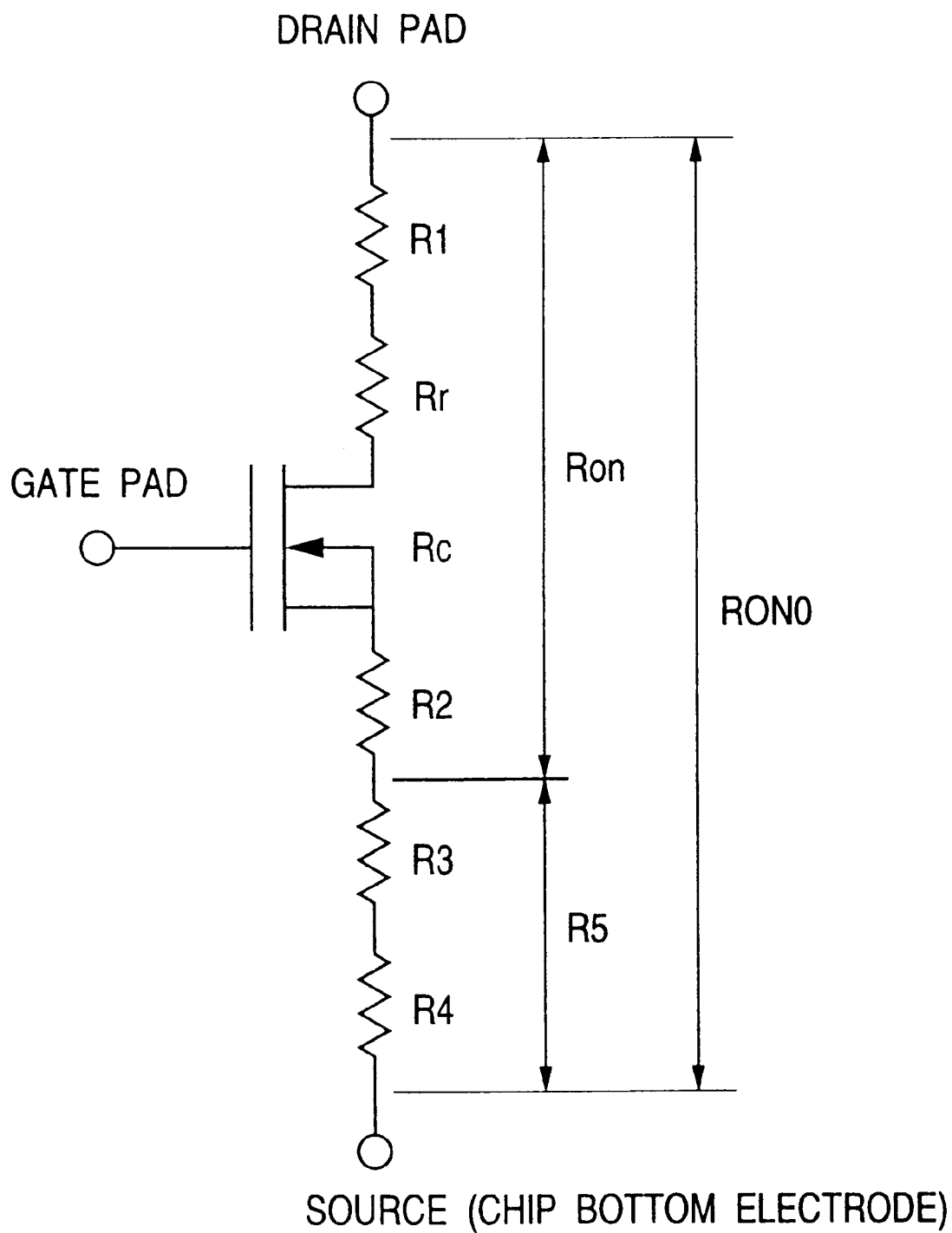
FIG. 30 is an equivalent circuit diagram for a semiconductor device as Embodiment 1 according to this invention.

FIG. 30 is a model for the resistance of MOSFET according to Embodiment 1 shown in FIG. 1 in which RONO is a resistance for the entire chip, Ron is a resistance subtracting the resistance of the P type punch-through layer and the substrate from RONO (resistance when the source is taken out of the surface of the substrate), R1 is a drain wiring resistance, Rr is a resistance in the off set region, Rc is a channel resistance, R2 is a source wiring resistance, R3 is a source punch-through layer resistance, R4 is a resistance for the P type substrate and R5 is a resistance for the sum of R3 and R4.

For explaining the effect of this Embodiment 1, the on-resistance is defined not as RON but as Ron hereinafter for limiting the effect of the MOSFET main body and the electrode on the rearface of the substrate, and Ron·Wg standarized by the gate width Wg is used. Further, based on the same concept, mutual conductance, threshold value voltage and the like are referred to also for the FET performance while taking the source out of the surface of the substrate unless otherwise specified.

The gate length, the gate-oxide thickness and the offset layer for the Embodiment 1 are to be explained.

Figure 31:
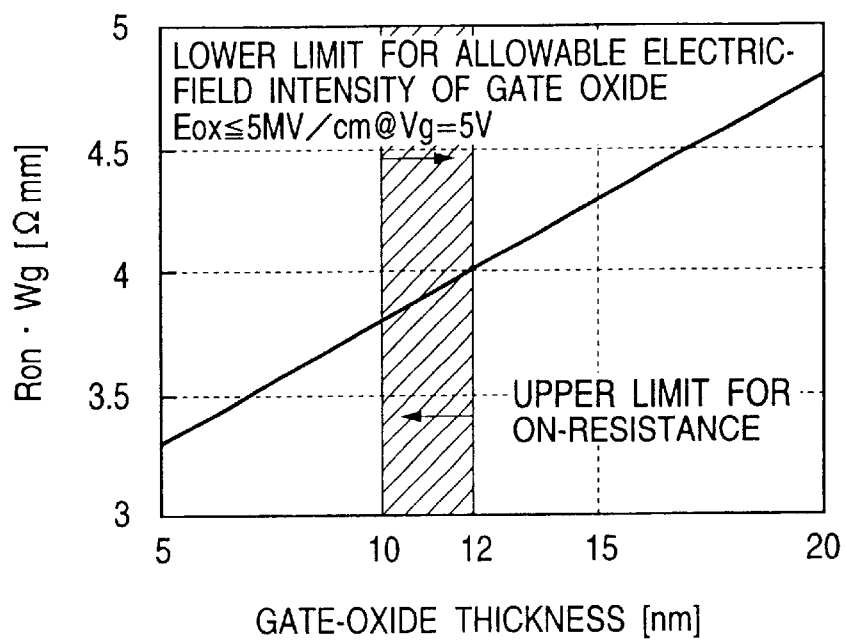
FIG. 31 is a characteristic diagram illustrating a relation between the gate oxide thickness, and the on-resistance and the gate breakdown voltage in the semiconductor device as Embodiment 1 according to this invention.
Figure 32:
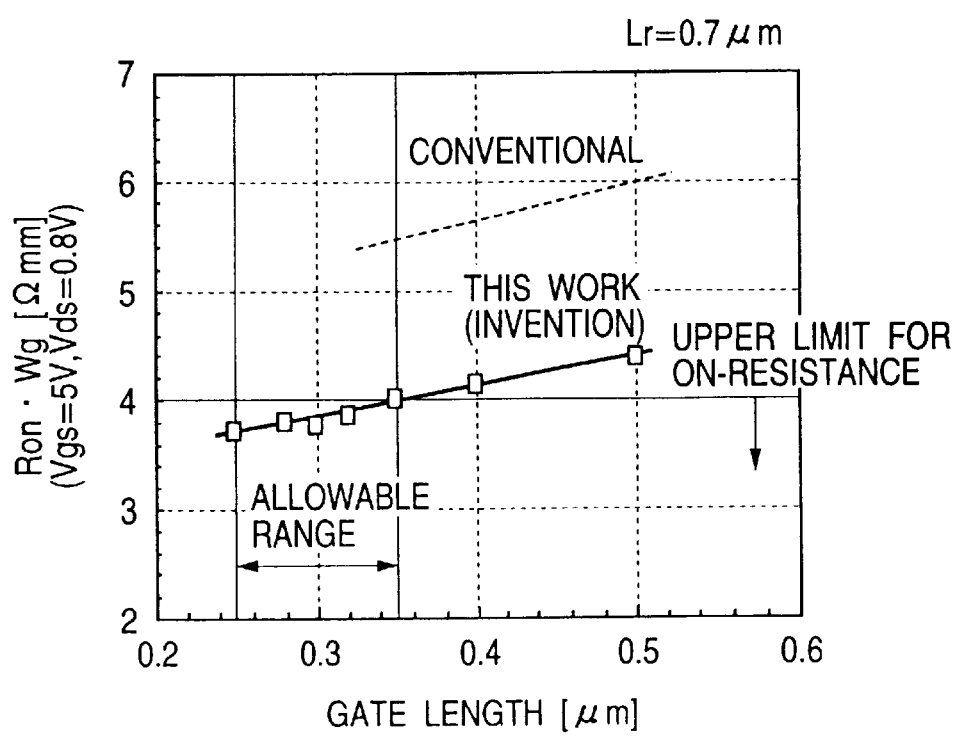
FIG. 32 is a characteristic diagram illustrating a relation between the gate length and the on-resistance in the semiconductor device as Embodiment 1 according to this invention.
Figure 33:
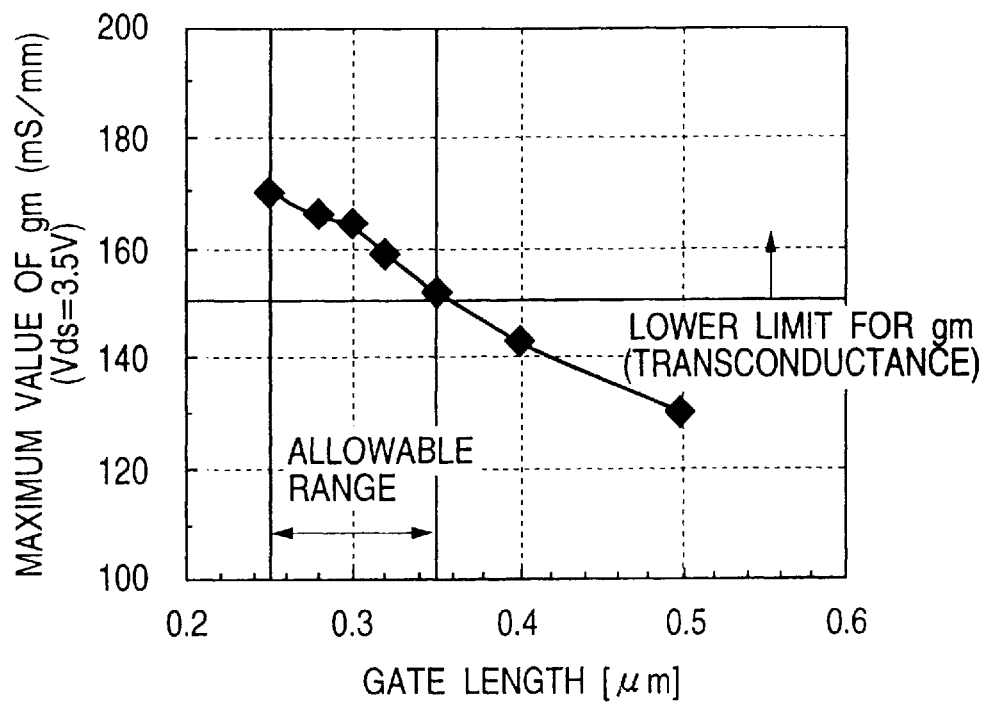
FIG. 33 is a characteristic diagram illustrating a relation between the gate length and the mutual conductance in the semiconductor device as Embodiment 1 according to this invention.
Figure 34:
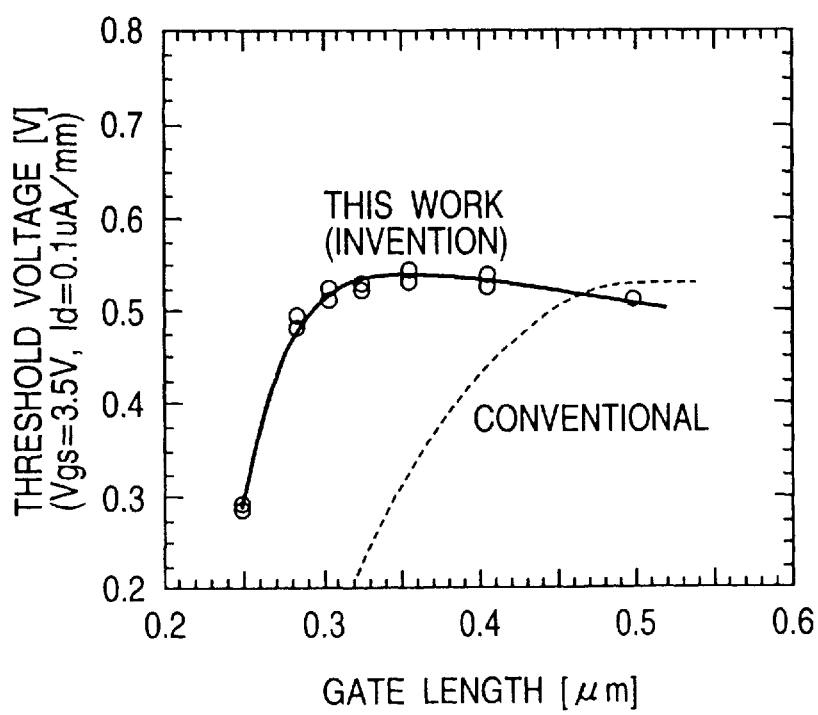
FIG. 34 is a characteristic diagram illustrating a relation between the gate length and the threshold voltage in the semiconductor device as Embodiment 1 according to this invention.
Figure 36:
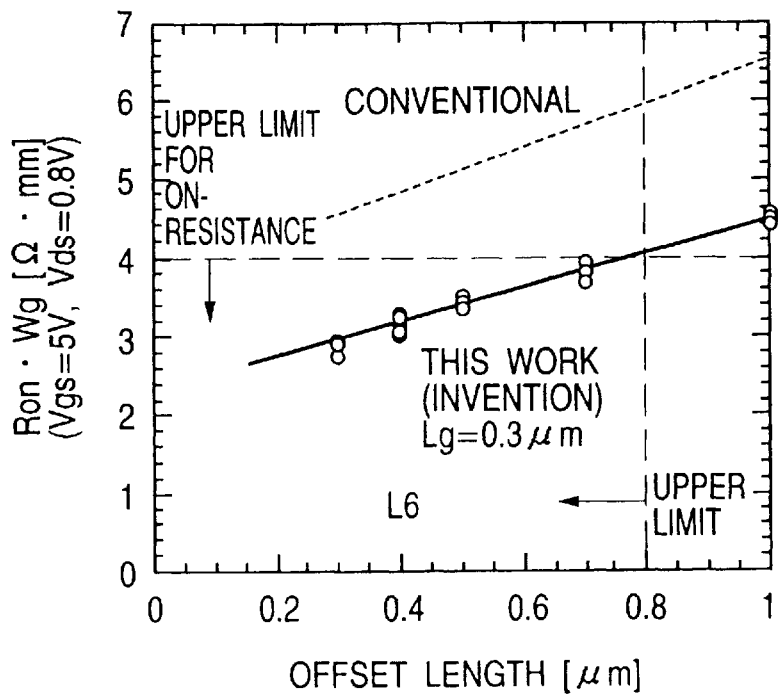
FIG. 36 is a characteristic diagram illustrating a relation between the offset length and the on-resistance in the semiconductor device as Embodiment 1 according to this invention.
Figure 37:
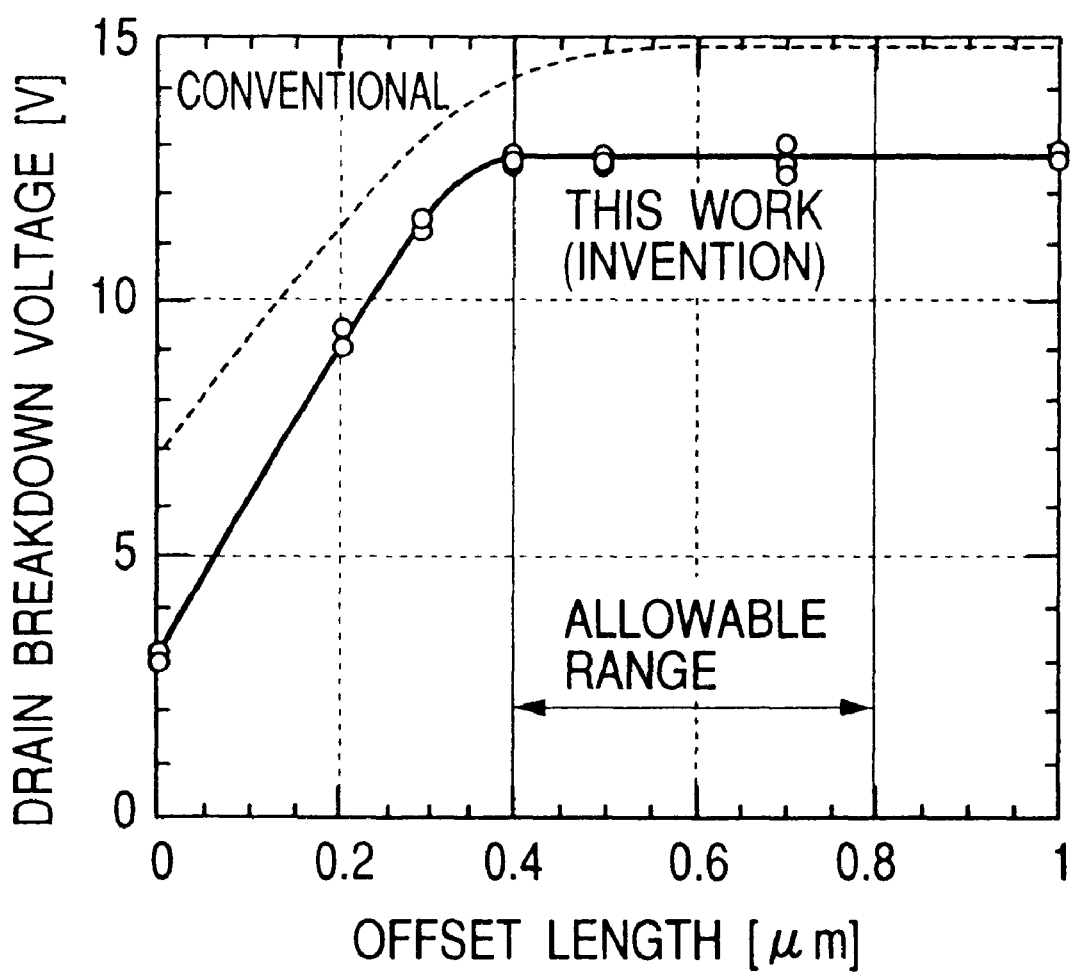
FIG. 37 is a characteristic diagram illustrating a relation between the offset length and the drain breakdown voltage in the semiconductor device as Embodiment 1 according to this invention.

FIG. 31 shows a relation between the gate-oxide thickness and the on resistance while taking the gate breakdown voltage (allowable electric field intensity of gate oxide) into consideration. FIG. 32 shows a relation between the gate length and the on-resistance, FIG. 33 shows a relation between the gate length and the mutual conductance respectively. FIG. 34 shows a relation between the gate length and the threshold voltage. Further, FIG. 35 shows a relation between the depth of the offset layer and the on resistance. FIG. 36 shows the relation between the offset length and the on resistance and FIG. 37 shows the offset length and the drain breakdown voltage, respectively.

FIG. 31, for obtaining a necessary upper limit of 4 Ωmm for the on resistance, it is important that the gate-oxide is thin and, on the other hand, thickness of 10 nm or more with no problem of reliability is required for the maximum value at 5V for the input amplitude in GSM application use. As a result, the gate-oxide thickness is defined as 10 nm or more and 12 nm or less while taking scattering into consideration.

Also in FIG. 32 and FIG. 33, it is intended to reduce the on-resistance and improve the mutual conductance by the shortening of the gate length, and the ON resistance of 4 Ωmm or less and the mutual conductance of 150 mS/mm or more can be obtained at the gate length of 0.35 μm. That is, the length of the gate electrode in the direction of the channel is set at 0.35 μm or less.

The results described above show the case of measurement from the top surface electrode. Further, the existent technique referred to herein means high frequency power MOSFET setting the gate length to 0.4 μm, the off-set length to 0.7 μm and the gate-oxide thickness to 20 nm.

The threshold voltage lowers remarkably with respect to the gate length and the typical value for the gate length is about 0.3 μm as shown in FIG. 34. By the way, in the MOSFET of this embodiment, the threshold voltage shows a reverse short-channel characteristic by applying a low temperature treatment (heat treatment at 1200° C. or lower) for the entire process, and lowering of the threshold voltage is suppressed as far as the short gate length compared with the conventional structure with no reverse short channel characteristic.

As shown in FIG. 35, depth of 0.2 μm or more showing less resistance change is set for the offset region (offset layer) and, as seen in FIG. 36 and FIG. 37, the designed value for the offset length is set as 0.4 μm or more and 0.8 μm or less. The length is chosen because the drain breakdown voltage is determined on the side of the drain low resistance layer, and parasitic bipolar operation less occurs in this region and the on-resistance is at a sufficiently low value.

Figure 38:
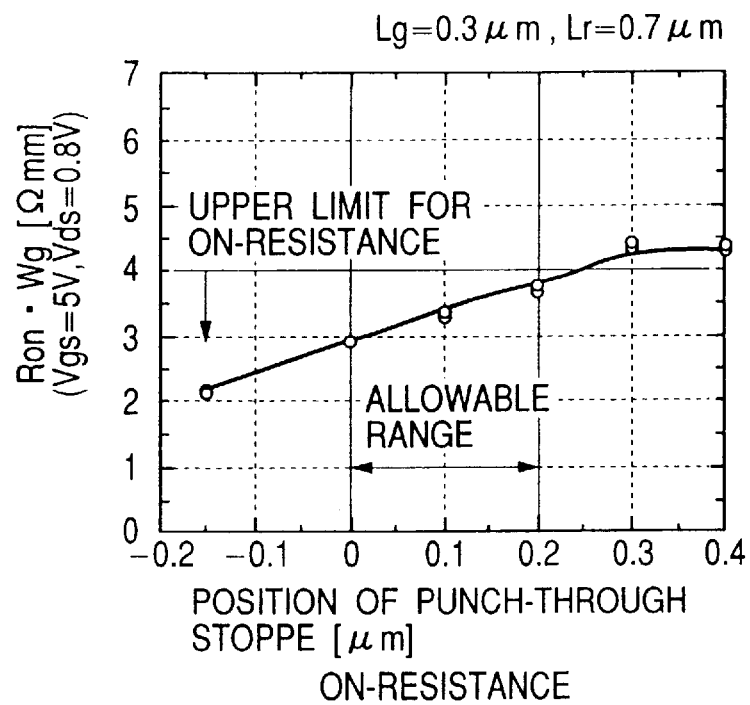
FIG. 38 is a characteristic diagram illustrating a relation between the position of the punch-through stopper layer and the on-resistance in the semiconductor device as Embodiment 1 according to this invention.
Figure 39:
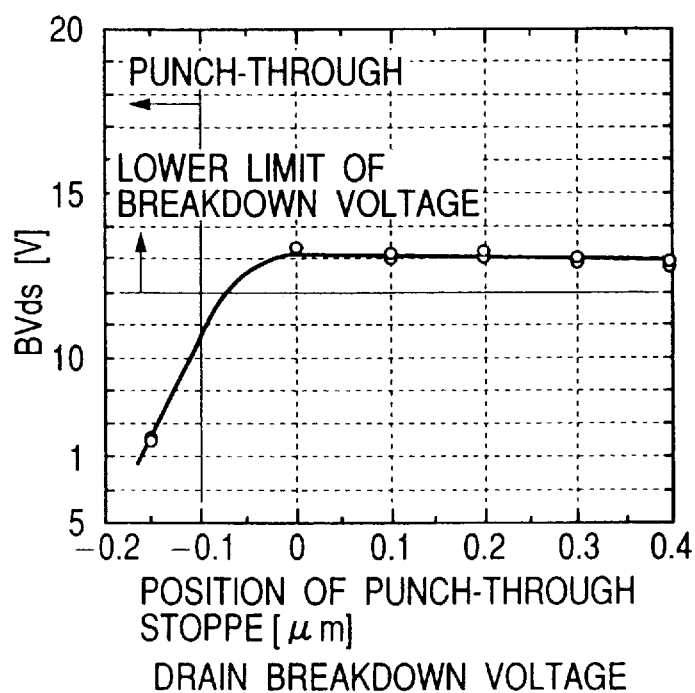
FIG. 39 is a characteristic diagram illustrating a relation between the position of the punch-through stopper layer and the drain breakdown voltage in the semiconductor device as Embodiment 1 according to this invention.

FIG. 38 shows a relation between the punch-through stopper layer (P type well region 5 shown in FIG. 1) and the on-resistance in Embodiment 1 and FIG. 39 shows a relation between the drain breakdown voltage and the position for the punch-through stopper layer, respectively. The distance toward the drain is defined as (+) and toward the source side as (−) with the position at the drain end of the gate electrode as a reference (0). While the on-resistance lowers by displacing the punch-through stopper toward the source, the breakdown voltage lowers toward the negative area around 0 as a boundary. This is because punch-through occurs between the drain and the source and, in view of the relation described above, the position for the punch-through stopper is preferably from 0 or more and 0.2 μm or less.

Then, the substrate forming conditions for MOSFET according to this embodiment is to be explained below.

Figure 40:
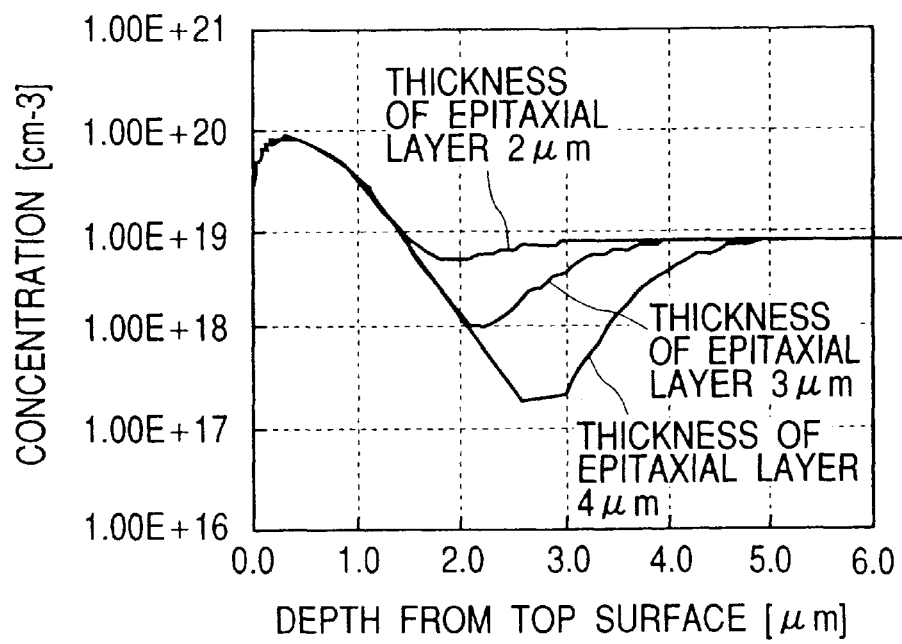
FIG. 40 is a chart for the distribution concentration of impurities in a portion taken along line B–B' in the semiconductor device shown in FIG. 1.
Figure 41:
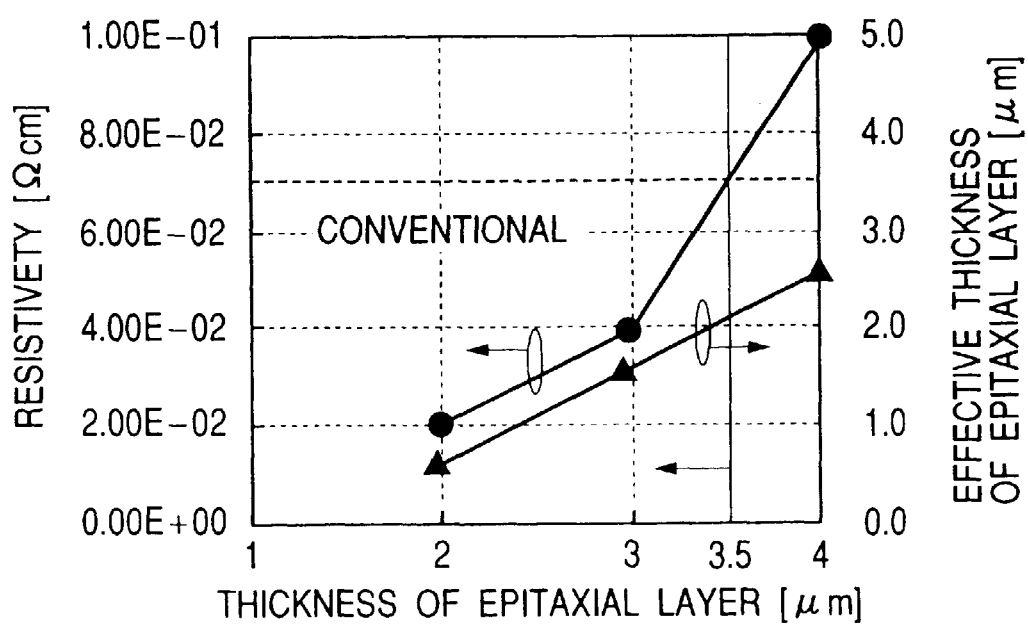
FIG. 41 is a characteristic diagram illustrating the dependence of the substrate punch-through layer on the resistivity in the epitaxy layer thickness of the semiconductor device as Embodiment 1 according to this invention.
Figure 48:
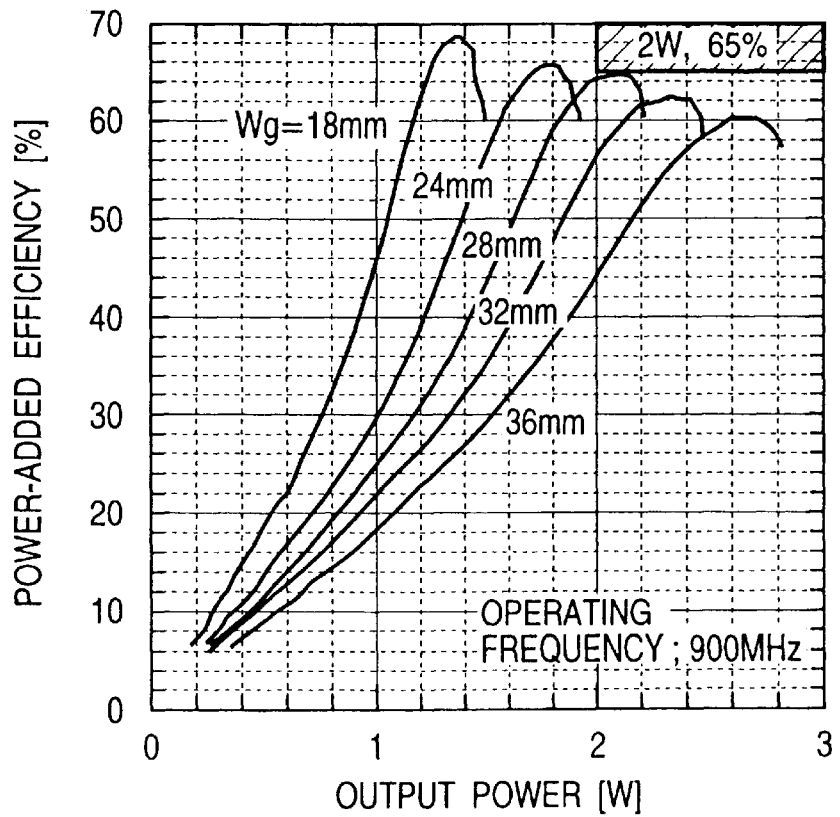
FIG. 48 shows RF characteristics (gate width Wg dependence) of the semiconductor device as Embodiment 1 according to this invention.

FIG. 40 shows the impurity concentration distribution along the direction of the depth near the punch-through layer (B–B') plane in FIG. 1) when the epitaxy layer thickness is changed and FIG. 41 shows the resistivity of the punch-through layer when the thickness of the epitaxy layer is changed, respectively. Further, FIG. 42 shows the impurity concentration distribution near the offset layer (C–C' plane in FIG. 1) and FIG. 48 shows the epitaxy layer thickness and the (drain) breakdown voltage near.

In FIG. 40 and FIG. 41, the epitaxy layer is not in contiguous with the punch-through layer at the thickness of the layer of 4 μm, and the thickness has to be 3.5 μm or less.

Figure 42:
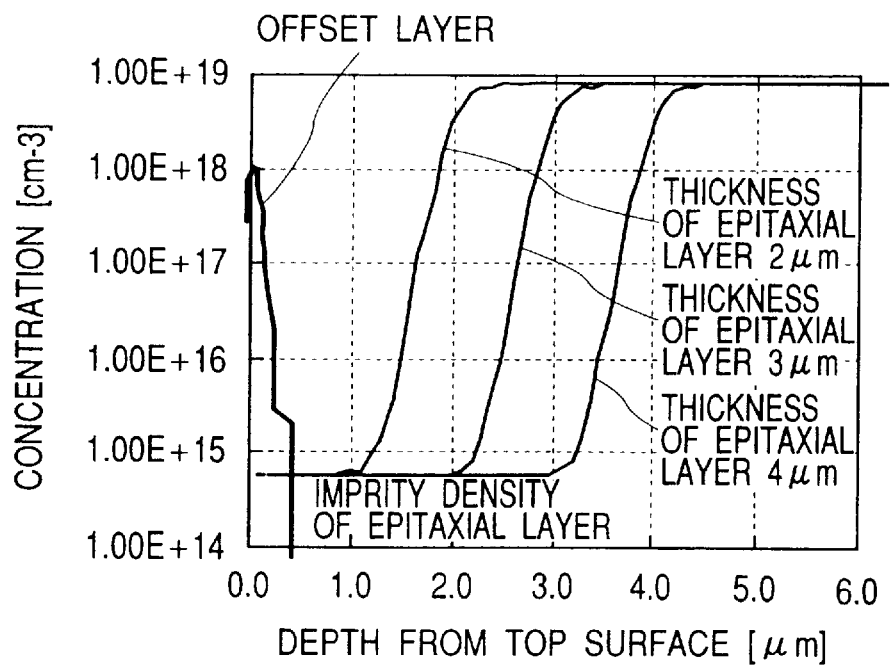
FIG. 42 is a chart for the distribution of concentration of impurities in a portion taken along line C–C' in the semiconductor device shown in FIG. 1.
Figure 43:
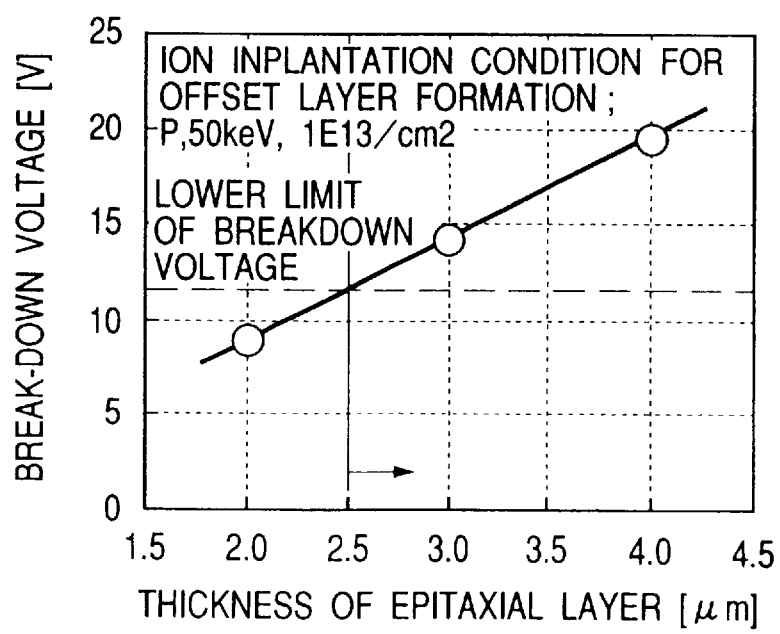
FIG. 43 is a characteristic diagram illustrating a relation between the epitaxy layer thickness and the breakdown voltage in the semiconductor device as Embodiment 1 according to this invention.

Further, in FIG. 42 and FIG. 43, the breakdown voltage with the drain N type layer has a necessary and sufficient value at the thickness of the epitaxy layer of 2.5 μm or more. In view of the above, the thickness of the high resistance layer (epitaxy layer) formed on the low resistance semiconductor substrate is appropriately from 2.5 μm or more to 3.5 μm or less.

Figure 44:
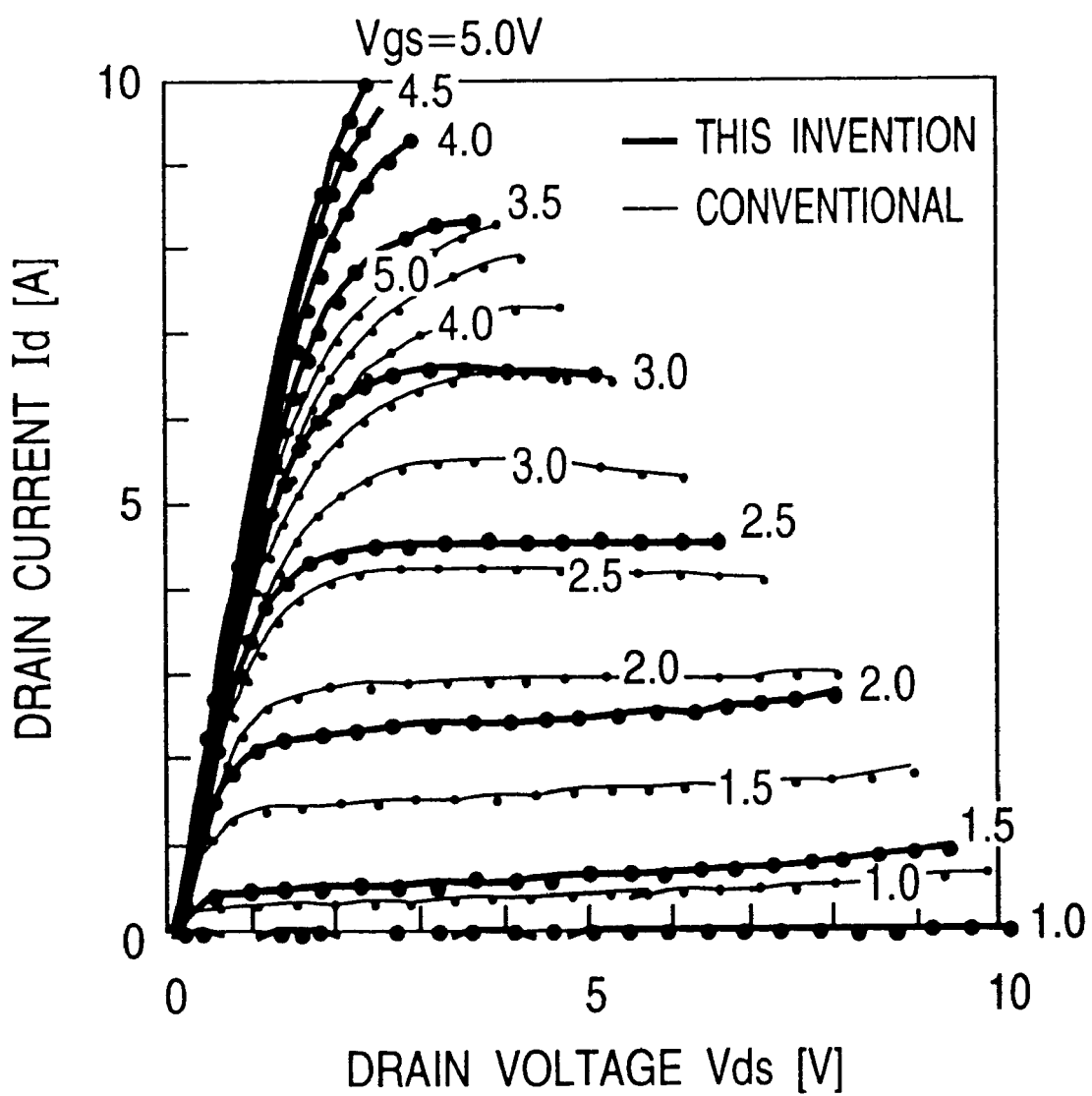
FIG. 44 is a current-voltage-characteristic diagram in the semiconductor device as Embodiment 1 according to this invention.

FIG. 44 shows comparison for the static characteristics between this invention and the existent MOSFET with the gate electrode of 0.4 μm. Both of the devices has the gate width of 36 mm, and the on-resistance, the mutual conductance, the saturated current and the like have been remarkably improved according to this invention.

Figure 47:
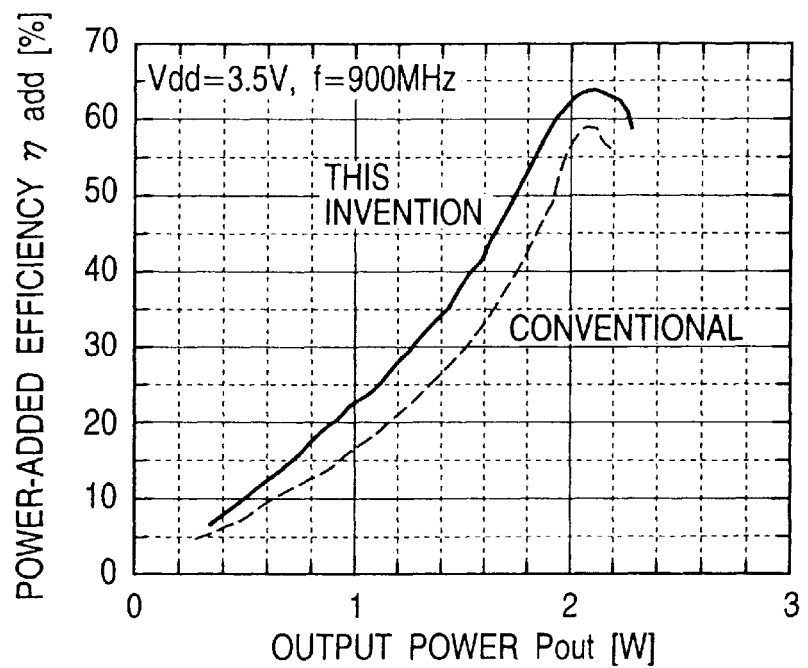
FIG. 47 shows RF characteristics of the semiconductor device as Embodiment 1 according to this invention.

Then, FIG. 47 shows a large signal high frequency characteristics of MOSFET chip (this invention) of Embodiment 1. FIG. 47 shows a relation between the output power and the power-added efficiency, on the premise of application to GSM, in a case of inputting a sinusoidal signal at 900 MHz while setting a power source voltage to 3.5V and keeping the bias current content. This invention and the existent technique are compared, in which the gate width is 28 mm in the former and 36 mm in the latter. In both of the devices, tuning is conducted at the output such that the power-added efficiency reaches a peak at the output power of 2.0 W. As can be seen from the figure, the peak efficiency is improved by about 5% in this invention compared with the conventional art and the efficiency of 65% has been attained.

Then, FIG. 48 shows the gate width dependence of the large signal high frequency characteristic of the chip according to this invention. While the characteristics shown in FIG. 48 are measured in the same manner as the characteristics shown in FIG. 47 described above, optimal tuning is applied for obtaining efficiency on every gate width. It can be seen from FIG. 48 that an optimal gate width for obtaining a power-added efficiency of 65% or higher at 2W is about 28 mm. Similar performance can also be obtained with the gate width from 24 mm to 30 mm. In the same manner, when considering the application to PCS and as a result of evaluating the large signal characteristics at 1900 MHz, a power-added efficiency of about 55% at an output power of 1 W could be realized with a gate width of 12 mm.

Constitution of Amplifier

Figure 49:
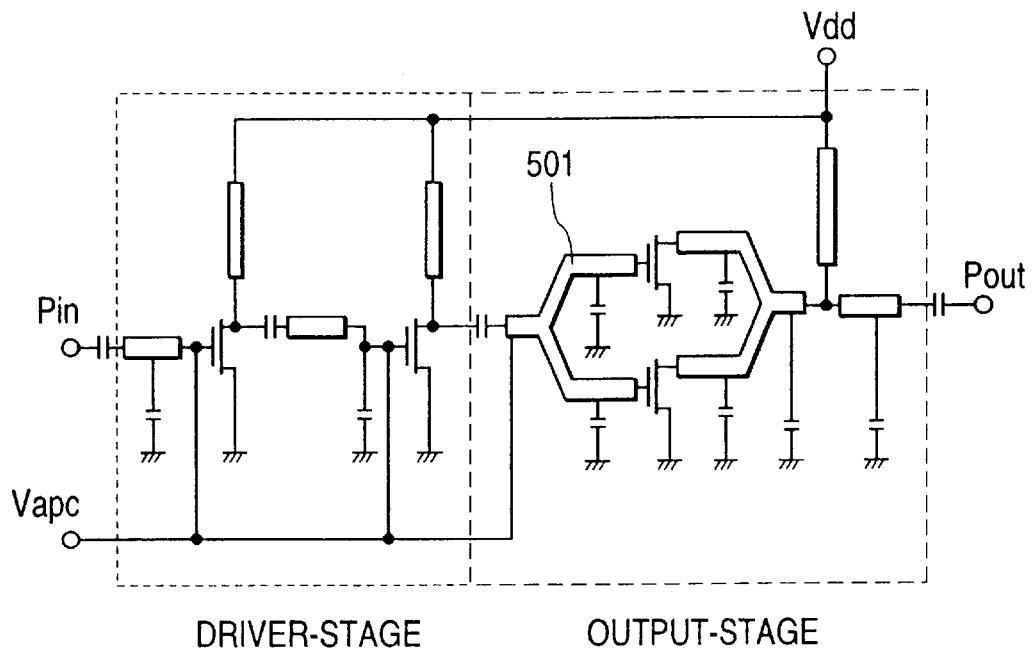
FIG. 49 is an equivalent circuit diagram for an RF power module using the semiconductor device as Embodiment 1 according to this invention.

FIG. 49 shows a circuit structure of an amplifier using MOSFET according to this embodiment. The amplifier shown in FIG. 49 is a three stage amplifier applied to GSM in which one MOSFET (1 chip) is used for each of the input stage and the driver stage. Then, two MOSFETs (2 chips) are used for the output stage, to constitute a DD-CIMA (divided and collectively impedance matched amplifier). The gate width (Wg) of MOSFET is 6 mm for the input stage, 18 mm for the driver stage and 28 mm for the output stage (2 chips). Input/output matching is conducted with a strip line 100 and a chip capacitor for each of the devices and designed so as to obtain the output power efficiently. It is adapted such that a bias voltage for controlling the operation point is applied by resistance division to the input for each of the stages and the output power is controlled by controlling the voltage.

The DD-CIMA is a method developed as a countermeasure for the characteristics that the output voltage is saturated as the gate width is made larger, for taking parallel impedance matching while arranging two devices (chips) in parallel as the output stage of a module requiring high power (literature 2). According to this circuit technique, an output power about twice as high as the output power that can be obtained from one device can be obtained. Further, it is excellent in the heat dissipation by the division of the chip.

Figure 50:
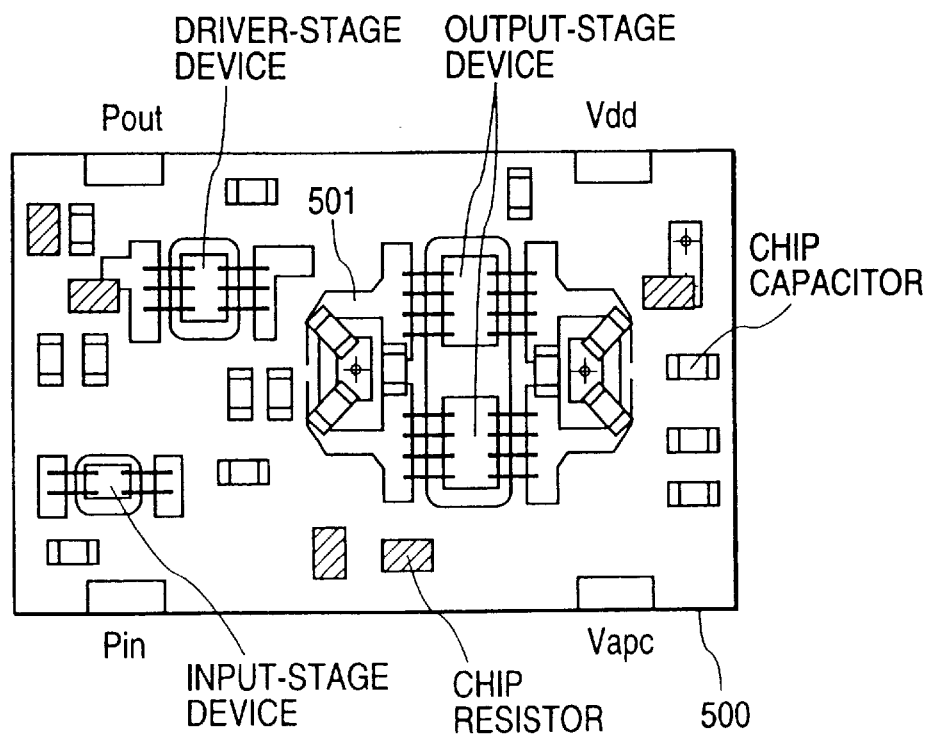
FIG. 50 is a plan view illustrating a layout of an RF power module using the semiconductor device as Embodiment 1 according to this invention.

FIG. 50 shows a package module in which this amplifier is incorporated into a package. 500 represents a laminate type ceramic package of a multi-layered wiring structure. Microstrip lines 501 are formed by metal plating on the surface of the package 500. This module attains an overall efficiency of about 55% at a saturated output power of 4 W and a power of 3.5 W under the conditions at a frequency of 900 MHz, a power source voltage of 3.5 V and an input power of 0 dBm.

In this embodiment, discrete parts such as MOSFET, capacitors and resistors are incorporated as a module but the technique of this invention is also applicable to a circuit in which they are entirely or partially integrated.

Further, it is not always necessary that devices of an identical structure are used for each of the stages of the three stage amplifier circuit. For example, since high gain is required for the initial stage, driver stage devices of a short gate length or short offset length may sometimes be used.

Embodiment 2

Other embodiments of this invention are to be explained with reference to FIG. 51 to FIG. 56.

Cross Sectional Structure of Basic Cell

Figure 51:
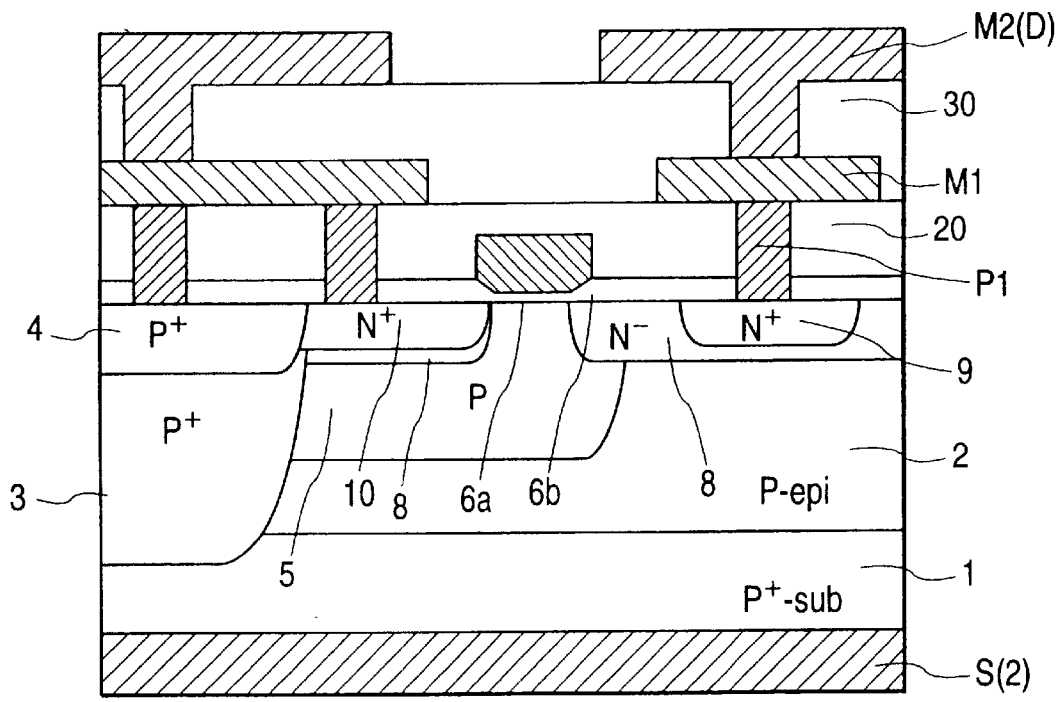
FIG. 51 is a cross sectional view of a semiconductor device as Embodiment 2 according to this invention.
Figure 52:
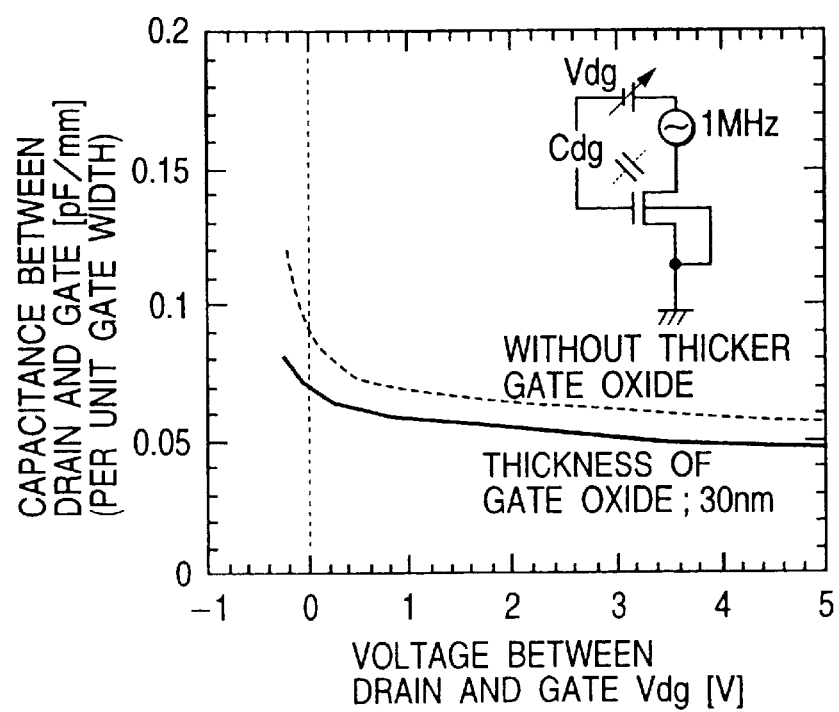
FIG. 52 is a characteristic diagram illustrating the voltage dependence of the drain-gate capacitance of the semiconductor device as Embodiment 2 according to this invention.
Figure 53:
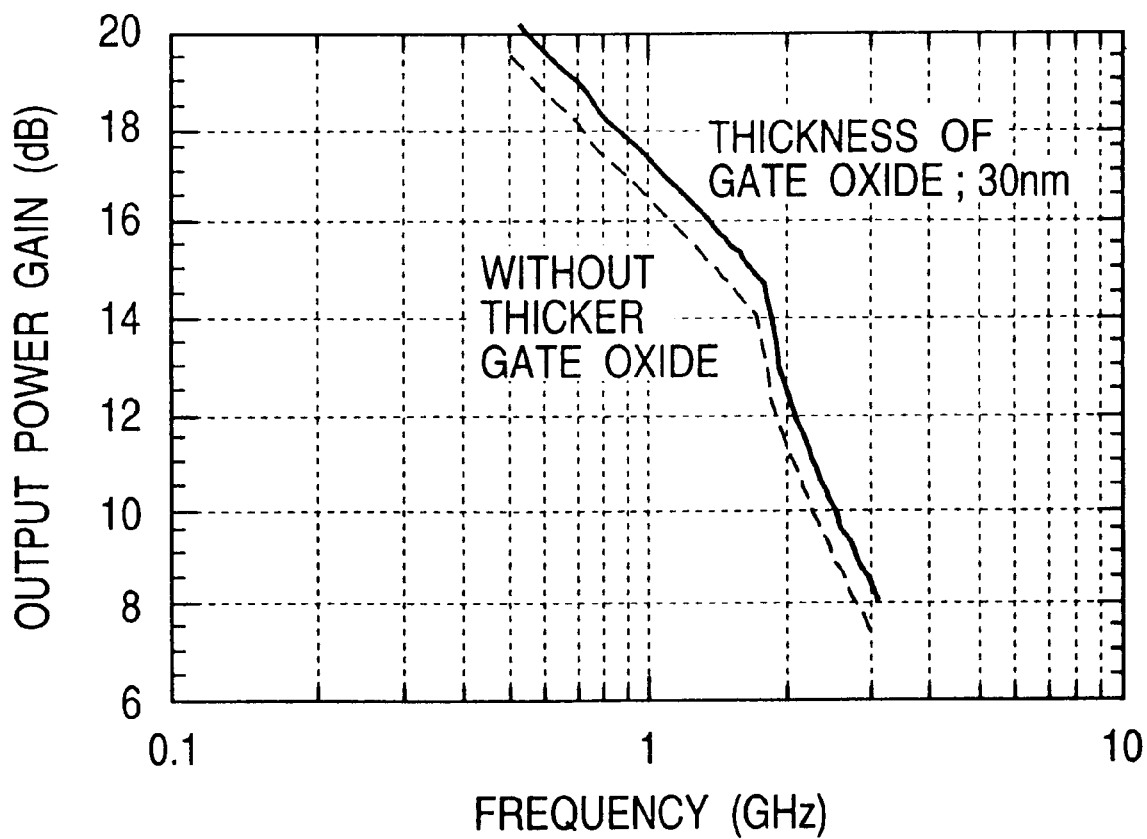
FIG. 53 is a characteristic diagram illustrating a relation between the signal gain and the frequency of the semiconductor device as Embodiment 2 according to this invention.

FIG. 51 is a cross sectional view of a structure in which the oxide thickness is increased on both ends of the gate electrode in Embodiment 1, that is, MOSFET in Embodiment 2 having a gate bird's beak. FIG. 52 shows the voltage dependence of the capacitance between the gate and the drain in Embodiment 2. FIG. 53 shows a relation between the signal gain of a small level and the frequency.

In FIG. 51, the oxide thickness on both ends of the gate has a tapered form with the maximum thickness of 30 nm relative to the thickness of the gate oxide film of 10 nm (or the bird's beak obtained by selective oxidation LOCOS).

That is, a semiconductor device according to Embodiment 2 comprise a semiconductor substrate of a first conduction type, a semiconductor layer of a first conduction type situated to one main surface of the substrate and having an impurity concentration lower than that of the semiconductor substrate, a first region and a second region of a second conduction type opposite to the first conduction type disposed being space apart from each other in the main surface of the semiconductor layer, a third region disposed between the first region and the second region in the main surface of the semiconductor layer, situated being spaced apart from the first region and in contact with the second region and having an impurity concentration lower than that of the first region, a gate electrode disposed by way of a gate insulation film on the main surface of the semiconductor layer and situated between the first region and the third region, so as to overlap at a portion thereof on the first region and the third region, respectively, a first electrode and a second electrode connected, respectively, with the first region and the second region, a third electrode connected with the other main surface opposite to one main surface of the semiconductor substrate, in which the first film thickness (6a) of the gate insulation film present between overlap of the third region and the gate electrode is greater than the second film thickness (6b) of the gate insulation film on the main surface of the semiconductor layer situated between the first region and the third region.

Thus, as shown in FIG. 52, capacitance between the gate and the drain (Cdg) can be reduced by about 20% under the condition of the thickness from 10 nm to 30 nm. The measuring method is as per the circuit constitution shown in FIG. 52. Reduction in the capacitance between the gate and the drain (Cdg) can reduce the feedback capacitance (Crss) desired for the RF operation at high gain.

Further, as shown in FIG. 53, the small signal gain is also improved by about 0.5 dB near the frequency at 900 MHz.

According to Embodiment 2, electric field intensity can be moderated by disposing the bird's beak. Then, within 0.005 μm depth of the offset from the surface of the offset layer 8, it is possible to attain a peak value for the impurity concentration at the surface of $1 \times 10^{-19}/cm^3$ or more and further reduce the on-resistance.

In Embodiment 2, the oxide thickness of the gate electrode on both sides of the drain and the source is increased but the purpose can be attained by increasing the thickness only on the side of the drain. The embodiment for this constitution is to be explained later.

Process

Succeeding to the step (9) for Embodiment 1 (refer to FIG. 12), the following steps are conducted.

Figure 54:
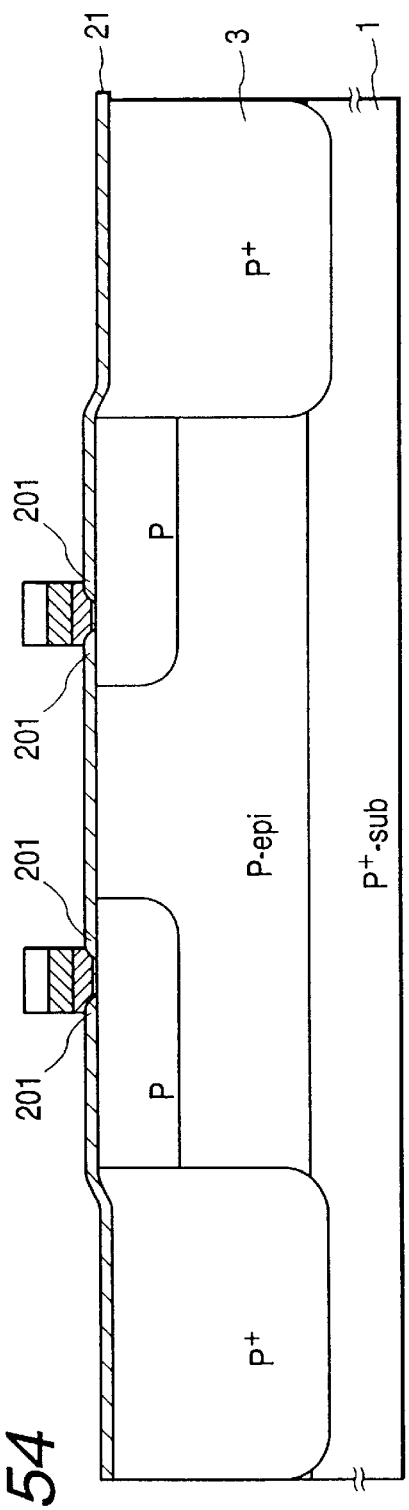
FIG. 54 is a cross sectional view for a main portion during manufacturing steps of the semiconductor device as Embodiment 2 according to this invention.

(9-1) As shown in FIG. 54, an oxide film 21 is formed selectively by thermal oxidation. In this step, bird's beak is formed at the end of the gate electrode. That is, an oxide film (maximum thickness: 30 nm) of a thickness greater than the gate oxide film (10 nm thickness) is formed below the gate electrode end.

Figure 55:
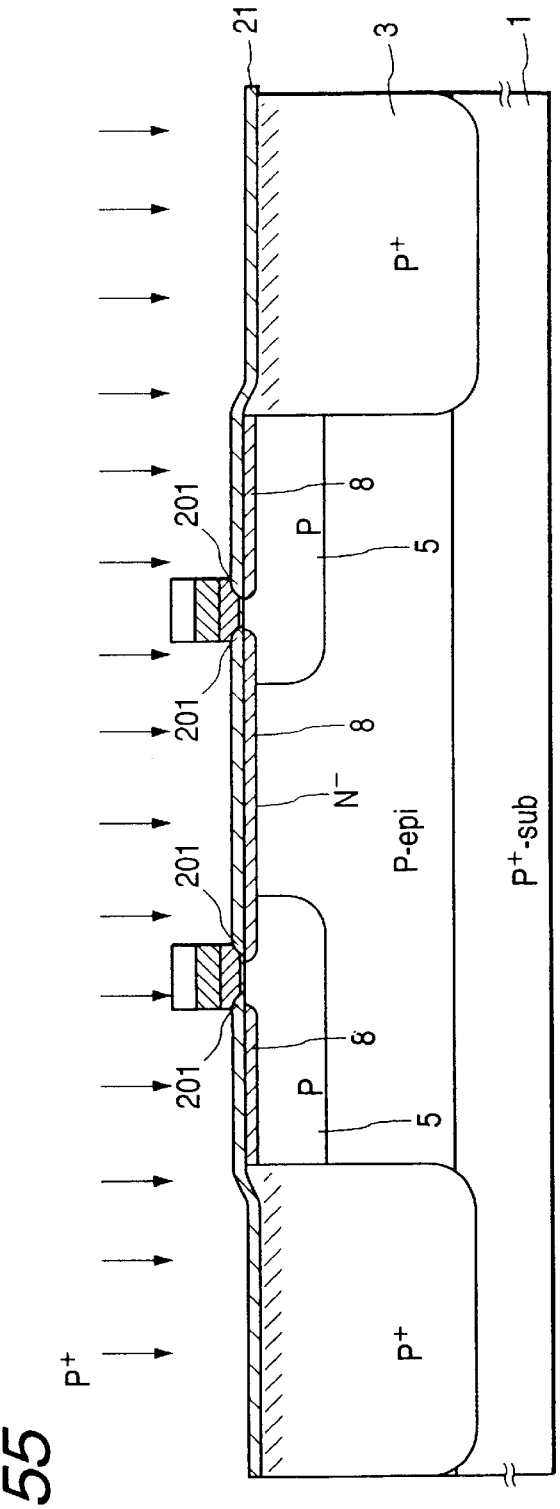
FIG. 55 is a cross sectional view for a main portion during manufacturing steps of the semiconductor device succeeding to FIG. 54.
Figure 56:
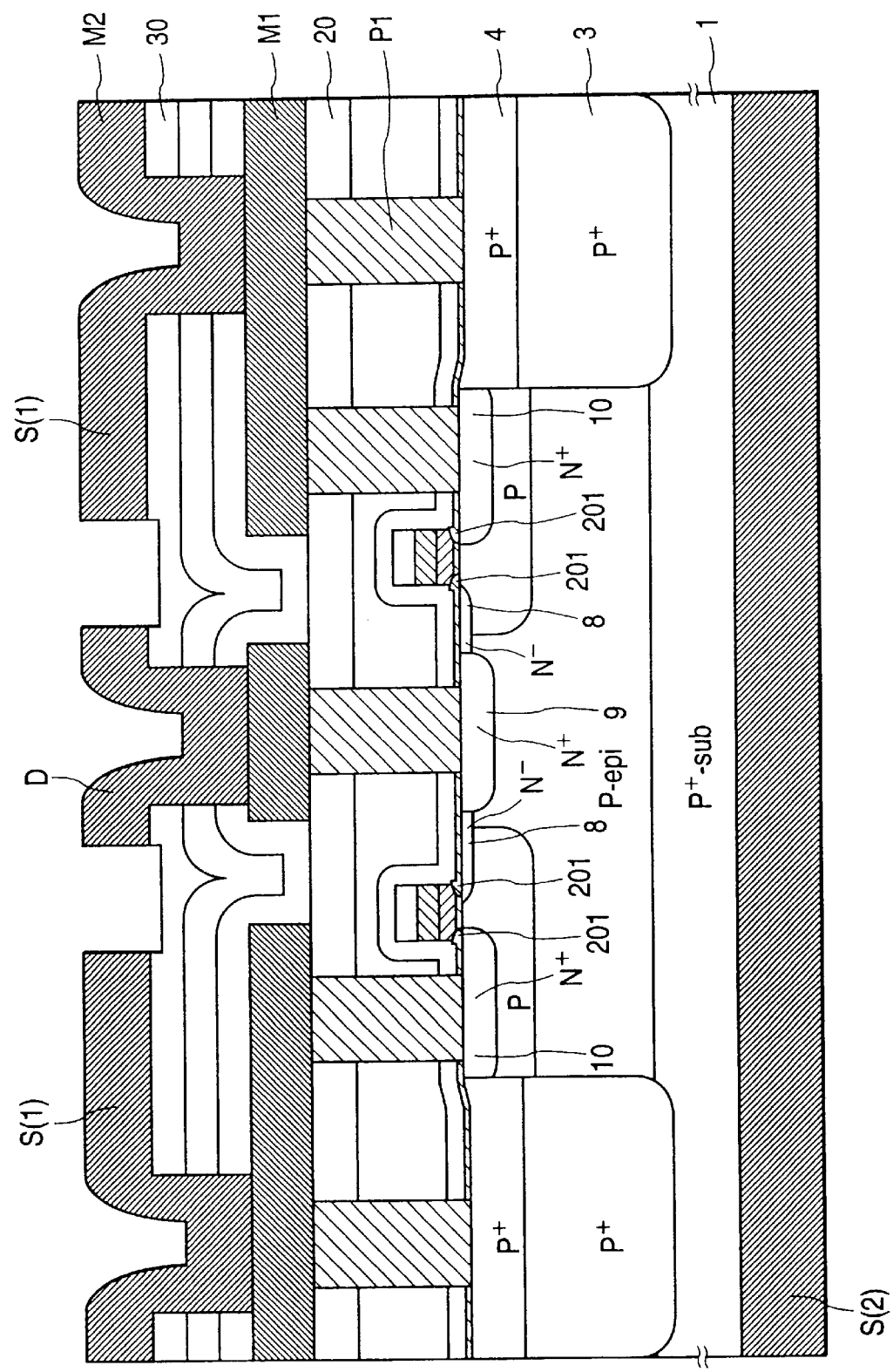
FIG. 56 is a cross sectional view for a main portion of a completed semiconductor device as Embodiment 2 according to this invention.

(9-2) Successively, as shown in FIG. 55, impurities are introduced through the silicon oxide film 21 for forming a drain offset region. That is, a low impurity semiconductor region (drain offset region) 8 is formed in self-alignment to the gate electrode 7 in the P well region 5 by ion implantation. Phosphorous as the N type impurity is used for ion implantation for forming an offset region 8.

Successively, the process: from the source drain region forming step (11) to the source rearface electrode forming step (20) described for Embodiment 1 are conducted.

By the method described above, a power MOSFET shown in FIG. 56 is completed.

Embodiment 3

Other embodiment of this invention is to be explained with reference to FIG. 54 to FIG. 60.

Cross Sectional Structure of Basic Cell

Figure 60:
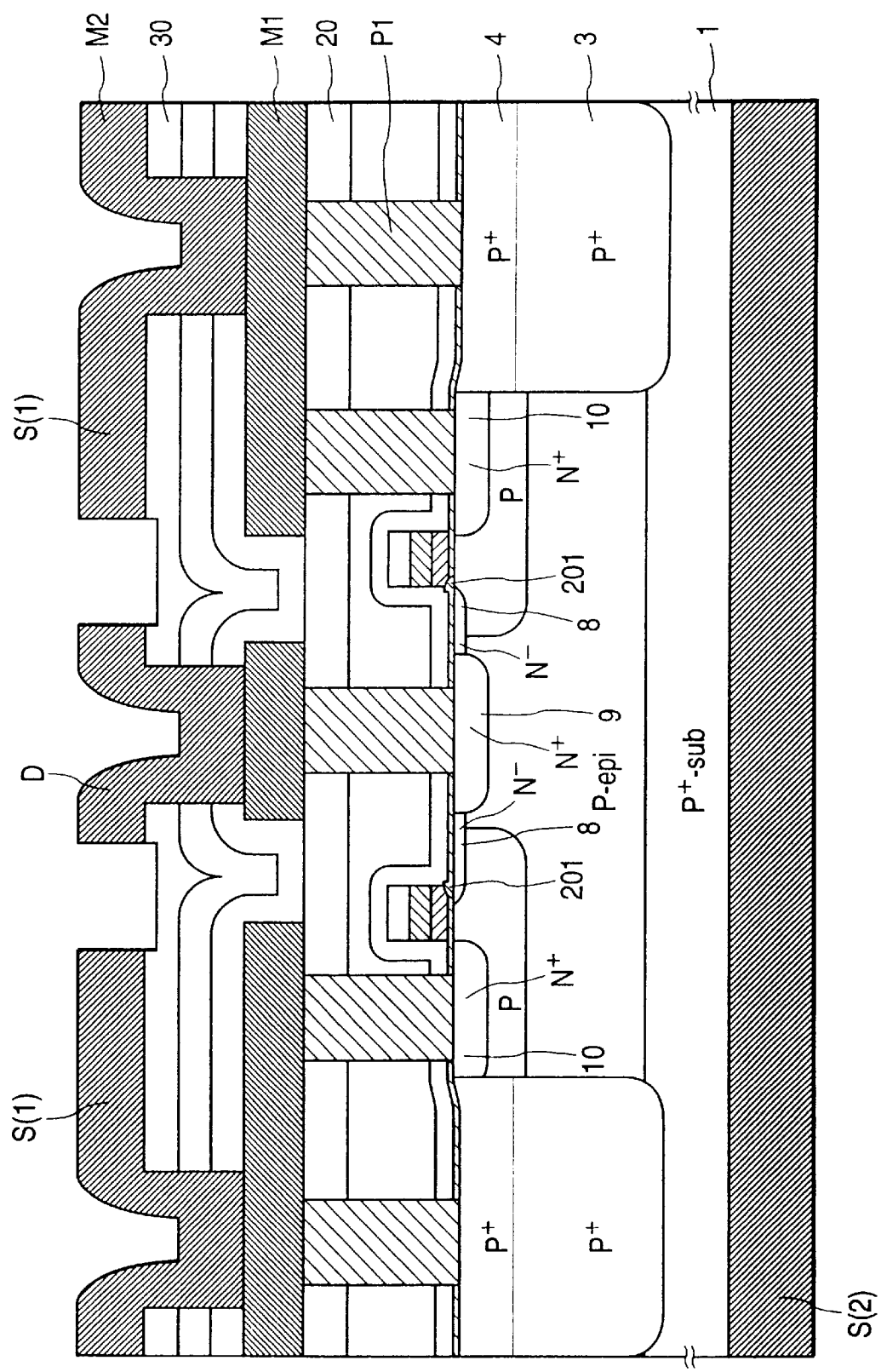
FIG. 60 is a cross sectional view for a main portion of a completed semiconductor device as Embodiment 3 according to this invention.

Embodiment 3 is a modification of Embodiment 2 in which the thickness for a portion of the gate oxide film of the gate electrode on the side of the drain is increased (refer to FIG. 60).

Process

Succeeding to the step (9) of Embodiment 1 (refer to FIG. 12), the following steps are conducted.

Figure 57:
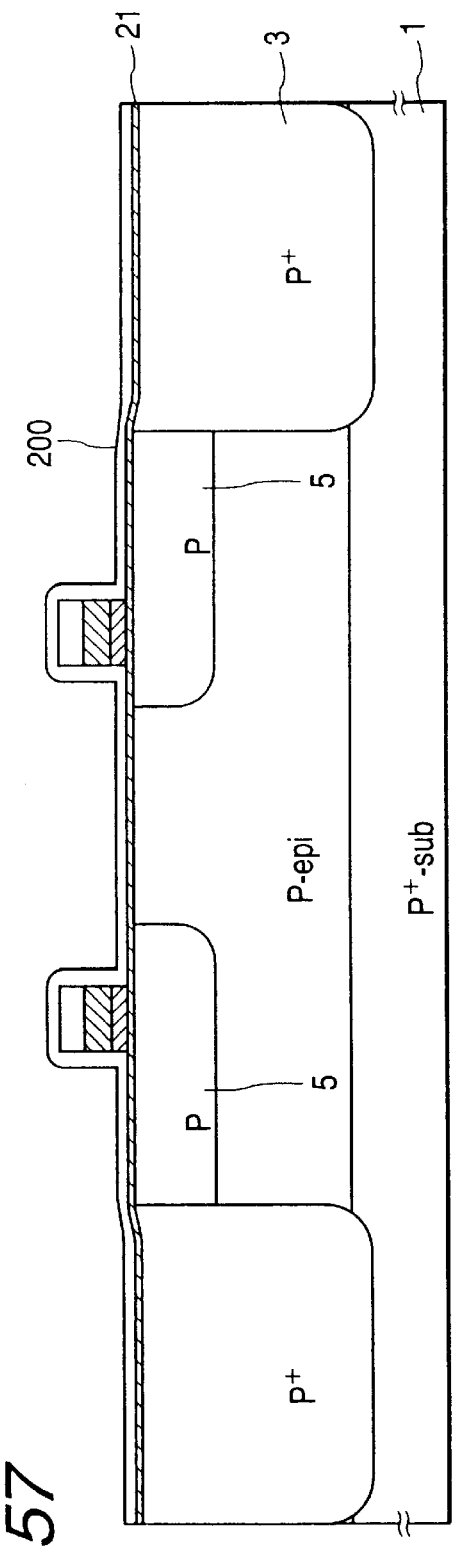
FIG. 57 is a cross sectional view for a main portion during manufacturing steps of the semiconductor device as Embodiment 3 according to this invention.

(9-1) As shown in FIG. 57, a silicon nitride film 200 is formed on a semiconductor substrate 1.

Figure 58:
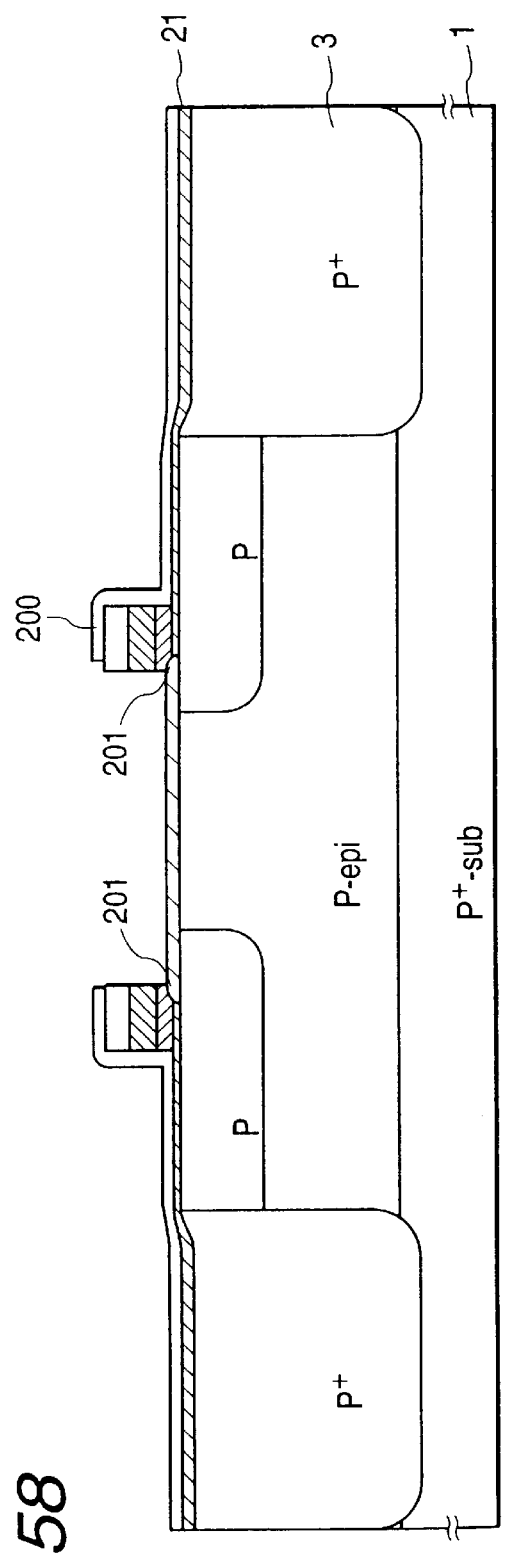
FIG. 58 is a cross sectional view for a main portion during manufacturing steps of the semiconductor device succeeding to FIG. 57.

(9-2) Successively, as shown in FIG. 58, the silicon nitride film 200 is selectively removed so as to expose the end of the gate electrode on the side of the drain. Then, the gate bird's beak is formed only on the side of the drain by thermal oxidation using the silicon nitride film 200 as a mask.

Figure 59:
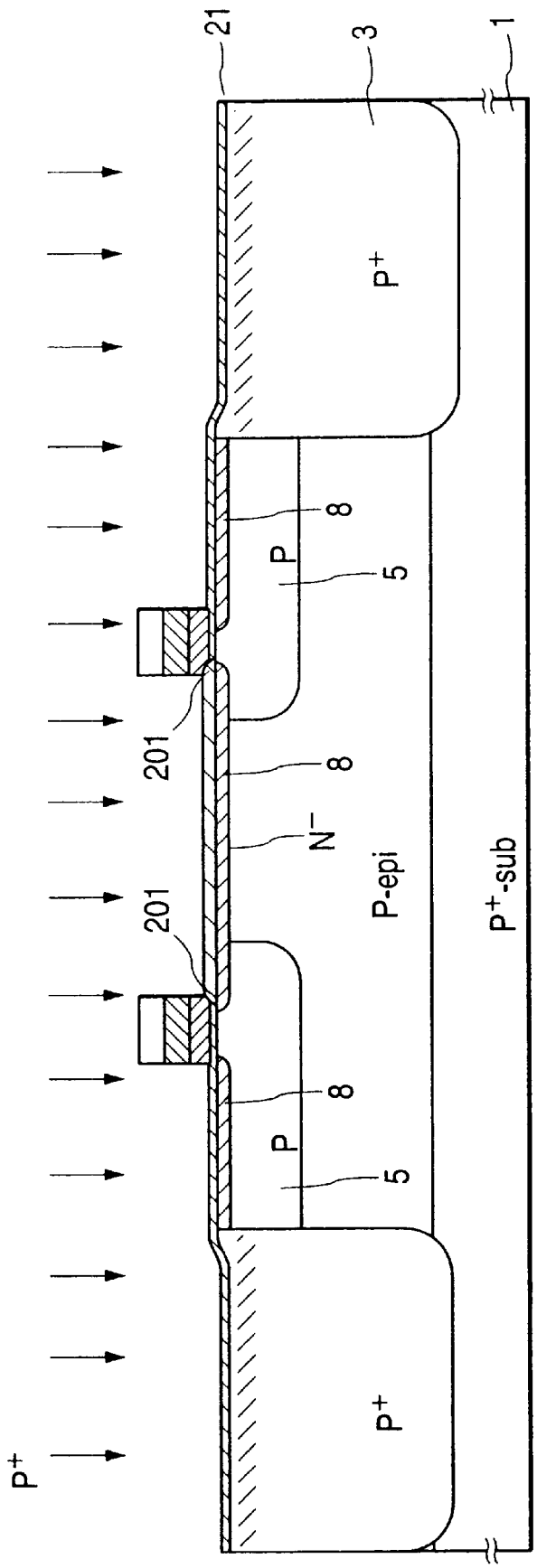
FIG. 59 is a cross sectional view for a main portion during manufacturing steps of the semiconductor device succeeding to FIG. 58.

(9-3) Successively, as shown in FIG. 59, impurities are introduced through a silicon oxide film 21 for forming a drain-offset region. That is, a low impurity semiconductor region (drain-offset region) 8 is formed in self alignment to a gate electrode 7 into a P type well region 5 by ion implantation.

Successively, the process from the step (11) to the step (20) in Embodiment 1 is conducted.

By the method described above, a power MOSFET shown in FIG. 60 is completed.

Embodiment 4

Embodiment 4 of this invention is to be explained with reference to FIG. 61.

Embodiment 4 provides an N gate MOS in which a drain offset region 8 is formed only to the drain region 9.

Figure 61:
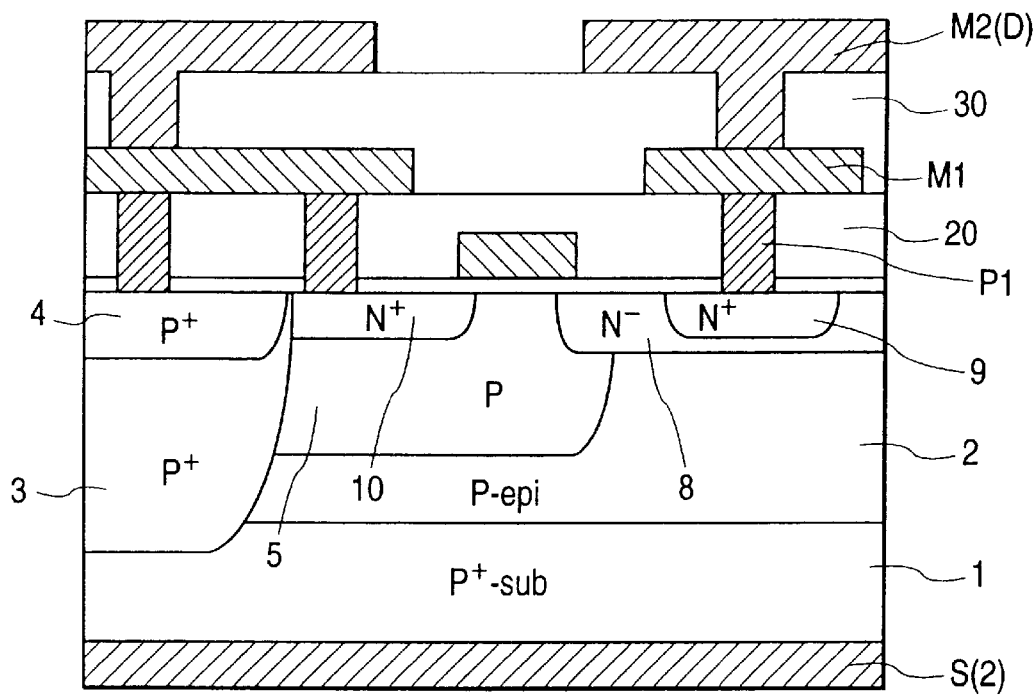
FIG. 61 is a cross sectional view for a main portion of a semiconductor device as Embodiment 4 according to this invention.

According to Embodiment 4, as shown in FIG. 61, a deep N type high resistance region like that a drain offset region 8 is not disposed on the side of the source (N type source region 10 of high impurity concentration). Accordingly, the amount of overlap between the gate electrode on the side of the source and the N type region (source region 10) is smaller compared with a case where the drain offset region 8 is present on the side of the source as in Embodiment 1, to provide an effect for improving the short channel characteristic.

In the process of Embodiment 4, according to the process of Embodiment 1, ion implantation is conducted at the stage of the step (10) for forming the drain offset region 8 only on the side of the drain by using a mask. In this case, photolithographic step is increased by one compared with Embodiment 1.

Embodiment 5

Embodiment 5 according to this invention is to be explained with reference to FIG. 62 and FIG. 63.

Figure 62:
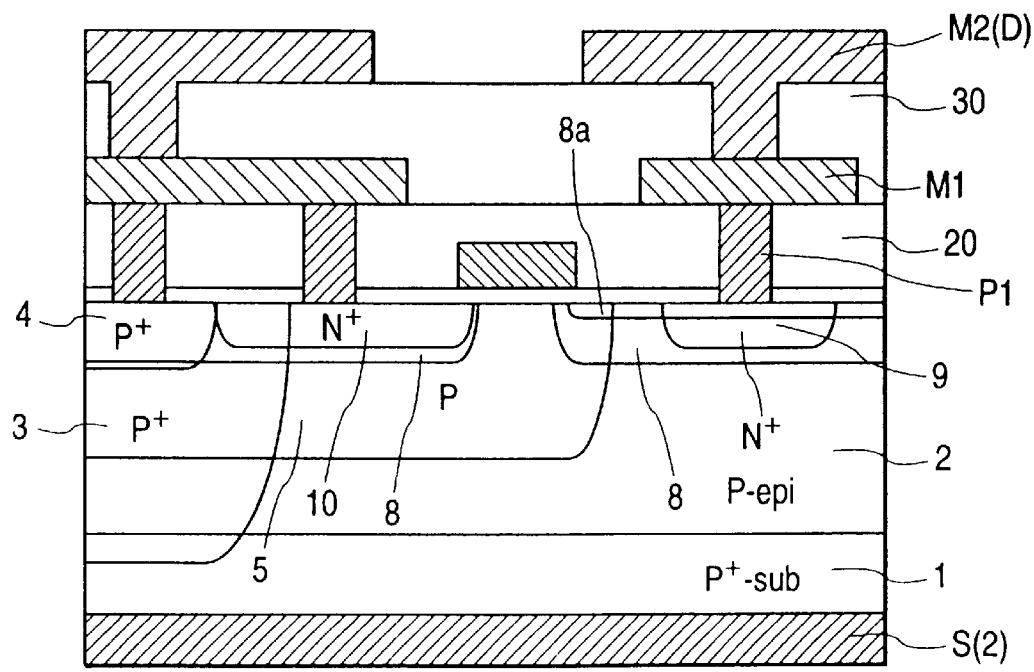
FIG. 62 is a cross sectional view for a main portion of a semiconductor device as Embodiment 5 according to this invention.
Figure 63:
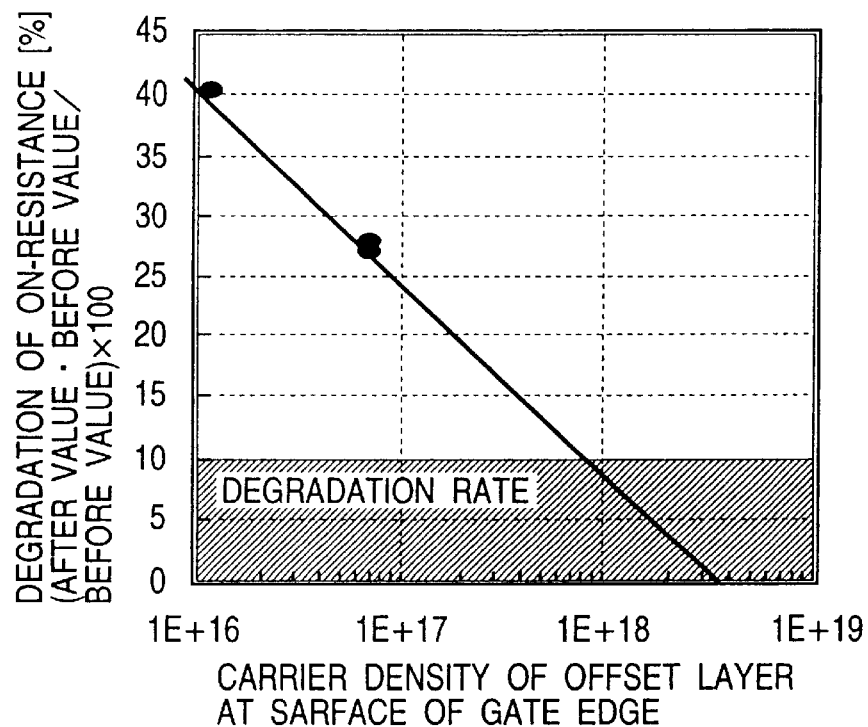
FIG. 63 illustrates a relation between the impurity concentration at the surface of the offset layer and the degradation of the on-resistance in the semiconductor device as Embodiment 5 according to this invention.

FIG. 62 is a cross sectional view in a case where the impurity concentration near the surface of the drain offset region is increased. This structure is effective for decreasing the degradation rate for the on-resistance under the effect of hot electrons implanted into the oxide film on the offset region. After ion implantation for forming the offset region 8 shown in FIG. 1, As (arsenic) ions are implanted to the surface of the offset region 8 under conditions of the ion implantation about at 20 KeV and $3\times10^{13}$ atoms/cm$^2$ to form a second offset region 8a. In this step, the surface impurity concentration at the gate end is most important. That is, FIG. 63 shows a relation between the degradation rate of the on-resistance with the hot electrons and the impurity concentration at the surface of the gate end of the offset layer. About 26% of degradation is caused with no particular countermeasure, but the degradation can be reduced to 10% or less by increasing the surface impurity concentration to $1\times10^{18}$ atoms/cm$^3$ in accordance with this structure. This is because the N type offset layer less undergoes the effect of electrons implanted to the oxide film by the increase in the surface impurity concentration.

In the method of manufacturing Embodiment 5 according to this invention, ion implantation for forming the offset region 8 and ion implantation for forming the offset region 8a are successively conducted at the forming step (10) for the drain-offset region in Embodiment 1 described previously.

Embodiment 6

Embodiment 6 of this invention is to be explained with reference to FIG. 64.

Figure 64:
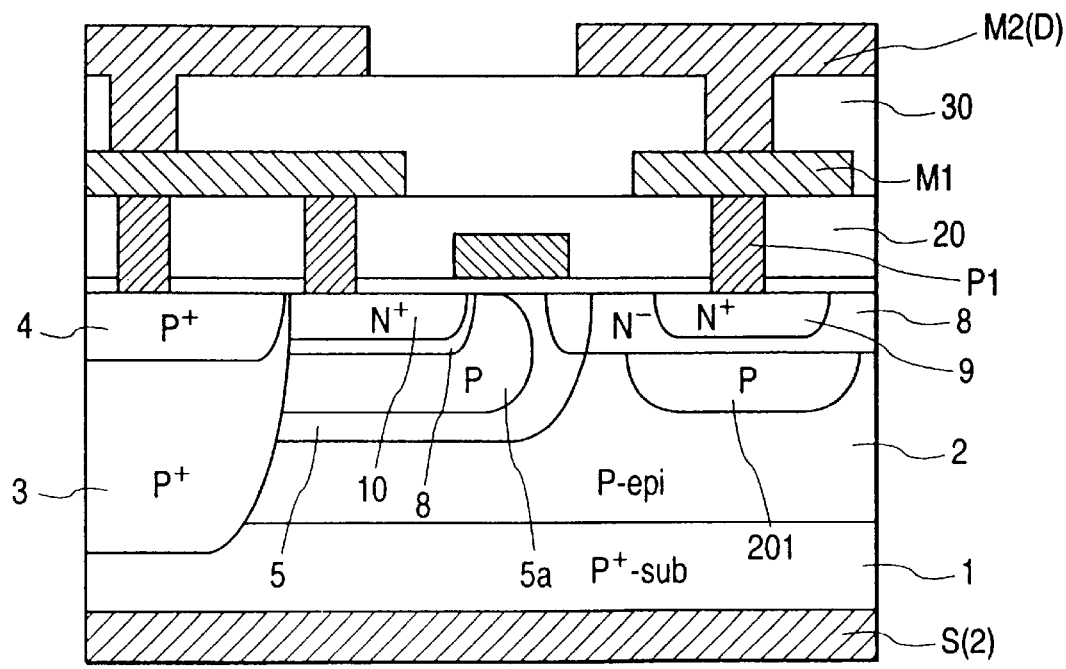
FIG. 64 is a cross sectional view for a main portion of a semiconductor device as Embodiment 6 according to this invention.

In FIG. 64, a P type pocket layer 5a having an impurity concentration higher than the impurity concentration of the epitaxy layer 2 is disposed at a position deeper than the offset region 8 in addition to the punch-through stopper 5 of Embodiment 1. It has a P type layer 201 below the N type drain region below an N type drain region 9 formed simultaneously with the pocket layer 5a. The pocket layer 5a and the P type layer 201 below the drain region 9 are formed by oblique implantation of B (boron), for example, by using a photoresist upon forming the N type source drain region. The pocket layer 5a is effective for suppressing the lowering of the threshold voltage. Further, a P type layer 201 below the drain region 9 has an effect of spacing the breakdown point of MOSFET from the channel portion.

Accordingly, Embodiment 6 can enhance the short channel characteristic and improve the destruction strength of the device.

Embodiment 7

Embodiment 7 according to this invention is to be explained with reference to FIG. 65 and FIG. 66.

Figure 65:
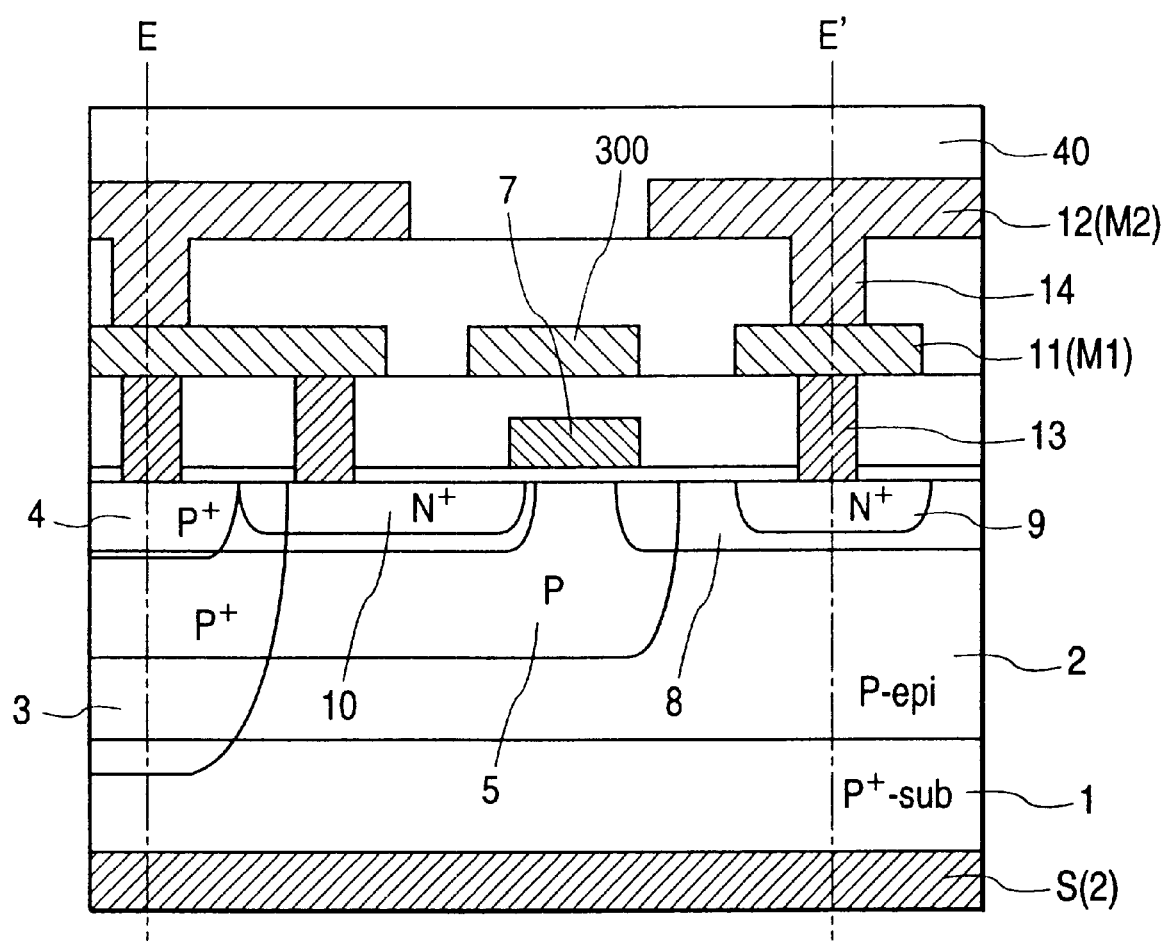
FIG. 65 is a cross sectional view for a main portion of a semiconductor device as Embodiment 7 according to this invention.
Figure 66:
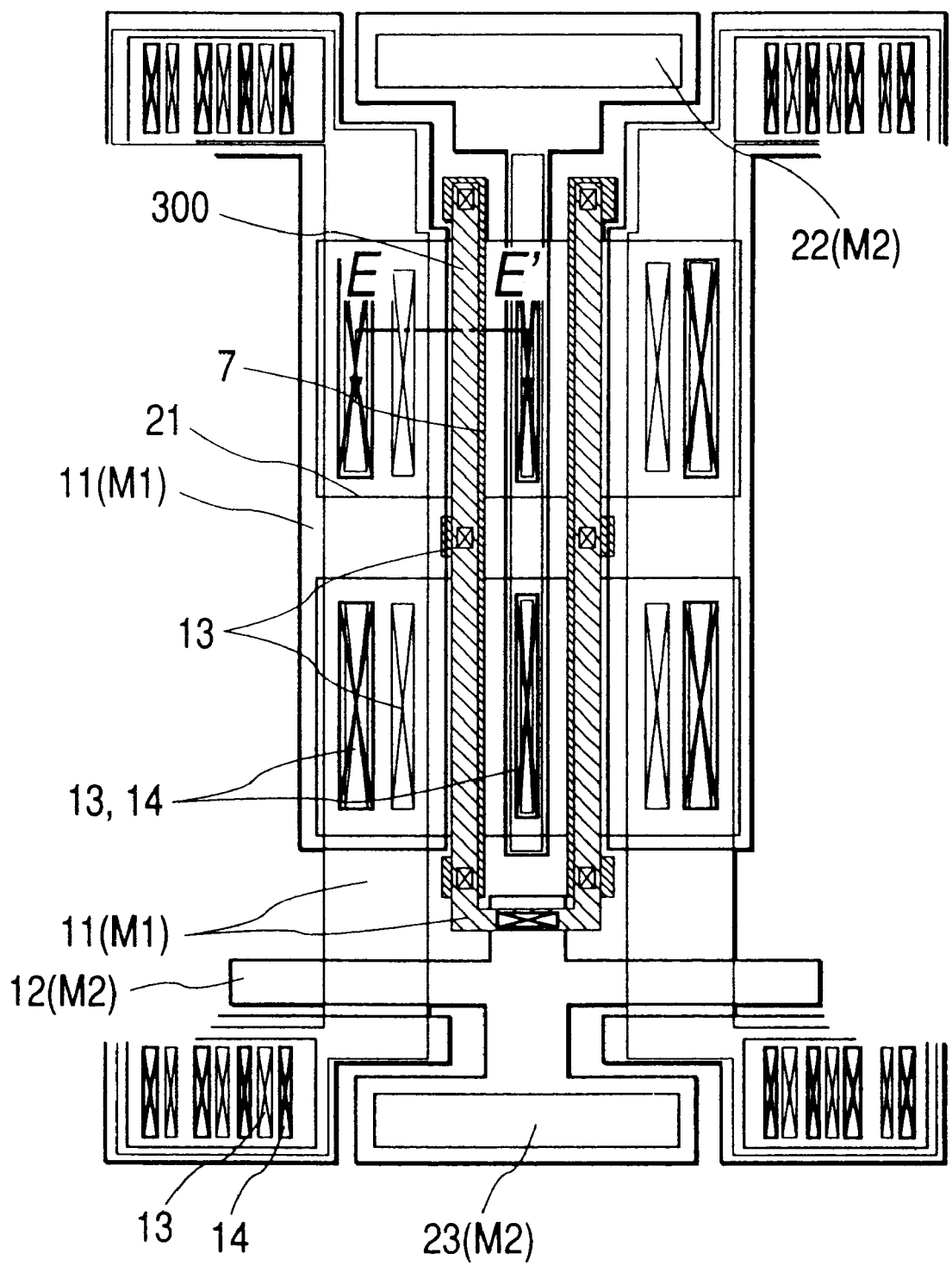
FIG. 66 is a plan view for a main portion of a semiconductor device as Embodiment 7 according to this invention.

FIG. 65 and FIG. 66 show a cross sectional view and a block plan view of a power MOSFET in which gate wirings (first layer wirings) are disposed in parallel with a gate electrode respectively. FIG. 65 is a cross sectional view taken along line E–E' shown in FIG. 66. According to Embodiment 1 described previously, the first layer wiring 11 (M1) connected with the gate electrode is disposed in perpendicular to the gate electrode being extended to the periphery of the unit block. According to Embodiment 7, the gate wiring (first layer wiring) is disposed in parallel with the gate electrode and backed by the gate electrode.

In FIG. 65, 300 is a first layer wiring for gate shunt disposed for reducing the resistance of the gate wiring. As the feature of Embodiment 6, since the drain first layer wiring and the gate wiring are opposed to each other, the parasitic wiring capacitance between the drain and the gate increases but, since the number of the gate wirings is identical with the number of gate electrodes and the number of gate wirings is increased compared with that in Embodiment 1, this has an effect of reducing the resistance in the gate wiring. This embodiment is applied to a case where the gate resistance is more effective than the capacitance between the drain and gate for the high frequency characteristic.

Embodiment 8

Embodiment 8 according to this invention is to be explained with reference to FIG. 67.

Figure 67:
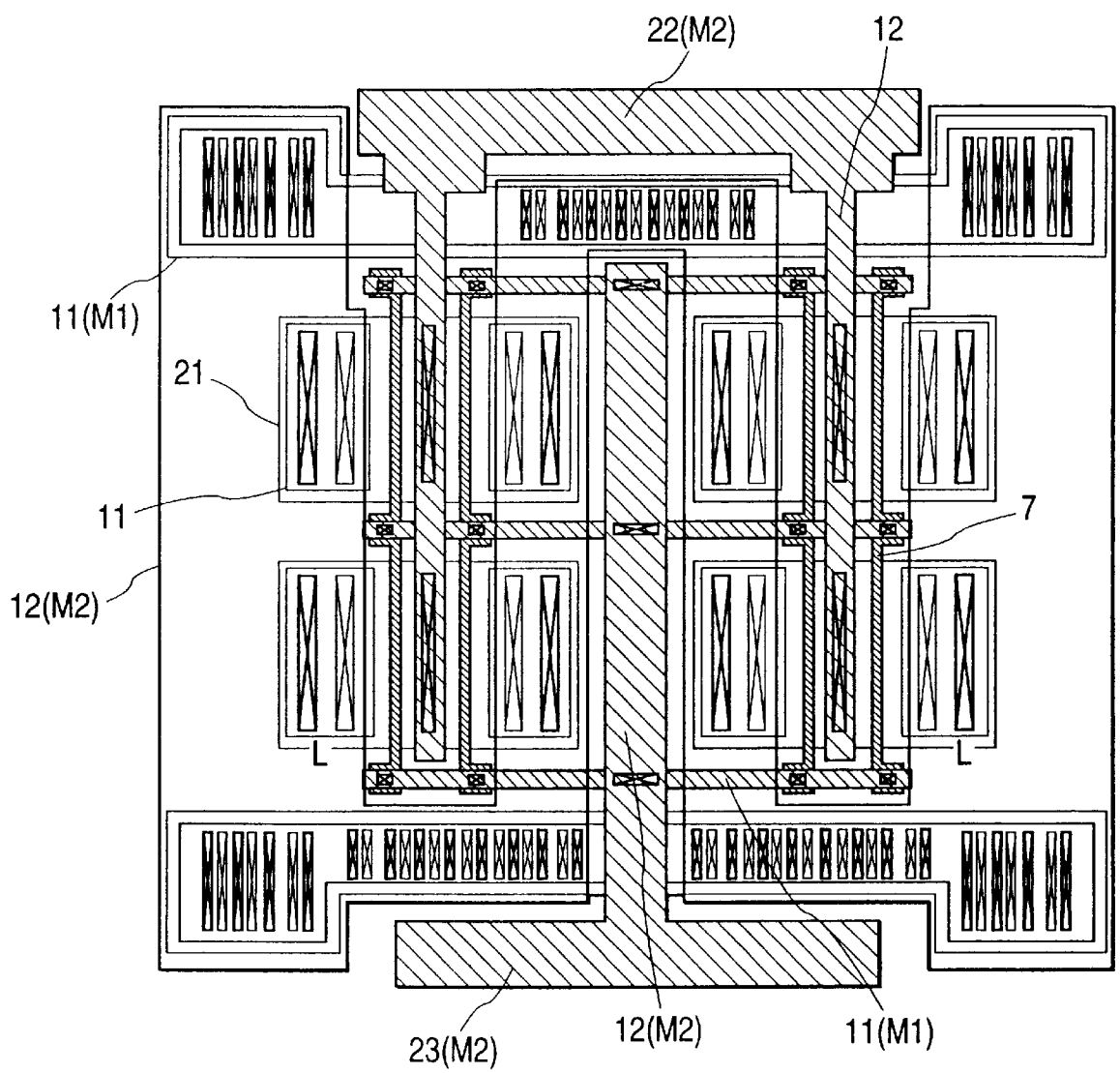
FIG. 67 is a plan view for a main portion of a semiconductor device as Embodiment 8 according to this invention.

A plan view shown in FIG. 67 (electrode pattern layout) is a modification of Embodiment 1 shown in FIG. 2. According to Embodiment 8, the second layer wiring for the gate is taken out by one from the mid point of the unit block. This makes the distance from the gate pad to each of MOSFET cells more uniform compared with the case of disposing second layer wirings for the gate on both sides of the unit block as shown in FIG. 2. Accordingly, deviation in the operation timing due to phase displacement of the input signals at the gate of each of the FET cells can be decreased to reduce the power loss over for entire chip 171.

Embodiment 9

Figure 68:
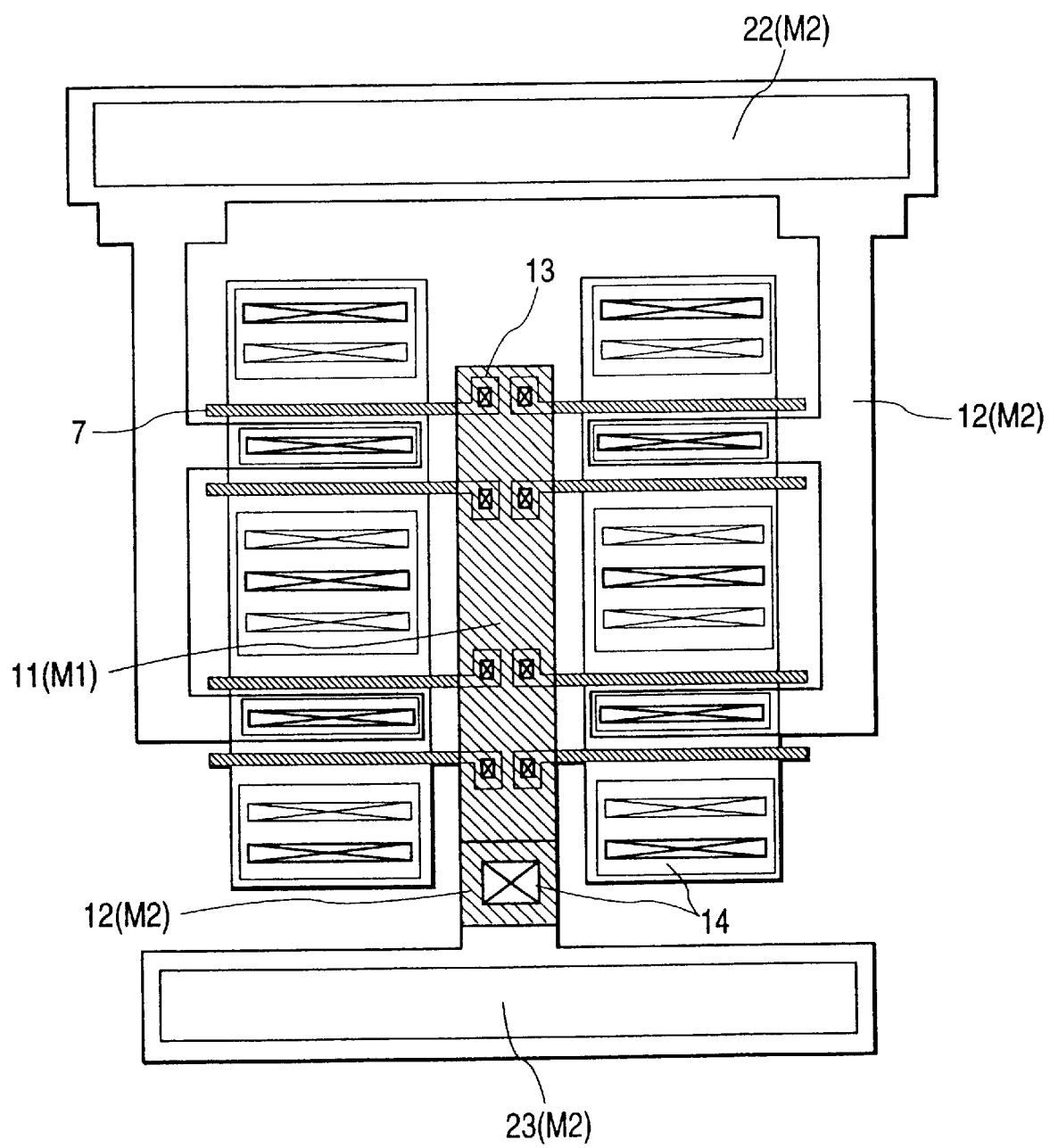
FIG. 68 is a plan view for a main portion of a semiconductor device as Embodiment 9 according to this invention.

FIG. 68 shows a layout in which shunt of the gate by metal wirings (first layer wiring) is not conducted but short gate electrodes are arranged. In this case, the parasitic wiring capacitance between the drain and the gate can be reduced.

Embodiment 10

Embodiment 10 according to this invention is to be explained with reference to FIG. 69 and FIG. 70.

Figure 69:
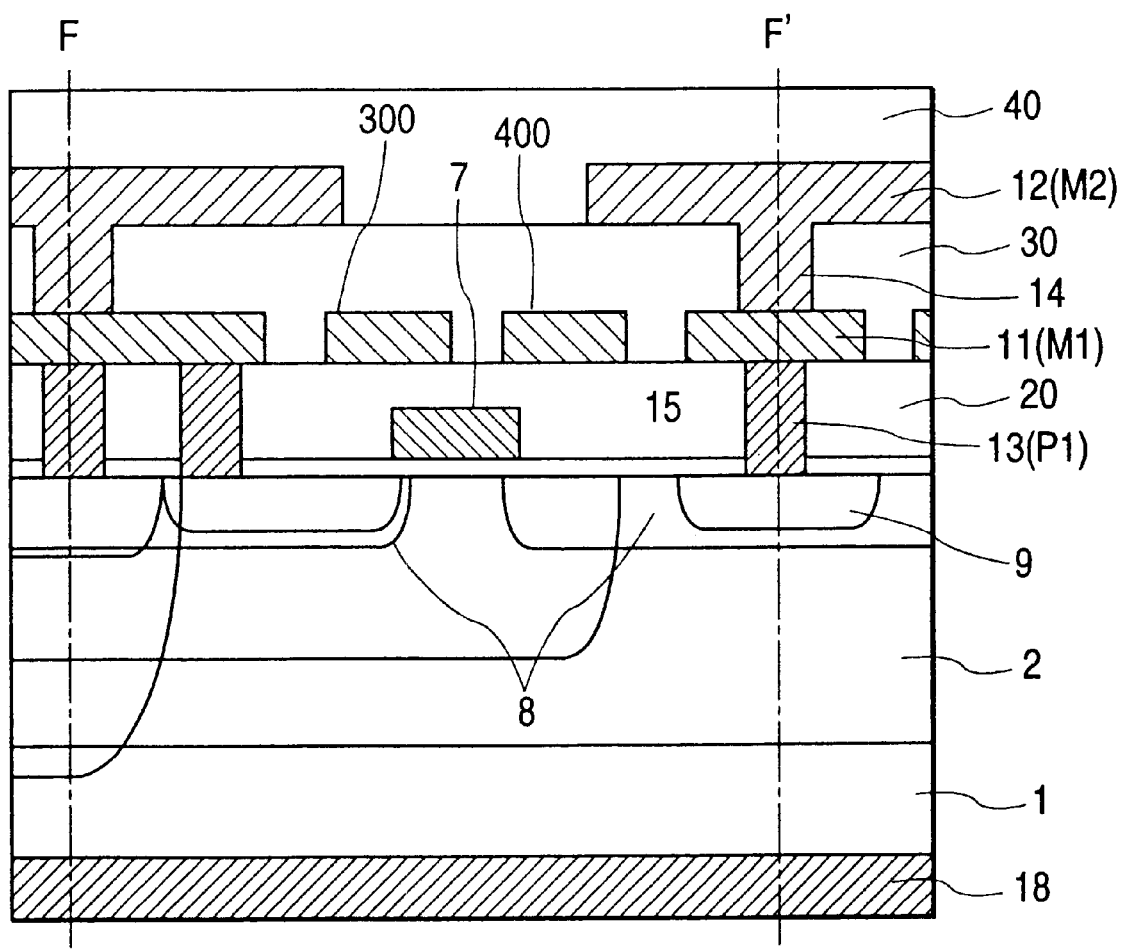
Figure 70:
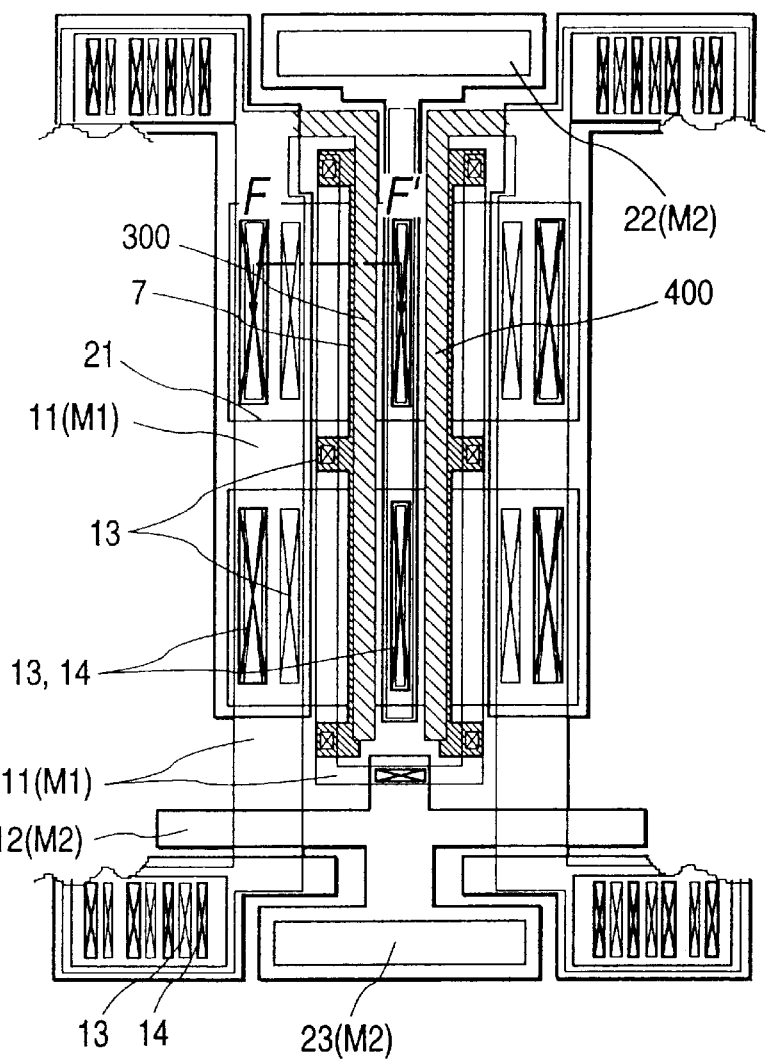
FIG. 70 is a plan view for a main portion of a semiconductor device as Embodiment 10 according to this invention.

FIG. 69 and FIG. 70 show a modification of Embodiment 7, and show a cross sectional view and a plan view of a power MOSFET in which a source field plate 400 is disposed. FIG. 70 is a cross sectional view taken along line F—F shown in FIG. 69.

According to Embodiment 10, as shown in FIG. 69, a portion of the first layer wiring for source extends over the offset region 8 to constitute a source field plate 400. That is, as shown in FIG. 70, the gate wirings (first layer wiring) are arranged in parallel with the gate electrode like that in Embodiment 7 and backed by the gate electrode. Then, the source field plate 400 is formed by inserting the first layer wiring 11 for the source between the drain wiring and the gate shunt wiring in a stripe shape along the gate electrode 7. The field plate 400 is fixed to the ground potential to provide an effect of improving the drain breakdown voltage by the moderation of electric field intensity of the offset region 8.

Embodiment 11

An Embodiment 11 according to this invention is to be explained with reference to FIG. 71 and FIG. 72.

Figure 71:
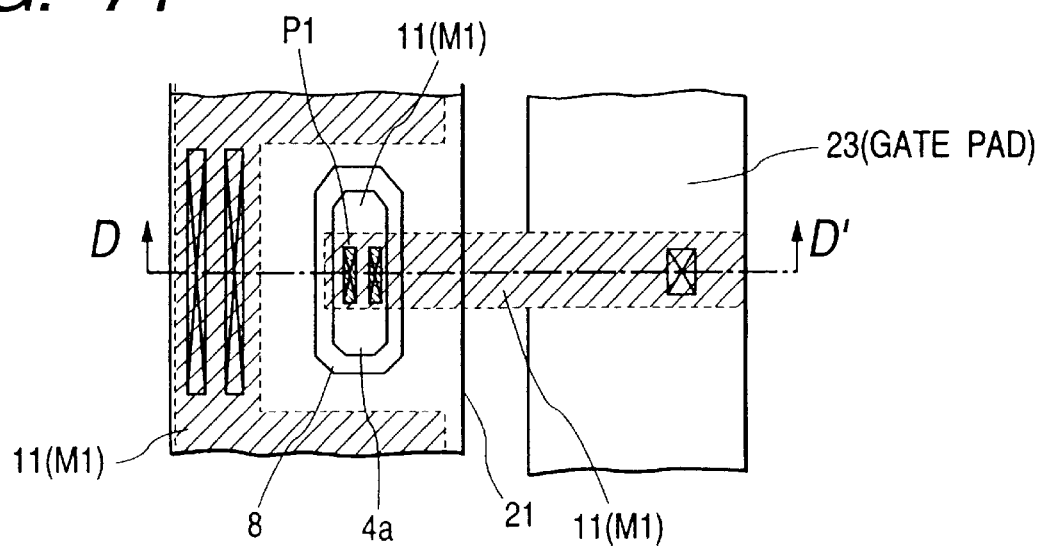
FIG. 71 is a plan view for a protection device in a semiconductor device (semiconductor chip) as Embodiment 11 according to this invention.
Figure 72:
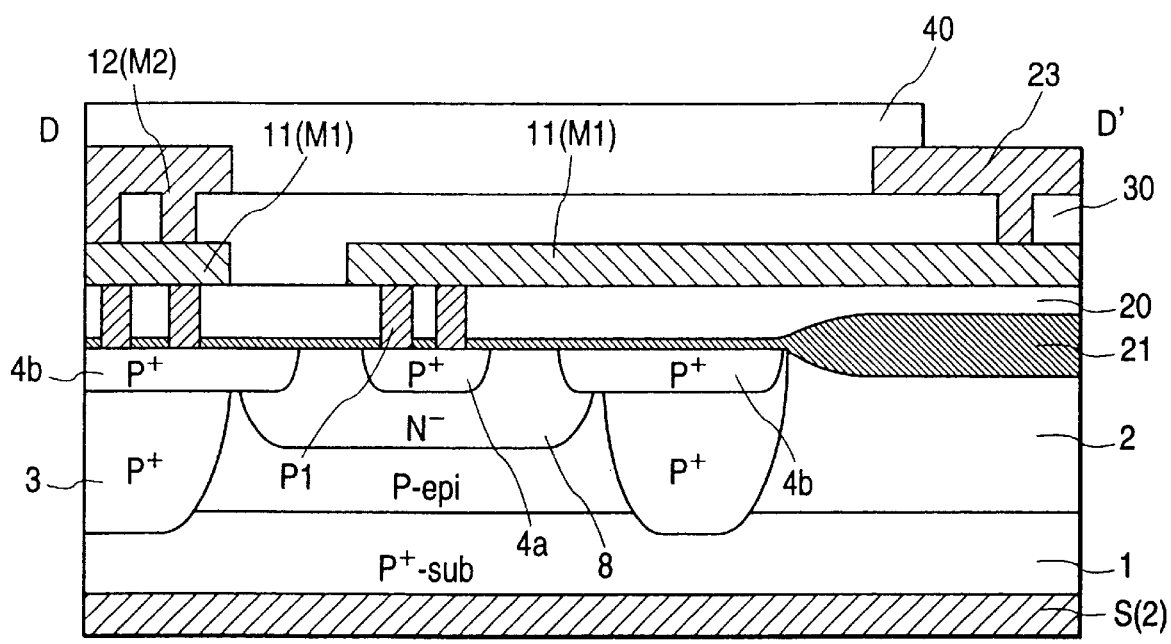
FIG. 72 is a cross sectional view for a portion taken along line D–D' of the protection device shown in FIG. 71.

FIG. 71 is a plan view of a gate protection diode as Embodiment 11, and FIG. 72 is a cross sectional view taken along line D–D' in FIG. 71.

The gate protection diode in Embodiment 1 (refer to FIG. 4 and FIG. 5) is connected by the second layer wiring to the gate pad. On the other hand, in the diode of Embodiment 11, the gate pad and the gate electrode are already connected by the first layer wiring.

This enables to prevent the destruction of the gate oxide film due to process damages such as caused by charge up in the steps subsequent to the first layer wiring.

Embodiment 12

Embodiment 12 according to this invention is to be explained with reference to FIG. 73.

Figure 73:
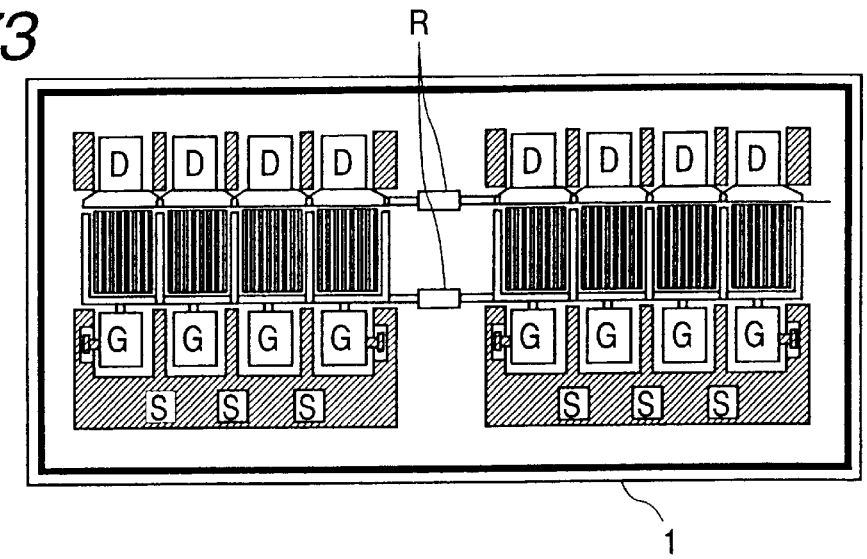
FIG. 73 is a plan view illustrating a layout of a semiconductor device (semiconductor chip) as Embodiment 12 according to this invention.

In the layout of FIG. 73, two devices of MOSFET of this invention used for the output stage of the amplifier circuit shown in FIG. 49 are arranged in one chip. Gates and drains for both of the devices are connected with resistance R of about 10 Ω, respectively. The gate electrode material is, for example, used for the resistor.

Embodiment 12 can decrease the scattering of the performance between the two devices and decrease the area of chip occupying the module.

Embodiment 13

Embodiment 13 according to this invention is to be explained with reference to FIG. 74.

Figure 74:
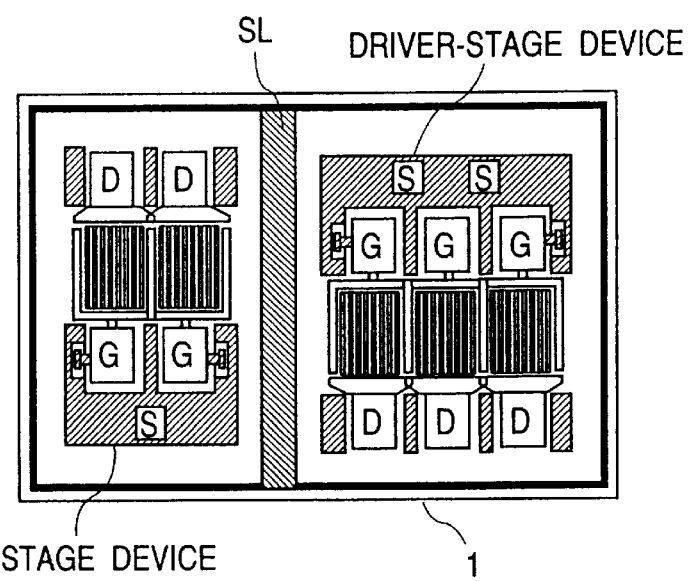
FIG. 74 is a plan view illustrating a layout of a semiconductor device (semiconductor chip) as Embodiment 13 according to this invention.

In the layout of FIG. 74, power MOSFET used for the input stage and the driver stage of the amplifier circuit shown in FIG. 49 are arranged in one chip. Since this is a source-grounded circuit, while the semiconductor substrate 1 is in common with them but gates and drains for both of the devices are electrically insulated. In this case, a structure, for example, of disposing a P type low resistance (leach-through) layer between both of them and disposing a wiring layer on the top surface of the substrate is adopted for the shield. Such a structure can be obtained in the course of forming the power MOSFET Embodiment 1 with no particular requirement for the process of forming the shield. Also in Embodiment 13, it is possible to save the area of chip occupying the module. Further, in Embodiment 13, the two MOSFET are laid out in a relation vertically upset to each other for improving the area efficiency of the module layout.

Further, in a so-called dual band amplifier of handling two different frequencies, two sets of a multi-stage amplifier circuit are incorporated into one module. Therefore, chips shown in FIG. 74 are also disposed by two sets. In this case, since adjacent FET do not operate simultaneously by constituting each of the amplifier circuits using the initial stage FET in one chip and the driver stage FET in the other chip, stable operation is possible.

Embodiment 14

Embodiment 14 according to this invention is to be explained with reference to FIG. 75.

Figure 75:
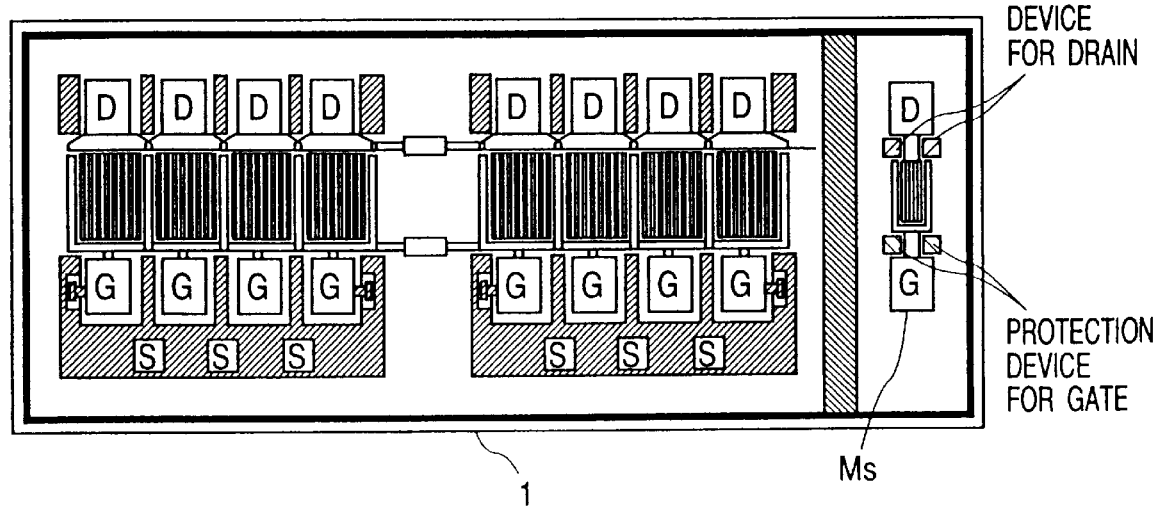
FIG. 75 is a plan view illustrating a layout of a semiconductor device (semiconductor chip) as Embodiment 14 according to this invention.

In FIG. 75, current sensing MOSFETs are added to the chip of Embodiment 12 shown in FIG. 73. The cell structure of MOSFET is identical with that for the output stage device, and the gate width is set to about 1/1000 for the output stage device. The current flowing through the output stage device is monitored by the structure and fed back to a control circuit. Further, MOSFET may sometimes be added as a switching in addition to the current sensing use. This is applied, for example, to a case where the device is intended for complete OFF operation in the application use, for example, for dual band operation. Since the MOSFET has a structure of exposing the gate and drain terminals, a protection device connected to each of the terminals is incorporated. Since Ms has a small gate width, when a high positive voltage is applied to the drain terminal in view of time, the energy can not be absorbed by breakdown current, leading to destruction. Further, also in a case of a negative voltage, the body diode is turned ON to flow current but the current capacity is insufficient leading to destruction. As a countermeasure for both of them, a diode having a breakdown voltage comparable with FET and of a sufficient size is used as the protection device.

Embodiment 15

A semiconductor device (P gate N channel type silicon Si power MOSFET: P gate MOS) as Embodiment 15 according to this invention is to be explained with reference to FIG. 76 to FIG. 78 and FIG. 82. Embodiment 15 has a feature in the gate electrode and the bulk structure for reducing the on-resistance.

Cross Sectional Structure of Basic Cell

Figure 76:
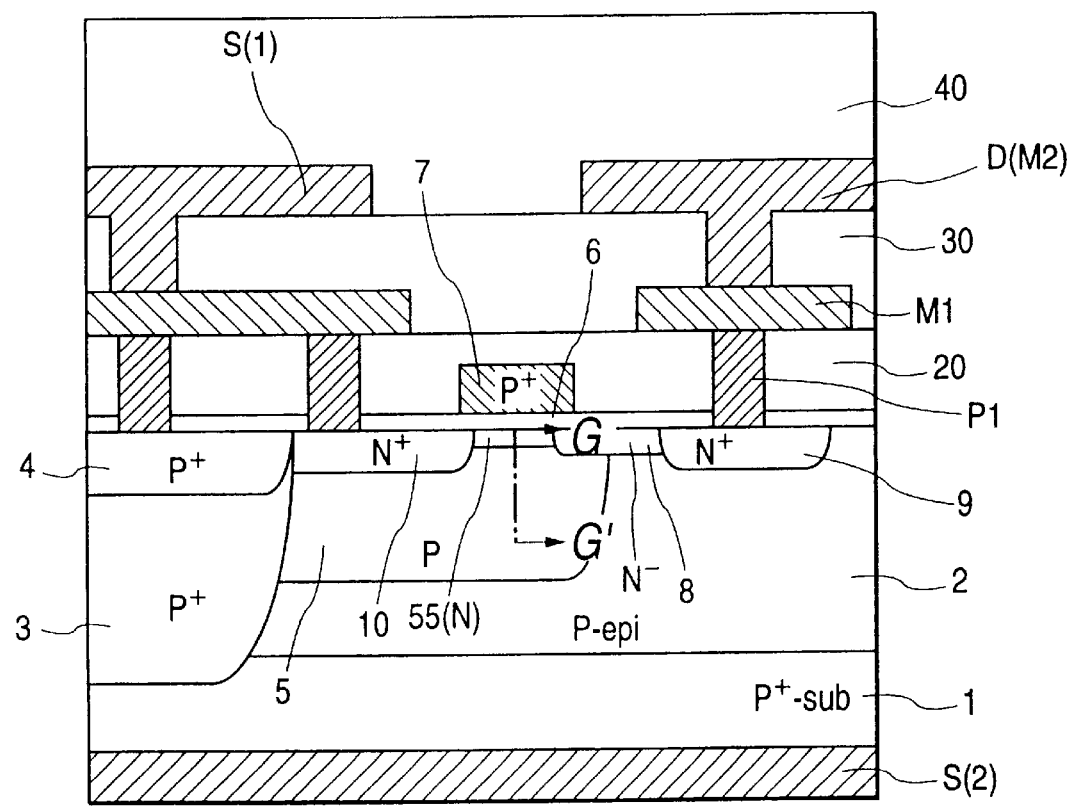
FIG. 76 is a cross sectional view for a main portion of a semiconductor device (P gate˙N type channel type Si power MOSFET) as Embodiment 15 according to this invention.

FIG. 76 is a cross sectional view of a basic cell constituted with a P gate MOS as Embodiment 15 of this invention.

Figure 82:
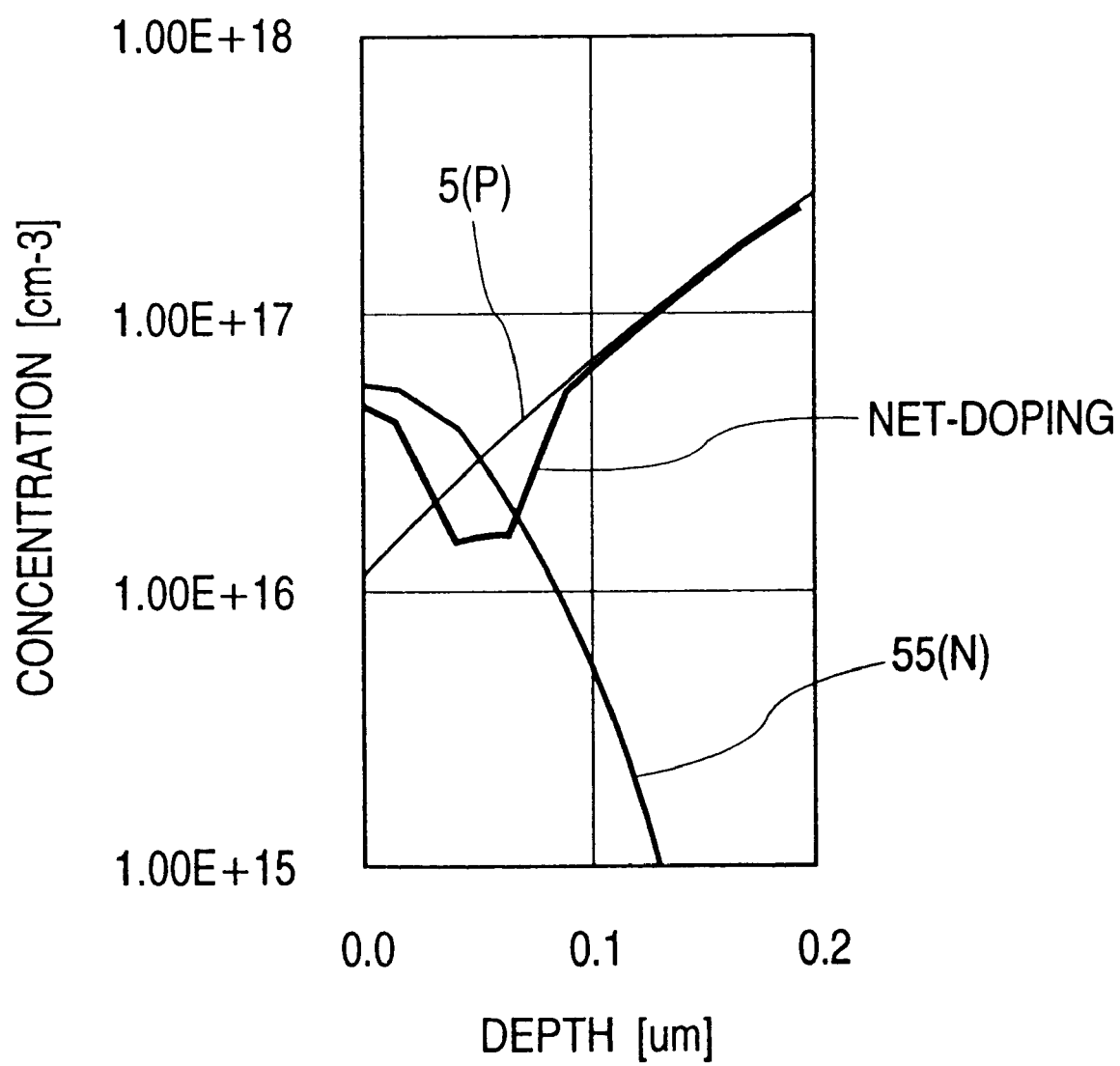
FIG. 82 is a distribution chart for the impurity concentration in a portion taken along line G–G' in FIG. 76.

The P type gate MOS shown in FIG. 76 comprises a P type silicone semiconductor substrate 1, a P type silicon semiconductor epitaxy layer 2 having an impurity concentration lower than that of the substrate situated on one main surface of the substrate, a first N type region (source region) 10 and a second N type region (drain region) 9 disposed within the main surface of the epitaxy layer being spaced from each other, a third N type region (offset region) 8 disposed between the source region 10 and the drain region 9 within the main surface of the epitaxy layer while being spaced from the source region and in contact with the drain region and having an impurity concentration lower than that in the drain region 9, a P type gate electrode 7 situated on the main surface in which the channel is formed between the source region 10 and the offset region 8, overlapping at the ends thereof on the source region 10 and the offset region 8, respectively, and terminated on the source region 10 and the offset region 8 by way of a gate insulation film (6), a first electrode S(1) and a second electrode D electrically connected to the source region 10 and the drain region 9 respectively, and a third electrode S (2) connected to the other main surface of the semiconductor substrate 1 opposite to the one main surface, and includes an N type distribution area 55 situated between the source region 10 and the offset region 8 in which the impurity concentration distribution of the impurity in the region (P type well region) 5 formed with the channel is lowered from the surface to the semiconductor substrate 1. FIG. 82 shows the impurity distribution in the P type well region 5 shown in FIG. 76 (taken along line G–G').

Figure 77:
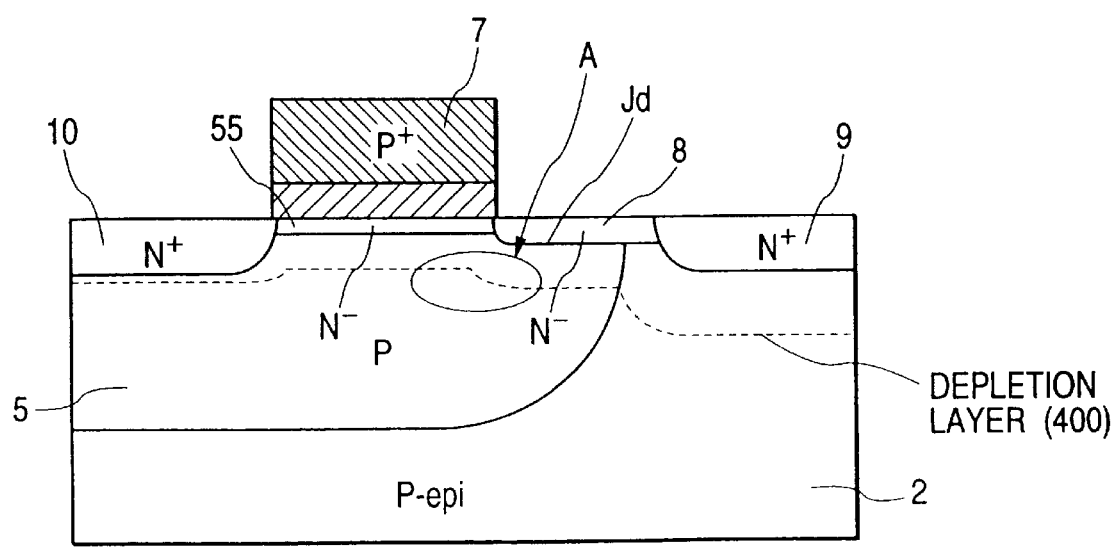
FIG. 77 is a cross sectional view for a main portion illustrating extension of a depletion layer in the semiconductor device (P gate˙N type channel type Si power MOSFET) as Embodiment 15 according to this invention.

According to Embodiment 15, since the gate electrode is a P type semiconductor, that is, a P type gate, the threshold voltage Vth increases by 1V in view of the difference of the work function. Therefore, although the N type layer 55 is disposed to the surface of the P type semiconductor region, a normally off, that is, enhanced state can be kept in a state where the gate voltage is not applied. Then, presence of the N type layer 55 provides an effect of extending the extension of a depletion layer 400 from a drain junction (Jd) as shown in FIG. 77 and, particularly, a portion indicated by an arrow A, is free from the effect of the gate oxide film boundary by the N type layer 55. Therefore, the drain breakdown voltage is improved. In view of the above, when a P type gate MOSS having a drain breakdown voltage of an aimed value identical with that for N type gate MOS is designed, the impurity concentration in the drain offset region can be increased. This is because there is no more required to extend the depletion layer to the side of the drain offset region. Since the concentration in the offset region can be increased, the resistance of the drain offset region can be reduced. Accordingly, this can contribute to the reduction of the on-resistance.

Layout for Unit Block

The layout for the unit block in Embodiment 15 is as shown in FIG. 2 like that for Embodiment 1 and, accordingly, explanations therefor are to be omitted.

Chip Layout

The chip layout for Embodiment 15 is as shown in FIG. 3 like that for Embodiment 1. Accordingly, explanations therefor are to be omitted.

Gate Protection Diode

The gate protection diode for Embodiment 15 is as shown in FIG. 4 and FIG. 5 like that for Embodiment 1. Accordingly, explanations therefor are also omitted.

Process

A manufacturing method of a P type gate MOS Embodiment 15 is to be explained below with reference to FIGS. 78(A) and (B).

Succeeding to the step (3) for Embodiment 1, arsenic (As) of a lower diffusion rate compared with phosphorus (P) is introduced into the epitaxy layer 2 by ion implantation selectively using a mask PR 2. The ion implantation is conducted under the conditions with an acceleration energy of 80 KeV and at a dose of $4.5 \times 10^{11}/cm^2$. Successively, annealing (950° C. 60 sec) is applied to form an N type region (N type region 55 shown in FIG. 76) having a peak value of the impurity concentration (about $6 \times 10^{16}/cm^3$) on the surface. Since arsenic (As) is used as the impurities for forming the N type region 55 as described above, the impurities less diffuse to the inside of the epitaxy layer and the surface of the N type region 55 can be maintained at a high impurity concentration.

Successively, after forming the gate oxide film in the step (6) for Embodiment 1, a conductor layer for the gate electrode in the step (7) is formed (refer to FIG. 10). At first, an intrinsic polycrystal silicon layer 7a is covered by a CVD process. Then, boron impurities are introduced to the polycrystal silicon layer 7a by ion implantation to form a P type gate electrode. Formation of the P type gate electrode by ion implantation is adopted with an aim of suppressing the boron concentration in the vicinity of the gate oxide film for decreasing the damages to the gate oxide film by boron.

Subsequently, the process from the step (8) to the step (20) of Embodiment 1 is conducted.

Embodiment 16

Figure 79:
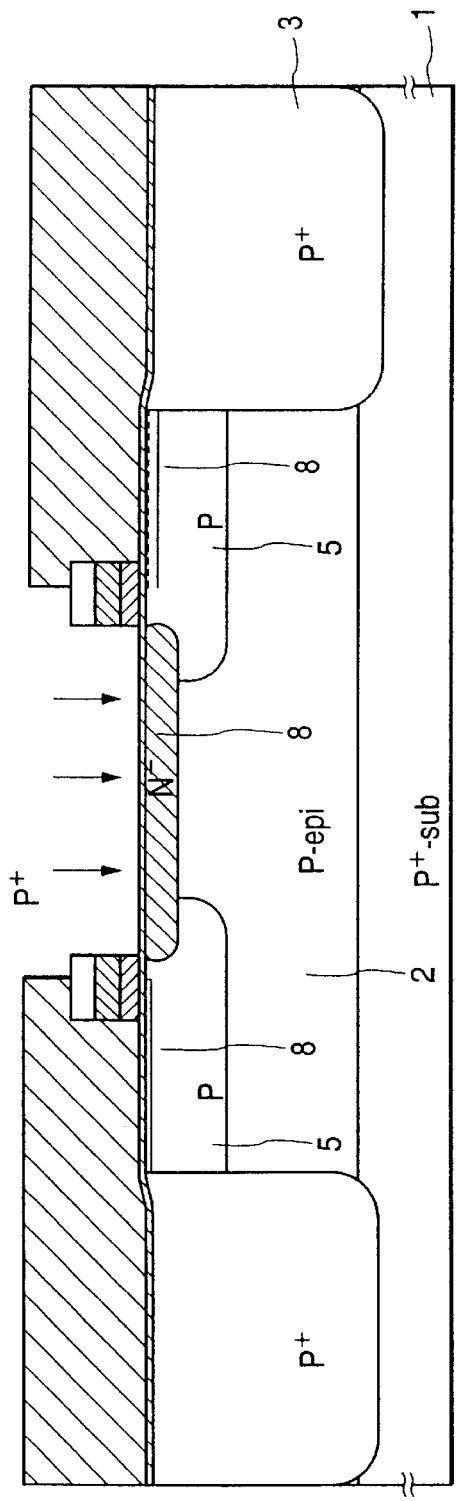
FIG. 79 is a cross sectional view for a main portion in manufacturing steps of the semiconductor device as Embodiment 16 according to this invention.

Embodiment 16 provides a P type gate MOS in which a shallow offset region 8 is formed only on the side of the drain region 9, which is to be explained below with reference to FIG. 79 to FIG. 81.

Embodiment 16 is based on the process for Embodiment 15 and an offset region 8 is formed only on the side of a drain region 9 such that phosphorous is not introduced to the surface of a P type well region 5 and a P type source punch-through region 3 by using a mask PR 10 upon drain offset region forming step (refer to step (10) in the process for Embodiment 1).

Figure 80:
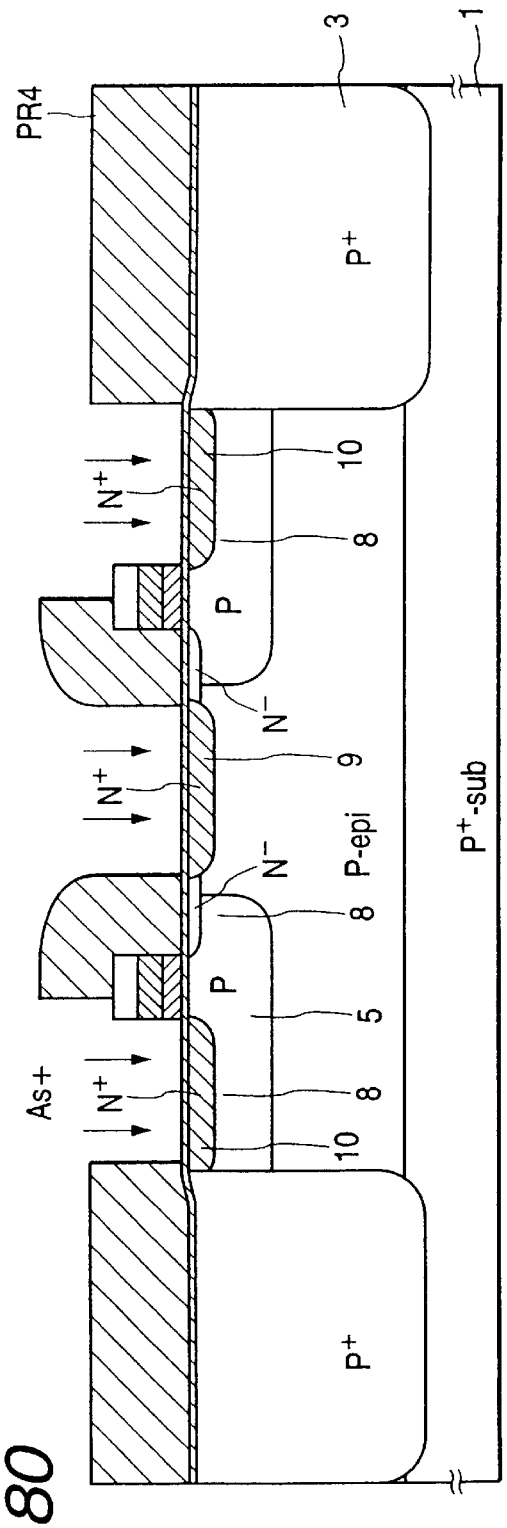
FIG. 80 is a cross sectional view for a main portion during manufacturing steps of the semiconductor device succeeding to FIG. 79.

Then, as shown in FIG. 80, source•drain regions (10, 9 are formed. The method of forming the source•drain regions (10, 9) is in accordance with the step (11) of the process for Embodiment 1. Subsequently, it goes to the step (12) of the process for Embodiment 1.

Figure 81:
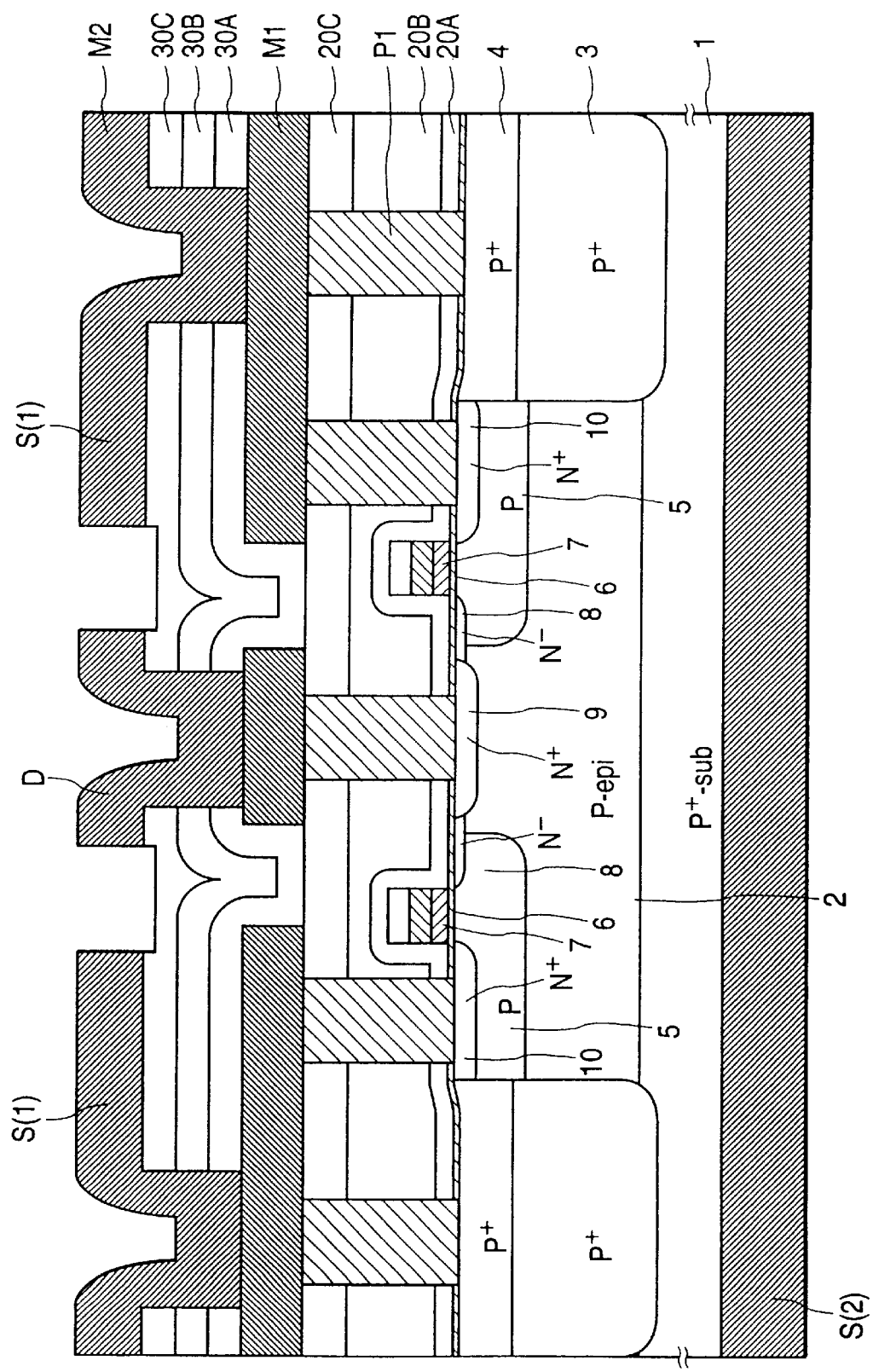
FIG. 81 is a cross sectional view for a main portion of a completed semiconductor device as Embodiment 16 according to this invention.

By the procedures described above, a P type gate MOS is completed as shown in FIG. 81.

According to Embodiment 16, phosphorus is not introduced to the surface of the P type punch-through region 3 by the PR10. Therefore, ion implantation at high concentration is not required in the introduction of impurities for forming the P type contact region on the surface of the P type source punch-through region 3. That is, ion damage caused by high concentration ion implantation can be avoided and the surface impurity concentration in the P type contact region can be improved. Accordingly, low resistance contact can be attained, which contributes to the reduction of the on-resistance.

Embodiment 16 is applicable also to the N gate MOS as in Embodiment 1.

Embodiment 17

Embodiment 17 is a modification of Embodiment 14, which has a buried N type layer in which the peak position for the impurity distribution in an N type layer 55 is set at a position deeper than the surface of the epitaxy layer. The depth for the peak position of the buried N type layer is about 0.05 μm from the surface thereof and the peak concentration thereof is about $2 \times 10^{17}/cm^3$.

The manufacturing method for Embodiment 17 is conducted based on Embodiment 15. That is, the buried N type layer is formed by setting the ion implantation conditions so as to provide the impurity distribution in the step for forming the N type layer 55 in Embodiment 15.

In the P type gate MOS having the buried N type layer as in Embodiment 17, since the N type layer is buried, surface scattering of electrons can be avoided by the uneven boundary of the gate oxide film. That is, only the scattering of bulk has to be considered in Embodiment 16. Accordingly, the carrier mobility can be improved. In other words, the on-resistance can be reduced. Embodiment 17 is also applicable to the N gate MOS as in Embodiment 1.

While the invention made by the present inventor has been explained based on the preferred embodiments, this invention is not restricted only to the embodiments described above but can be modified variously within a scope not departing the gist thereof.

The features of this invention are summarized based on the embodiments described above as shown below.

(1) A semiconductor device according to this invention comprises:
a semiconductor substrate of a first conduction type,
a semiconductor layer of a first conduction type formed on the surface of the semiconductor substrate,
a first region and a second region of a second conduction type opposite to the first conduction type being spaced apart from each other situated to a portion of a main surface of the semiconductor layer on both sides of a region to be formed with a channel therebetween, the second region comprising a low impurity concentration region in contact with a region to be formed with the channel and a high impurity concentration region in contact with the low impurity concentration region,
a gate electrode formed by way of a gate insulation film above the channel region,
a leach-through layer of a first conduction type formed to other portion of the main surface of the semiconductor layer so as to be in contact with the first region and the semiconductor substrate,
a first insulation film covering the gate electrode, the first region, the second region and the leach-through layer,
a first conductor plug, a second conductor plug and a third conductor plug connected, respectively, with the first region, the high impurity concentration region of the second region and the leach-through layer by way of openings disposed in the first insulation film,
a first conductor layer connected with the first conductor plug and the third conductor plug and a second conductor layer connected with the second conductor plug, and
a third conductor layer connected with a lower surface of the semiconductor substrate.

(2) In the constitution (1) described above, a second insulation film is covered on the first conductor layer and the second conductor layer, a first opening and a second opening are disposed to the second insulation film being situated on the first conductor plug and the second conductor plug, respectively, a first wiring layer is connected with the first conductor layer through the fist opening, and a second wiring layer is connected with the second conductor layer through the second opening.

(3) In the constitution (1) described above, the third conductor plug is connected with the gate electrode through the opening disposed in the first insulation film, and a fourth conductor layer is connected with the third plug.

(4) In the constitution (1) described above, the first conductor plug and second conductor plug comprise tungsten and the first conductor layer and the second conductor layer comprise an aluminum alloy.

(5) In the constitution (4) described above, the first conductor layer and the second conductor layer comprise an AlCu alloy.

(6) In the constitution (3) described above, the third conductor plug comprise tungsten and the fourth conductor layer comprises an aluminum alloy.

(7) In the constitution (6) described above, the first conductor layer and second conductor layer comprise an AlCu alloy.

(8) In the constitution (2) described above, the first wiring layer and the second wiring layer comprise an aluminum alloy.

(9) In the constitution (1) described above, the first conductor plug and the second conductor plug comprise W, the first conductor layer and the second conductor layer comprise an AlCu alloy and the third conductor layer has an electrode structure in contact with the lower surface of the semiconductor substrate and containing Ni, Ti and Au.

(10) In the constitution (3) described above, the third conductor plug comprises W, the gate electrode has an electrode structure in which a metal silicide is laminated on polycrystal Si and the fourth semiconductor layer comprises an AlCu alloy.

(11) In the semiconductor device according to this invention, an insulated gate field effect transistor and a protection diode connected with a gate for protecting the transistor are constituted to a semiconductor main body comprising a semiconductor substrate of a first protection type and a semiconductor layer of a first conduction type formed on the upper surface of the semiconductor substrate, wherein the insulated gate field effect transistor comprises:
a first region and a second region of a second conduction type opposite to the first conduction type situated being spaced apart from each other on one main surface of a semiconductor layer defined by a device isolation region on both sides of a channel-forming region, the second region comprising a low impurity concentration region in contact with a region to be formed with a channel and a high impurity concentration region in contact with the low concentration region,
a gate electrode formed above the channel region by way of a gate insulation film,
a first leach-through layer of a first conduction type formed to a portion of the first main surface so as to be in contact with the first region and the semiconductor substrate,
a first insulation film covering the gate electrode, the first region, the second region and the first leach-through layer,
a first conductor plug, a second conductor plug and a third conductor plug connected, respectively, with the first region, the high impurity concentration region of the second region and the first leach-through layer through openings disposed in the first insulation film,
a first conductor layer connected with the first conductor plug and the third conductor plug, and a second conductor layer connected with the second conductor plug, and
a third conductor layer connected with the lower surface of the semiconductor substrate, and
the protection diode is a back-to-back diode comprising:
a third region of a second conduction type formed to a second main surface of the semiconductor layer defined with a device isolation region, and
a fourth region and a fifth region of a first conduction type formed in the third region and constituted with the fourth region, the third region and the fifth region.

(12) In the constitution (12) described above, the fourth region is electrically connected with a gate electrode pad disposed on the main surface of the semiconductor layer by way of a fourth conductor plug.

(13) In the constitution (12) described above, the fourth plug comprises a plurality of plugs.

(14) In the constitution (11) described above, the second main surface is covered with the first insulation film, the fourth conductor plug and the fifth are connected, respectively, with the fourth region and the fifth region through the openings disposed to the first insulation film, a sixth conductor layer and a seventh conductor layer are connected with the fourth conductor plug and the fifth conductor plug, and a second leach-through layer is disposed to the second main surface, being in contact with the fifth region and in contact with the semiconductor substrate.

(15) In the constitution (14) described above, the sixth conductor layer extends on the device isolation region, and the gate electrode pad is connected with the sixth conductor layer on the device isolation region.

(16) In the constitution (14) described above, the first, second, third, fourth and fifth conductor plugs comprise tungsten while the first, second, sixth and seventh conductor layers comprise an aluminum alloy.

(17) In the constitution (16) described above, the first, second, sixth and seventh conductor layers comprise an AlCu alloy.

(18) In an insulated gate type field effect semiconductor power device having a drain offset region according to this invention, an N type source region and an N type drain region having an offset region are formed, being spaced apart from each other, to a P type silicon semiconductor layer, a gate electrode is formed by way of a gate insulation film to the surface of the P type silicon semiconductor layer as a channel region between the N type source region and the offset region, and the gate electrode comprises a silicon semiconductor layer containing P type impurities.

(19) In the constitution (19) described above, the gate electrode comprises a polycrystal silicon layer containing P type impurities and a metal silicide layer formed on the polycrystal silicon layer.

(20) In the constitution (18) described above, the gate insulation film comprises a first silicon oxide film formed by thermal oxidation and a second silicon oxide film formed by gas phase chemical growing on the silicon oxide film.

(21) A semiconductor device according to this invention comprises:
a P type silicon substrate,
a P type silicon semiconductor layer situated to one main surface of the substrate and having an impurity concentration lower than that of the substrate,
a first N type region and a second N type region disposed being spaced from each other within a main surface of a semiconductor layer,
a third N type region situated between the first N type region and the second N type region in the main surface of the semiconductor region, being spaced apart from the first N type region and in contact with the second N type region, and having an impurity concentration lower than that of the second N type region,
a gate electrode disposed by way of a gate insulation film and situated between the first N type region and the third N type region on the main surface of the semiconductor layer to be formed with a channel, overlapping at the ends thereof on the first region and the third region respectively, and terminating on the first region and the third region respectively,
a first electrode and a second electrode connected with the first region and the second region, respectively and
a third electrode connected with the other main surface of the semiconductor substrate opposite to one main surface in which the distribution of the impurity concentration in the semiconductor layer situated between the first N type region and the third N type region comprises and an N type distribution decreasing from the surface of the semiconductor layer to the semiconductor substrate.

(22) A semiconductor device according to this invention comprises:
a P type silicon semiconductor substrate,
a P type silicon semiconductor layer situated on one main surface of the substrate and having an impurity concentration lower than that of the substrate,
a first N type region and a second N type region disposed being spaced apart from each other in the main surface of the semiconductor layer,
a third N type region situated between the first N type region and the second N type region in the main surface of the semiconductor layer, being spaced apart from the first N type region and in contact with the second N type region and having an impurity concentration lower than that of the second N type region.
a gate electrode disposed by way of the gate insulation film and situated between the first N type region and the third N type region on the main surface of the semiconductor layer to be formed with a channel, so as to overlap at the ends thereof on the first region and the second region, respectively, and terminate on the first region and the third region, respectively,
a first electrode and a second electrode connected, respectively, with the first region and the second region, and
a third electrode connected the other main surface of the semiconductor substrate opposite to the one main surface, in which
the distribution of the impurity concentration in the semiconductor layer situated between the first N type region and the third N type region comprises a P type distribution area increasing from the surface of the semiconductor layer to the semiconductor substrate and an N type distribution area overlapping on the P type distribution area and having a peak for the impurity concentration at the inside spaced apart from the surface of the semiconductor layer.

(23) A semiconductor device according to this invention comprises:
a semiconductor substrate of a first conduction type,
a semiconductor layer of a first conduction type situated to one main surface of the semiconductor substrate and having an impurity concentration lower than that of the semiconductor substrate,
a first region and a second region of a second conduction type opposite to the first conduction type disposed being spaced apart from each other in the main surface of the semiconductor layer.
a third region situated between the first region and the second region in the main surface of the semiconductor layer, being spaced apart from the first region and in contact with the second region and having an impurity concentration lower than that of the first region,
a gate electrode disposed by way of a gate insulation film on the main surface of the semiconductor layer and situated between the first region and the third region, so as to overlap at a portion thereof with the first region and the third region, respectively,
a first electrode and a second electrode connected, respectively, with the first region and the second region, and a third electrode connected to the other main surface of the semiconductor substrate opposite to one main surface, in which a fourth region of a first conduction type terminating in the third region is formed selectively to the main surface of the semiconductor layer situated between the first region and the third region, and having a pocket layer of a first conduction type having an impurity concentration higher than the impurity concentration at the surface of the fourth region being disposed in the fourth region situated below the gate electrode at a position deeper than the third region.

(24) In the constitution (23) described above, the first electrode and the third electrode are connected electrically.

(25) In the constitution (23) described above, a fifth region of a first conduction type in contact with the first region and the semiconductor substrate is disposed to the first semiconductor layer.

(26) In the constitution (23) described above, the third electrode is connected with a first reference potential and the second electrode is connected with a second potential.

(27) In the constitution (26) described above, the third electrode is a source electrode and the second electrode is a drain electrode.

(28) In the constitution (26) or (27) described above, the first referential potential is a ground potential and the second reference potential is a power source potential.

(29) In the constitution (23) described above, the pocket layer is formed by ion implantation obliquely relative to the main surface of the semiconductor layer.

(30) A semiconductor device according to this invention comprises:

a semiconductor substrate of a first conduction type, a semiconductor layer of a first conduction type situated to one main surface of the substrate and having an impurity concentration lower than that of the semiconductor substrate, a first region and a second region of a second conduction type opposite to the first conduction type disposed being space apart from each other in the main surface of the semiconductor layer, a third region disposed between the first region and the second region in the main surface of the semiconductor layer, situated being spaced apart from the first region and in contact with the second region and having an impurity concentration lower than that of the first region, a gate electrode disposed by way of a gate insulation film on the main surface of the semiconductor layer and situated between the first region and the third region, so as to overlap at a portion thereof on the first region and the third region, respectively, a first electrode and a second electrode connected, respectively, with the first region and the second region, a third electrode connected with the other main surface opposite to one main surface of the semiconductor substrate, in which the first film thickness of the gate insulation film present between overlap of the third region and the gate electrode is greater than the second film thickness of the gate insulation film on the main surface of the semiconductor layer situated between the first region and the third region.

(31) In the constitution (30) described above, a fourth region of, a first conduction type terminating in the third region is formed selectively to the main surface of the semiconductor layer situated between the first region and the third region.

(32) In the constitution (30) or (321) described above, the first electrode and the third electrode are connected electrically.

(33) In the constitution (30) described above, a fifth region of a first conduction type in contact with the first region and the semiconductor substrate is disposed to the first semiconductor layer.

(34) In the constitution (30) described above, the third electrode is connected with a first reference potential and the second electrode is connected with a second reference potential.

(35) In the constitution (34) described above, the third electrode is a source electrode and the second electrode is a drain electrode.

(36) In the constitution (34) or (35) described above, the first reference potential is a ground potential and the second reference potential is a power source potential.

(37) In the constitution (30) described above, the gate insulation film of the first film thickness is formed with a thickness greater than the gate insulation film of the second film thickness so as to form a tapered shape.

(38) In the constitution (37) described above, the gate insulation film of the first film thickness comprises a bird's beak structure.

(39) A semiconductor device according to this invention comprises:

(a) a semiconductor substrate of first conduction type, (b) a semiconductor layer of a first conduction type disposed on one main surface of the semiconductor substrate and having an impurity concentration lower than that of the semiconductor substrate, (c) a first region and a second region of a second conduction type opposite to the first conduction type disposed being spaced from each other in the main surface of the semiconductor layer, (d) a third region situated in the main surface of the semiconductor layer between the first region and the second region, being spaced apart from the first region and in contact with the second region, and having an impurity concentration lower than that in the first region.

(e) a gate electrode disposed by way of a gate insulation film on the main surface of the semiconductor layer and situated between the first region and the third region, so as to overlap at a portion thereof on the first region and the third region, respectively.

(f) a first electrode and a second electrode connected, respectively, with the first region and the second region, and (g) a third electrode connected to the other main surface opposite to one main surface of the semiconductor substrate, in which a bird's beak is present between overlap of the third region and the gate electrode and the concentration of the impurity on the surface of the third region is substantially equal with or higher than the impurity concentration of the second region.

(40) In the constitution (39) described above, the impurity concentration on the surface of the third region has a peak value of $1E18(1\times10^{18}$ cm$^{-3})$ or more.

(41) In the constitution (39) or (40) described above, the impurity concentration on the surface of the third region is distributed within a depth of 0.005 μm from the surface.

(42) A semiconductor device according to this invention comprises:
- a substrate in which a semiconductor layer of a first conduction type having a low impurity concentration is formed at the main surface,
- a first region and a second region of a second conduction type opposite to the first conduction type disposed, being spaced apart from each other, in the main surface of the semiconductor layer,
- a third region disposed in the main surface of the semiconductor layer between the first region and the second region, being spaced apart from the first region and in contact with the second region, and having an impurity concentration lower than that of the first region,
- a gate electrode situated by way of a gate insulation film on the main surface of the semiconductor layer and situated between the first region and the third region so as to overlap at a portion thereof with the first region and the third region, respectively, and
- a well region of a first conduction type formed in the semiconductor layer below the gate insulation film, in which
- the first film thickness of the gate insulation film present between overlap of the third region gate electrode is formed at a thickness greater than the second film thickness of the gate insulation film on the main surface of the semiconductor layer situated between the first region and the third region, and the third region comprises a shallow high concentration region and a deep low concentration region.

(43) In the constitution (42) described above, the well region terminates in the third region.

(44) In the constitution (42) described above, the well region terminates below the gate electrode.

(45) In the constitution (42) described above, the gate electrode comprises a polycrystal silicon layer containing P type impurities and a high melting silicide layer laminated on the polycrystal silicon.

(46) A semiconductor device according to this invention comprises:
- a semiconductor substrate of a first conduction type,
- a semiconductor layer of a first conduction type formed on a main surface of the substrate,
- a first region and a second region of a second conduction type opposite to the first conduction type situated, being spaced apart from each other, in the main surface of the semiconductor layer,
- a third region of a second conduction type formed on the main surface of the conductor layer between the first region and the second region, so as to be spaced apart from the first region and in contact with the second region,
- a gate oxide film disposed to the main surface of the semiconductor layer as a channel region between the first region and the third region,
- a gate conductor layer disposed on the gate oxide film,
- a first conductor layer connected with the first region,
- a second conductor layer connected with the second region, and
- a third conductor layer connected with the rearface of the semiconductor substrate, in which
- the film thickness for each of the first gate oxide film situated between the first region and the gate insulation film and a second gate oxide film situated between the third region and the gate insulation film is greater than the thickness of the third gate oxide film disposed to the main surface of the semiconductor layer as the channel region.

(47) In the constitution (46) described above, a fourth region of the first conduction type terminates in the third region on the main surface of the semiconductor layer situated between the first region and the third region.

(48) In the constitution (46) or (47) described above, the first conductor layer and the conductor layer are connected electrically.

(49) In the constitution (46) described above, a fifth region of a first conduction type in contact with the first region and the semiconductor region is disposed to the first semiconductor layer.

(50) In the constitution (46) described above, the third conductor layer is connected with a first referential potential and the second conduction layer is connected with a second referential potential.

(51) In the constitution (50) described above, the third conductor layer is a source rearface electrode and the second conductor layer is a drain electrode.

(52) In the constitution (50) or (51) described above, the first reference potential is a ground potential and the second reference potential is a power source potential.

(53) In the constitution (46) described above, the first gate oxide film and the second gate oxide film comprise a bird's beak structure.

(54) An insulated gate type semiconductor device having, on the main surface of a semiconductor layer, a plurality of channel regions, a drain region and a source region disposed on both side of each of the channel regions, and a conductor layer for a gate electrode disposed by way of a gate insulation film on each of the channel region surfaces, wherein
- a metal plug is connected with the main surface of each of the drain regions and each of the source regions,
- a first metal conductor layer is connected with each of the metal plugs,
- an interlayer insulation film is covered on the first metal conductor layer,
- a second metal conductor layer for the drain is connected in common with each of the first metal conductor layers for the drain of the first metal conductor layers through the openings for the connection of drain disposed to the interlayer insulation film being situated on the metal plug connected with the drain region,
- a second metal conductor layer for the source is connected in common with each of the first metal conductor layers for the source of the first metal conductor layers through the source connecting openings disposed to the interlayer insulation film,
- a second metal conductor layer for the gate is connected in common with each of the first metal conductor layers for the gate of the first metal conductor layers through the gate connecting openings disposed to the interlayer insulation film,
- the second metal conductor layer for the drain has a drain bonding pad, and
- the second metal conductor layer for the gate has a gate bonding pad.

(55) In the constitution (54) described above, the semiconductor layer is formed on the surface of the semiconductor substrate and a source electrode is disposed to the rearface of the semiconductor substrate.

(56) In the constitution (55) described above, a penetration layer of a conduction type identical with that the of the semiconductor layer and having a higher impurity concentration than that of the semiconductor layer that extends to the semiconductor substrate is disposed in the semiconductor layer, and the first metal conductor layer for the source is connected with the main surface of the penetration layer by way of a metal plug.

(57) In the constitution (56) described above, the second metal conductor layer for the source is connected with the first metal conductor layer for the source through a source connecting opening disposed to the interlayer insulation film situated on the metal plug.

(58) In the constitution (56) described above, the second metal conductor layer for the source has a source pad for probing.

(59) In the constitution (56) described above, an extension of the second metal conductor layer for the source is disposed adjacent with the drain pad, other penetration layer having the same constitution as the penetration layer described above is disposed in the semiconductor layer being situated below the extension and the extension is electrically connected with the other penetration layer.

(60) In the constitution (56) described above, a second metal conductor layer for the source different from the second metal conductor layer for the source described above is disposed adjacent with the gate pad, other penetration layer having the same constitution as the penetration layer described above is disposed being situated below the different second metal conductor layer for the source in the semiconductor layer, and the different second metal conductor layer for the source is electrically connected with the other penetration layer.

(61) In the constitution (59) described above, the first metal conductor layer for the gate is disposed along the conductor layer for the gate electrode, the first metal conductor layer for the drain and the first conductor layer for the source are disposed, respectively, along the first metal conductor layer for the gate, the second metal conductor layer for the drain is disposed along the first metal conductor layer for the drain being situated on the first metal conductor layer for the drain, and the second metal conductor layer for the source is disposed along the first metal conductor layer for the source being situated on the first metal conductor layer for the source.

(62) An insulated gate type semiconductor device having a plurality of channel regions, a drain region and a source region disposed on both sides of each of the channel regions and a conductor layer for the gate electrode disposed to the surface of each of the channel regions by way of a gate insulation film to a main surface of a semiconductor chip having a semiconductor layer, and including insulated type field effect transistors as a unit block, wherein a metal plug is connected with the main surface of each of the drain regions and each of the source regions, a first metal conductor layer is connected with each of metal plugs, an interlayer insulation film is covered on the first metal conductor layer, a second metal conductor layer for the drain is connected in common with each of the first metal conductor layers for the drain of the first metal conductor layers through drain connecting openings disposed to the interlayer insulation film being situated on the metal plug connected with the drain region, a second metal conductor layer for the source is connected in common with each of the first metal conductor layers for the source of the first metal conductor layers through source connecting openings disposed to the interlayer insulation film, a second metal conductor layer for the gate is connected in common with each of the first metal conductor layers for the gate of the first metal conductor layers through gate connecting openings disposed to the interlayer insulation film, the second metal conductor layer for the drain having a drain bonding pad and the second metal conductor layer for the gate has a gate bonding pad, and wherein the insulated gate type field effect transistors of the unit block are disposed in plurality to the main surface of the semiconductor chip.

(63) In the constitution (62) described above, the semiconductor chip has a first side and a second side opposed to each other, a plurality of the insulated gate type field effect transistors of the unit block are disposed in parallel along the first side and the second side, drain bonding pads are disposed along the first side, and gate bonding pads are disposed along the second side.

(64) In the constitution (63) described above, the second metal conductor layer for the source has a source pad for probing and source pad for probing in the unit block are disposed along the second side.

(65) In the constitution (63) described above, gate protection devices are connected electrically with the gate bonding pads disposed to the outermost side respectively.

(66) In the constitution (65) described above, a metal connection layer identical with the first metal conductor layer is formed on the main surface of the semiconductor chip, and the gate protection device and the bonding pad are connected by the metal connection layer.

(67) An insulated gate type semiconductor device having a plurality of channel regions, a drain region and a source region disposed on both sides of each of the channel regions, and a conductor layer for the gate electrode disposed by way of a gate insulation film to the surface of each of the channel regions to a main surface of a semiconductor chip having a semiconductor layer, and including insulated gate type field effect transistors as a unit block, wherein metal plugs are connected with the main surface of each of the drain regions and each of the source regions, a first metal conductor layer is connected with each of the metal plugs, an interlayer insulation film is covered on the first metal conductor layer, a second metal conductor layer for the drain is connected in common with each of the first metal conductor layers for the drain of the first metal conductor layers through drain connecting openings disposed in the interlayer insulation film being situated on the metal plug connected with the drain region, a second metal conductor layer for the source is connected in common with each of the first metal conductor layers for the source of the first metal conductor layers through source connecting openings disposed in the interlayer insulation film, a second metal conductor layer for the gate is connected in common with each of the first metal conductor layers for the gate of the first metal conductor layers through gate connecting openings disposed in the interlayer insulation film, the second metal conductor layer for the drain has a drain bonding pad, the second metal conductor layer for the gate has a gate bonding pad, and wherein the insulated gate type field effect transistors of the unit block are disposed in plurality on the main surface of the semiconductor substrate, and the first metal conductor layer for the gate and the second metal conductor layer for the gate are connected between each of the unit blocks.

(68) An insulated gate type semiconductor device having a plurality of channel regions, a drain region and a source region disposed on both sides of each of the channel regions, and a conductor layer for the gate electrode disposed by way of a gate insulation film to the surface of each of the channel regions to a main surface of a semiconductor chip having a semiconductor layer, wherein metal plugs are connected to the main surface of each of the drain regions and each of the source regions, a first metal conductor layer is connected with each of the metal plugs, an interlayer insulation film is covered on the first metal conductor layer, a second metal conductor layer for the drain is connected in common with each of the first metal conductor layers for the drain of the first metal conductor layers through drain connecting openings disposed in the interlayer insulation film being situated on the metal plugs connected with the drain regions, a second metal conductor layer for the gate is connected in common with each of the first metal conductor layers for the gate of the first metal conductor layers through gate connecting openings disposed to the interlayer insulation film, the second metal conductor layer for the drain has a drain bonding pad, the second metal conductor layer for the gate has a gate bonding pad, the drain region is a common drain region put between the channel regions and the conductor layers for the gate electrodes are disposed independently of each other.

(69) In the insulated gate type semiconductor device according to this invention, first and second insulated gate type field effect transistors each having a plurality of channel regions, a drain region and a source region disposed on both sides of each of the channel regions, and a gate electrode disposed by way of a gate insulation film to the surface of each of the channel regions are disposed to the main surface of a semiconductor substrate having a semiconductor layer, a first resistor for impedance matching is electrically connected with each of the drain regions of the first and second insulated gate type field effect transistors and a second resistor for impedance matching is electrically connected with each of the conductor layers for the gate electrodes of the first and second insulated gate field effect transistors.

(70) In the constitution (69) described above, the first and second resistors comprise a material identical with that of the conductor layer for the gate electrode.

(71) In the constitution (69) described above, current sensing devices constituted in the same manner as the first and second insulate gate type field effect transistors are disposed on the main surface of semiconductor substrate, and a shield layer is disposed between the first or the second insulated gate type field effect transistor and the current sensing device.

(72) In the constitution (71) described above, the shield layer comprises a semiconductor region extending from the main surface to the semiconductor substrate, a metal plug connected with the semiconductor region, a first metal conductor layer connected with the metal plug and a second metal conductor layer connected with the first metal conductor layer.

(73) In the insulated gate type semiconductor device according to this invention, first and second insulated gate type field effect transistors each having a plurality of channel regions, a drain region and a source region disposed on both sides of each of the channel regions, and a conductor layer for a gate electrode disposed by way of a gate insulation film to the surface of each of the channel regions are disposed to the main surface of a semiconductor substrate having a semiconductor layer, a drain bonding pad and a gate bonding pad to the first and second insulated gate type field effect transistors are disposed respectively to the main surface, a source electrode is disposed to the rearface of the semiconductor substrate and a shield layer is disposed between the first and second insulated gate type field effect transistor.

(74) In the constitution (73) described above, the shield layer comprises a semiconductor region extending from the main surface to the semiconductor substrate, a metal plug connected with the semiconductor region, a first metal conductor layer connected with the metal plug and a second metal conductor layer connected with the first metal conductor layer.

(75) In a method of manufacturing a semiconductor device comprising a semiconductor substrate of a first conduction type, a semiconductor layer of a first conduction type formed to the upper surface of the semiconductor substrate, a field insulation film formed for defining a device forming region to the main surface of the semiconductor layer, a first region and a second region of a second conduction type opposite to the first conduction type situated, being spaced apart from each other, in the device forming region on both sides of a region to be formed with a channel, the second region comprising a low impurity concentration region in contact with a region to be formed with the channel and a high impurity concentration region in contact with the low impurity concentration region, and having a gate electrode formed by way of a gate insulation film above the channel region, and a leach-through layer of a first conduction type formed in the device forming region so as to be in contact with the first region and the semiconductor substrate, the method comprises:

a step of introducing impurities for forming the leach-through layer selectively on the main surface of the semiconductor layer, a step of forming the field insulation film selectively to the main surface of the semiconductor layer by thermal oxidation, and extending the impurities to form the leach-through layer in contact with the semiconductor substrate, a step of forming the gate insulation film to the surface of the device forming region defined by the field insulation film, a step of forming the gate electrode on the gate insulation film and then a step of forming the first region and the second region in the device forming region.

(76) In the constitution (75) described above, the semiconductor layer is formed to a thickness of 2.5 μm or more and 3.5 μm or less.

(77) In the constitution (75) described above, impurities of a first conduction type are introduced after the step of forming the field insulation film, into the device forming region to form a well region as a region for forming the channel.

(78) In the constitution (77) described above, the introduction of the impurities of the first conduction type is conducted by ion implantation for two stages.

(79) In the constitution (75) described above, an annealing treatment is conducted after the step of forming the field insulation film and before forming the well.

(80) In the constitution (75) described above, the low impurity concentration is formed by self alignment to the gate electrode.

(81) In the constitution (80) described above, the low impurity concentration region is formed by a first ion implantation step of introducing impurities of the second conduction type in the device forming region and a second ion implantation step of introducing impurities of the second conduction type at a concentration higher than that in the first ion implantation.

(82) In the constitution (79) described above, the method includes
a step of forming a bird's beak oxide film by thermal oxidation situated below and the gate electrode on the surface of the device forming region to be formed with the low impurity concentration region after the step of forming the gate electrode.

(83) In the constitution (82) described above, the gate electrode comprises a polycrystal silicon layer in contact with the gate insulation film, and the bird's beak oxide film is formed by thermally oxidizing the end of the polycrystal silicon layer.

(84) In the constitution (75) described above, the method includes a step of forming the bird's beak oxide film by thermal oxidation on the surface of the device forming region situated below both ends of the gate electrode after the step of forming the gate electrode.

(85) In the constitution (84) described above, the gate electrode comprises a polycrystal silicon layer in contact with the gate insulation film and the bird's beak oxide film is formed by thermally oxidizing the end of the polycrystal silicon layer.

(86) In the constitution (75) described above, an oxynitride film is formed by a heat treatment in a nitrogen-containing oxygen atmosphere in the step of forming the gate insulation film.

(87) In the constitution (82) or (84) described above, the bird's beak oxide film is formed by thermal oxidation containing nitrogen.

(88) In the constitution (82) or (84) described above, nitrogen ions are introduced into the bird's beak oxide film by ion implantation after forming the bird's beak oxide film.

(89) The method of manufacturing a semiconductor device according to this invention comprises:
(a) a step of preparing a semiconductor substrate having a semiconductor layer of a first conduction type at the main surface,
(b) a step of introducing impurities of a first conduction type selectively for forming a leach-through layer extending to the semiconductor substrate on the main surface of the semiconductor layer,
(c) a step of selectively forming a field insulation film for defining a device forming region to the main surface of the semiconductor layer by thermal oxidation,
(d) a step of forming a gate insulation film to the surface of the device forming region defined by the field insulation film,
(e) a step of forming a gate electrode on the gate insulation film,
(f) a step of forming an offset region of the first conduction type in self alignment to the gate electrode in the device forming region,
(g) a step of forming a first region of a first conduction type self aligned with the gate electrode, and forming a second region of a first conduction type being spaced apart from the gate electrode end and being in contact with the offset region and having an impurity concentration higher than that of the offset region, respectively, and, successively,
(h) a step of forming a first insulation film so as to cover the device forming region,
(i) a step of forming openings to the first insulation film for exposing the main surfaces of the first region and the second region and the leach-through layer,
(j) a step of forming first, second and third metal plugs connected with the main surfaces of the first region and the second region and the leach-through layer, respectively, in the openings,
(k) a step of forming a first conductor layer of connecting the first metal plug and the third metal plug to each other and forming a second conductor layer for connection with the second metal plug, respectively, by patterning and
(l) a step of forming a third conductor layer to the rearface of the semiconductor substrate.

(90) In the constitution (89) described above, the rearface of the semiconductor substrate is grounded before the step (12) described above.

(91) In the constitution (89) described above, the method comprises, succeeding to the step (12) described above:
(m) a step of covering a second insulation film on the first conductor layer and the second conductor layer and
(n) a step of forming, to the second insulation film, a first opening and a second opening, respectively, being situated on the first conductor plug and the second conductor plug, and
(o) a step of forming a first wiring layer connected with the first conductor layer through the first opening and forming a second wiring layer connected with the second conductor layer, respectively, through the second opening, by patterning.

(92) In the constitution (89) described above, the method comprises a step of introducing impurities of a first conduction type to form a well region prior to the step (e)

(93) In the constitution (92) described above, the well forming step is conducted succeeding to the step (d).

(94) In the constitution (94) or (93) described above, the well forming step is conducted by ion implantation for two stages.

(95) In the constitution (89) described above, the first insulation film in the step (g) is a silicon nitride film.

(96) In the constitution (92) described above, the method includes a step of ion implanting impurities of the first conduction type obliquely relative to the main surface of the device forming region in the well region after the step (e) thereby forming a buried region situated below the gate electrode.

(97) In the constitution (96) described above,
the mask that has been used for forming the first region and the second region in the step (h) is used in the step of forming the buried region.
(98) In an insulated gate type semiconductor device according to this invention, an insulated gate type field effect transistor is formed on the surface of a high resistance layer of a first conduction type formed on a low resistance semiconductor substrate of the identical first conduction type, wherein
a low resistance source region of a second conduction type opposite to the first conduction type is connected by way of a low resistance layer of the first conduction type formed in the high resistance layer with the low resistance substrate, a low resistance drain region of a second conduction type of the semiconductor device constitutes an offset structure spaced apart from the end of a gate electrode by way of a high resistor layer of the second conduction type, the length of the gate electrode in the direction of the channel is 0.35 μm or less, the thickness of the gate oxide film is 10 nm or more and 12 nm or less, the offset length of the drain region from the gate electrode end is 0.4 μm or more and 0.8 μm or less and the thickness of the high resistance layer on the semiconductor substrate is 2.5 μm or more and 3.5 μm or less.
(99) In a high frequency module constituting an amplifier circuit with a plurality of semiconductor chips constituting insulated gate type field effect transistors, each of the semiconductor chips includes an insulated gate type field effect transistor as a unit block, each comprising
a plurality of channel regions a drain region and a source region disposed on both sides of each of the channel regions, and a conductor layer for a gate electrode on the main surface of a semiconductor substrate having a semiconductor layer disposed by way of a gate insulation film on the surface of each of the channel regions, in which metal plugs are connected to the main surfaces of each of the drain regions and each of the source regions, wherein
a first metal conductor layer is connected with each of the metal plugs,
an interlayer insulation film is covered on the first metal conductor layer,
a second metal conductor layer for the drain is connected in common with each of the first metal conductor layers for the drain of the first metal conductor layers through drain connection openings disposed to the interlayer insulation film being situated on the metal plug connected with the drain region,
a second conductor layer for the source is connected in common with each of the first metal conductor layers for the source of the first metal conductor layers through source connection openings disposed to the interlayer insulation film,
a second conductor layer for the gate is connected in common with each of the first metal conductor layers for the gate of the first metal conductor layers through gate connection openings disposed to the interlayer insulation film,
the second metal conductor layer for the drain has a drain bonding pad, and
the second metal conductor layer for the gate has a gate bonding pad, and
the insulated gate type field effect transistors of the unit block are disposed in plurality on the main surface of the semiconductor layer.

According to this invention, the power-added efficiency of the power MOSFET used for portable telephone terminals such as on GSM, PCS, PDC or CDMA systems can be improved while ensuring the output power and breakdown voltage. Then, in the module for the GSM system using the device, it is possible to attain an output power of 4 W and an overall efficiency of 55%. Further, the module mounting area can also be decreased by miniaturization and integration of the chip.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. An insulated gate type field effect semiconductor power device having a drain offset region, in which an N type source region and an N type drain region having an offset region are formed, being spaced apart from each other, to a P type silicon semiconductor layer, a gate electrode is formed by way of a gate insulation film to the surface of the P type silicon semiconductor layer as a channel region between the N type source region and the offset region, and the gate electrode comprises a silicon semiconductor layer containing P type impurities and wherein,
a metal plug is connected with the main surface of each of the drain regions and each of the source regions,
a first metal conductor layer is connected with each of the metal plugs,
an interlayer insulation film is covered on the first metal conductor layer,
a second metal conductor layer for the drain is connected in common with each of the first metal conductor layers for the drain of the first metal conductor layers through openings in the interlayer insulation film being situated on the metal plug connected with the drain region,
a second metal conductor layer for the source is connected in common with each of the first metal conductor layers for the source of the first metal conductor layers through source connecting openings in the interlayer insulation film,
a second metal conductor layer for the gate is connected in common with each of the first metal conductor layers for the gate of the first metal conductor layers through gate connecting openings in the interlayer insulation film,
the second metal conductor layer for the drain has a drain bonding pad, and
the second metal conductor layer for the gate has a gate bonding pad.

2. An insulated gate type field effect semiconductor device as defined in claim 1, wherein the gate electrode comprises a polycrystal silicon layer containing P type impurities and a metal silicide layer formed on the polycrystal silicon layer.

3. An insulated gate type field effect semiconductor device as defined in claim 1, wherein the gate insulation film comprises a first silicon oxide film formed by thermal oxidation and a second silicon oxide film formed by gas phase chemical growing on the silicon oxide film.

4. An insulated gate type semiconductor device wherein first and second insulated gate type field effect transistors each having a plurality of channel regions, a drain region and a source region disposed on both sides of each of the channel regions, and a gate electrode disposed by way of a gate insulation film to the surface of each of the channel regions are disposed to the main surface of a semiconductor substrate having a semiconductor layer, a first resistor for impedance matching is electrically connected with each of the drain regions of the first and second insulated gate type field effect transistors and a second resistor for impedance matching is electrically connected with each of the conductor layers for the gate electrodes of the first and second insulated gate field effect transistors.

5. An insulated gate type semiconductor device as defined in claim 4, wherein the first and second resistors comprise a material identical with that of the conductor layer for the gate electrode.

6. An insulated gate type semiconductor device as defined in claim 4, wherein current sensing devices constituted in the same manner as the first and second insulate gate type field effect transistors are disposed on the main surface of semiconductor substrate, and a shield layer is disposed between the first or the second insulated gate type field effect transistor and the current sensing device.

7. An insulated gate type semiconductor device as defined in claim 6, wherein the shield layer comprises a semiconductor region extending from the main surface to the semiconductor substrate, a metal plug connected with the semiconductor region, a first metal conductor layer connected with the metal plug and a second metal conductor layer connected with the first metal conductor layer.

8. An insulated gate type semiconductor device wherein first and second insulated gate type field effect transistors each having a plurality of channel regions, a drain region and a source region disposed on both sides of each of the channel regions, and a conductor layer for a gate electrode disposed by way of a gate insulation film to the surface of each of the channel regions are disposed to the main surface of a semiconductor substrate having a semiconductor layer, a drain bonding pad and a gate bonding pad to the first and second insulated gate type field effect transistors are disposed respectively to the main surface, a source electrode is disposed to the rearface of the semiconductor substrate and a shield layer is disposed between the first and second insulated gate type field effect transistor.

9. An insulated gate type semiconductor device as defined in claim 8, wherein the shield layer comprises a semiconductor region extending from the main surface to the semiconductor substrate, a metal plug connected with the semiconductor region, a first metal conductor layer connected with the metal plug and a second metal conductor layer connected with the first metal conductor layer.

* * * * *